United States Patent
Drees et al.

(10) Patent No.: US 9,312,492 B2
(45) Date of Patent: Apr. 12, 2016

(54) POLYMERIC BLENDS AND RELATED OPTOELECTRONIC DEVICES

(71) Applicant: Raynergy Tek Incorporation, Hsinchu (TW)

(72) Inventors: Martin Drees, Glenview, IL (US); Hualong Pan, Skokie, IL (US); Zhihua Chen, Skokie, IL (US); Shaofeng Lu, Skokie, IL (US); Antonio Facchetti, Chicago, IL (US)

(73) Assignee: RAYNERGY TEK INC., Hsinchu (TW)

( * ) Notice: Subject to any disclaimer, the term of this patent is extended or adjusted under 35 U.S.C. 154(b) by 0 days.

(21) Appl. No.: 14/617,508

(22) Filed: Feb. 9, 2015

(65) Prior Publication Data

US 2015/0171332 A1    Jun. 18, 2015

Related U.S. Application Data

(63) Continuation of application No. 13/844,660, filed on Mar. 15, 2013.

(51) Int. Cl.
| | | |
|---|---|---|
| *C08G 75/00* | (2006.01) | |
| *H01L 51/00* | (2006.01) | |
| *C08G 73/10* | (2006.01) | |
| *H01L 31/0256* | (2006.01) | |
| *H01L 51/42* | (2006.01) | |

(52) U.S. Cl.
CPC ........ *H01L 51/0036* (2013.01); *C08G 73/1064* (2013.01); *H01L 31/0256* (2013.01); *H01L 51/0035* (2013.01); *H01L 51/0043* (2013.01); *H01L 51/4253* (2013.01); *Y02E 10/549* (2013.01)

(58) Field of Classification Search
CPC ............... C08G 2261/3243; C08G 2261/124; C08G 2261/414; C08G 2261/91; H01L 51/0047
USPC ............ 528/377, 380, 370, 9; 136/263; 526/256, 243; 257/40, E51.025
See application file for complete search history.

(56) References Cited

U.S. PATENT DOCUMENTS

| | | |
|---|---|---|
| 2010/0283047 A1 | 11/2010 | Facchetti et al. |
| 2010/0307594 A1 | 12/2010 | Zhu et al. |
| 2010/0326527 A1 | 12/2010 | Facchetti et al. |
| 2011/0120558 A1 | 5/2011 | Facchetti et al. |
| 2011/0213117 A1 | 9/2011 | Facchetti |
| 2011/0226338 A1 | 9/2011 | Lu et al. |
| 2012/0186652 A1 | 7/2012 | Pan et al. |
| 2012/0187385 A1 | 7/2012 | Pan et al. |
| 2012/0227812 A1 | 9/2012 | Quinn et al. |
| 2012/0264900 A1 | 10/2012 | Usta et al. |
| 2013/0098448 A1 | 4/2013 | Zhu et al. |
| 2013/0200354 A1 | 8/2013 | Zhu et al. |

(Continued)

OTHER PUBLICATIONS

Huo, Angew. Chem. Int. Ed. 2011, 50, 9697-9702, 2011.*

(Continued)

*Primary Examiner* — Shane Fang
(74) *Attorney, Agent, or Firm* — WPAT, PC; Justin King

(57) ABSTRACT

The present invention relates to all-polymer blends including an electron-acceptor polymer and an electron-donor polymer, capable of providing improved device performance, for example, as measured by power conversion efficiency, when used in photovoltaic cells.

13 Claims, 1 Drawing Sheet

(56) References Cited

U.S. PATENT DOCUMENTS

2013/0200355 A1    8/2013    Zhu et al.
2013/0247990 A1    9/2013    Facchetti et al.

OTHER PUBLICATIONS

Zhou et al: "Band gap and molecular energy level control of perylene diimide-based donor-acceptor copolymers for all-polymer solar cells", J. Mater. Chem., 20: 2362-2368 (2010).

Wang et al.: "Effects of pi-Conjugated Bridges on Photovoltaic Properties of Donor-pi-Acceptor Conjugated Copolymers", Macromolecules, 45: 1208-1216 (Jan. 31, 2012).

Kozma et al.: "Synthesis of donor-acceptor poly(perylene diimide-altoligothipohene) copolymers as n-type materials for polymeric solar cells", Polymer, 51: 2264-2270 (2010).

Wang et al.: "Donor-Acceptor Conjugated Polymer Based on Naphtho [1,2-c:5,6-c]bis[1,2,5]thiadiazole for High-Performance Polymer Solar Cells", J. Am. Chem. Soc., 133: 9638-9641 (2011).

Zhan et al.: "A High-Mobility Electron-Transport Polymer with Broad Absorpotion and Its Use in Field-Effect Transistors and All-Polymer Solar Cells", J.Am.Chem.Soc., 129: 7246-7247 (2007).

Tan et al.: "Efficient all-polymer solar cells based on blend of tris(thienylenevinylene)-substituted polythiophene and poly[perylene diimide-alt-bis(dithienothiophene)]", Appl. Phys. Lett., 93: 073309 (2008).

Mikroyannidis et al.: "A Novel Alternating Phenylenevinylene Coploymer with Perylene Bisimide Units: Synthesis, Photophysical, Electrochemical, and Photovoltaic Properties", J Phys. Chem. C, 113: 7904-7912 (2009).

Zhou et al.: "All-Polymer Solar Cells from Perylene Diimide Based Copolymers: Material Design and Phase Separation Control", Angew. Chem. Int. Ed., 50: 3799-2803 (2011).

Fabiano et al.: "Role of photactive layer morphology in high fill factor all-polymer bulk heterojunction solar cells", J. Mater. Chem., 21: 5891-5896 (2011).

Moore et al.: "Polymer Blend Solar Cells Based on a High-Mobility Naphthalenediimide-Based Polymer Acceptor: Device Physics, Photophysics and Morphology", Adv. Energy Mater., 1:230 (2011).

Schubert et al.: "Influence of Aggregation on the Performance of All-Polymer Solar Cells Containing Low-Bandgrap Naphthalenediimide Copolyers", Adv. Energy Mater., 2: 369-380 (2012).

Hwang et al.: "n-Type Naphthalene Diimide-Biselenophene Copolymer for All-Polymer Bulk Heterojunction Solar Cells", Macromolecules, (2012), http://dx.doi.org/10.1021/ma3020239.

Nakabayashi et al.: "All-Polymer Solar Cells Based on Fully Conjugated Block Copolymers Composed of Poly(3-hexylthiophene) and Poly(naphthalene bisimide) Segments", Macromolecules, (2012), http://dx.doi.org/10.1021/ma302170e.

Facchetti: "Polymer donor-polymer acceptor (all-polymer) solar cells," Materials Today, 16(4): 123-132 (Apr. 2013).

\* cited by examiner

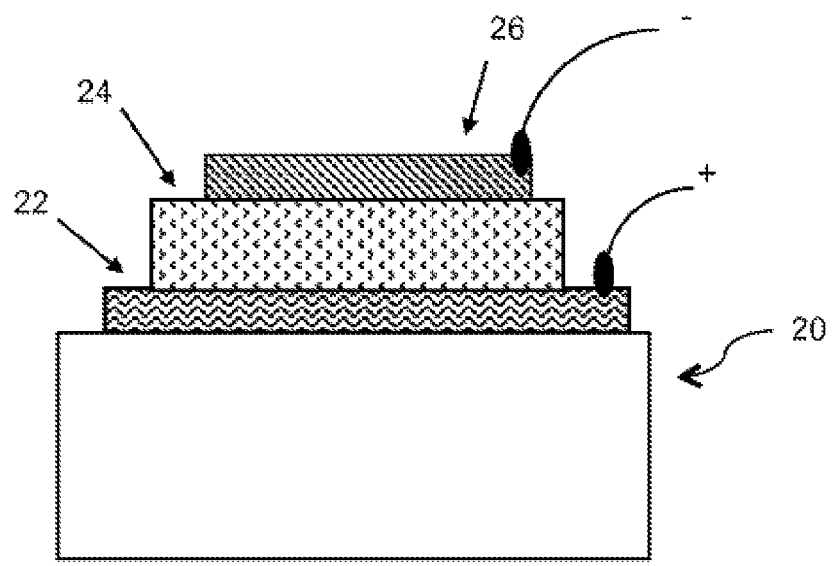

POLYMERIC BLENDS AND RELATED OPTOELECTRONIC DEVICES

CROSS-REFERENCE TO RELATED APPLICATIONS

This application is a continuation of U.S. patent application Ser. No. 13/844,660, filed on Mar. 15, 2013, and entitled "POLYMERIC BLENDS AND RELATED OPTOELECTRONIC DEVICES", which claims priority to and the benefit of U.S. Provisional Patent Application Ser. No. 61/614,302, filed on Mar. 22, 2012, U.S. Provisional Patent Application Ser. No. 61/724,140, filed on Nov. 8, 2012, U.S. Provisional Patent Application Ser. No. 61/733,404, filed on Dec. 4, 2012, and U.S. Provisional Patent Application Ser. No. 61/733,406, filed on Dec. 4, 2012, the disclosure of each of which is incorporated by reference herein in its entirety.

BACKGROUND

Organic photovoltaics (OPVs) have seen significant progress over the last few years. A key milestone in this field has been the development of bulk heterojunction (BHJ) blends as the photoactive layer. In a BHJ solar cell, an electron donor (hole-transporting, p-type) semiconductor material and an electron acceptor (electron-transporting, n-type) semiconductor material typically are blended in solution. The mixture then is cast via solution-phase techniques onto one of the electrodes (e.g., a high work function indium tin oxide functioning as the transparent anode), with the donor and acceptor phases separating during the solvent drying process to form the BHJ photoactive layer, which has the morphology of a bicontinuous interpenetrating network. A low work function metal such as Al or Ca usually is deposited as the top layer which functions as the cathode. FIG. 1 illustrates a representative structure of an OPV cell. Due to dramatically improved donor-acceptor interfacial area, OPV cells based upon BHJ blends usually have much better performance than planar bilayer structures.

While designing novel materials is critical to continued improvements in OPV device performance, recent research has been focused mainly on the development of new conjugated polymers as donor materials, with soluble molecular fullerene derivatives such as [6,6]-phenyl-$C_{61}$-butyric acid methyl ester (C60PCBM or PCBM) and [6,6]-phenyl-$C_{71}$-butyric acid methyl ester (C70PCBM) remaining the dominant acceptors. Although fullerene derivatives show excellent charge separation behavior with a wide variety of donor materials and good electron transport, their absorption in the visible and NIR region is limited. In addition, their lowest unoccupied molecular orbital (LUMO) energy level, the governing property for the open circuit voltage ($V_{oc}$) of OPVs, is fixed and cannot be easily adjusted. Therefore, the two major loss mechanisms in today's OPVs are the low photocurrent ($J_{sc}$) due to insufficient photon absorption and the low $V_{oc}$ compared to the band gap of the absorbers due to non-optimum LUMO-LUMO offset of donor and acceptor materials. In addition, in terms of processing, the use of an acceptor polymer (instead of a molecular acceptor like a fullerene derivative) with a donor polymer will allow more uniform films to form over large areas, hence facilitating large-scale production of OPV modules.

Efforts to replace fullerene derivatives with other organic acceptor materials have not been very successful to date. Particularly, the approach of using n-type polymers as acceptors in OPVs has not yielded high power conversion efficiencies (PCEs) even though a range of materials with good electron transporting properties and good absorption in the visible and NIR are available. Particularly, one of the observations is that electron-transporting or n-type polymeric semiconductors that show high performance in thin film transistor (TFT) applications do not excel necessarily as OPV acceptors. See Anthony et al., "N-Type Organic Semiconductors in Organic Electronics," *Adv. Mater.*, vol. 22, no. 34, pp. 3876-3892 (2010). To date, no PCE over 3% has been reported for all-polymer, fullerene-free OPVs.

For example, different groups have investigated OPVs based upon the combination of poly(3-hexylthiophene), P3HT, as the donor material and poly([N,N'-bis(2-octyldodecyl)-naphthalene-1,4,5,8-bis(dicarboximide)-2,6-diyl]-alt-5,5'-(2,2'-bithiophene)), P(NDI2OD-T2), as the acceptor material. First studies yielded very low PCEs of ~0.2%. See Moore et al., "Polymer Blend Solar Cells Based on a High-Mobility Naphthalenediimide-Based Polymer Acceptor: Device Physics, Photophysics and Morphology," *Adv. Energy Mater.*, vol. 1, no. 2, pp. 230-240. Significant improvements in PCE to 0.6% were achieved through improved processing solvent, and then to 1.4% by controlling the aggregation of P(NDI2OD-T2) through solvent mixtures and hot solvent processing. See Fabiano et al., "Role of Photoactive Layer Morphology in High Fill Factor All-Polymer Bulk Heterojunction Solar Cells," *J. Mater. Chem.*, vol. 21, no. 16, pp. 5891-5896; and Schubert et al., "Influence of Aggregation on the Performance of All-Polymer Solar Cells Containing Low-Bandgap Naphthalenediimide Copolymers," *Adv. Energy. Mater.*, vol. 2, no. 3, pp. 369-380.

Accordingly, the art desires new polymeric blends that can enable high-efficiency all-polymer OPV devices.

SUMMARY

In light of the foregoing, the present teachings relate to polymeric blends that include an electron-donor polymer and an electron-acceptor polymer, where such polymeric blends can yield unexpectedly high power conversion efficiencies in OPV devices when compared to prior art polymeric blends.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

FIG. 1 illustrates a representative organic photovoltaic device (also known as a solar cell) structure, which can incorporate the present polymeric blends as the photoactive layer.

DETAILED DESCRIPTION

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a component (such as a thin film layer) can be considered "photoactive" if it contains one or more compounds that can absorb photons to produce excitons for the generation of a photocurrent.

As used herein, fill factor (FF) is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from incident light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a "polymeric compound" (or "polymer") refers to a molecule including a plurality of one or more repeating units connected by covalent chemical bonds. A polymeric compound can be represented by the general formula:

$$*\!-\!(\!-\!M\!-\!)\!-\!*$$

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units $$*\!-\!(\!-\!M^a\!-\!)\!-\!* \text{ and } *\!-\!(\!-\!M^b\!-\!)\!-\!*,$$

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

$$*\!-\!(\!-\!M^a_x\!-\!M^b_y\!-\!)\!-\!*$$

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —C$_6$F$_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—C$_{6-14}$ aryl group, where Y is as defined herein. An example of an arylalkyl group is a benzyl group (—CH$_2$—C$_6$H$_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

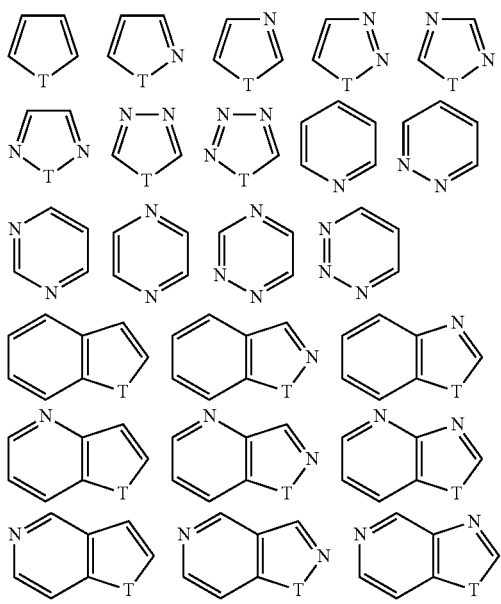

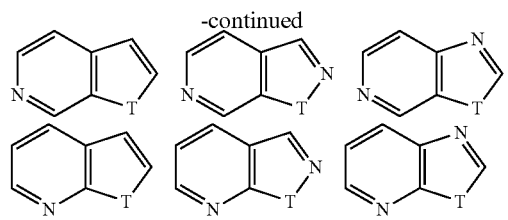

-continued where T is O, S, NH, N-alkyl, N-aryl, N—(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group). a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), $-NO_2$, $-CN$, $-NC$, $-S(R^0)_2^+$, $-N(R^0)_3^+$, $-SO_3H$, $-SO_2R^0$, $-SO_3R^0$, $-SO_2NHR^0$, $-SO_2N(R^0)_2$, $-COOH$, $-COR^0$, $-COOR^0$, $-CONHR^0$, $-CON(R^0)_2$, $C_{1-40}$ haloalkyl groups, $C_{6-14}$ aryl groups, and 5-14 membered electron-poor heteroaryl groups; where $R^0$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, $-NO_2$, $-CN$, $-NC$, $-S(R^0)_2^+$, $-N(R^0)_3^+$, $-SO_3H$, $-SO_2R^0$, $-SO_3R^0$, $-SO_2NHR^0$, $-SO_2N(R^0)_2$, $-COOH$, $-COR^0$, $-COOR^0$, $-CONHR^0$, and $-CON(R^0)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include $-OH$, $-OR^0$, $-NH_2$, $-NHR^0$, $-N(R^0)_2$, and 5-14 membered electron-rich heteroaryl groups, where $R^0$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R. and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymer-polymer blend semiconductor materials that include an electron-donor polymer and an electron-acceptor polymer, where the polymer-polymer blend semiconductor materials can provide unexpectedly high power conversion efficiencies (PCEs) when used as the photoactive layer in optoelectronic devices such as OPV cells. More specifically, both the electron-acceptor polymer and the electron-donor polymer can be described as π-conjugated polymers, where repeat units in the polymer backbone are made up of atoms with $sp^2$ and π covalent bonds resulting in alternating double and single bonds along the polymer backbone. The electron-acceptor polymer and the electron-donor polymer have different electron affinities and optical energy gaps. Specifically, the electron-donor polymer has a lower electron affinity (or lower ionization energy) than the electron-acceptor polymer and therefore functions as a p-type (hole-transporting) conduction area in the blend. Conversely, the electron-acceptor polymer has a higher electron affinity (or higher ionization energy) than the electron-donor polymer and therefore functions as an n-type (electron-transporting) conduction area in the blend. In addition, the electron-acceptor polymer can be characterized by both a lower $E_{HOMO}$ (highest occupied molecular orbital energy level) and a lower $E_{LUMO}$ (lowest unoccupied molecular orbital energy) that those of the electron-donor polymer. In preferred embodiments, the $E_{HOMO}$ of the electron-acceptor polymer can be at least about −0.3 eV lower than the $E_{HOMO}$ of the electron-donor polymer, while the $E_{LUMO}$ of the electron-acceptor polymer can be about at least about −0.3 eV lower than the $E_{LUMO}$ of the electron-donor polymer.

The inventors have discovered that various embodiments of a polymer-polymer blend ("all-polymer blend") that include an electron-transporting polymer which is a copolymer comprising an aromatic fused-ring diimide unit in its backbone, and a hole-transporting polymer which is a copolymer comprising one or more thienyl or thienothienyl units and at least one electron-poor unit in its backbone, unexpectedly can lead to power conversion efficiencies (PCEs) greater than about 3.0% when incorporated as the photoactive layer in OPV cells. The electron-transporting polymer is referred herein interchangeably as the electron-acceptor polymer, while the hole-transporting polymer is referred herein interchangeably as the electron-donor polymer. The electron-transporting polymer typically exhibits an electron mobility greater than about $10^{-5}$ cm$^2$/Vs, preferably, greater than about $10^{-3}$ cm$^2$/Vs, and more preferably, greater than about $10^{-2}$ cm$^2$/Vs; while the hole-transporting polymer typically exhibits a hole mobility greater than about $10^{-5}$ cm$^2$/Vs, preferably, greater than about $10^{-3}$ cm$^2$/Vs, and more preferably, greater than about $10^{-2}$ cm$^2$/Vs. Particularly, while poly(3-hexylthiophene) has been investigated as an electron-donor polymer in certain all-polymer photovoltaic devices, to the inventors' knowledge, there has been no report to date of any all-polymer photovoltaic devices with a power conversion efficiency (PCEs) greater than about 3.0% which includes an electron-donor polymer comprising one or more electron-poor units. As described in more detailed below, the electron-poor unit can be selected from an electron-poor 8-20 membered polycyclic heteroaryl group and a chlorinated 5-20 membered heteroaryl group. Without wishing to be bound by any particular theory, it is believed that the unexpectedly high power conversion efficiencies can be a result of advantageous donor/acceptor pairing in terms of a low bandgap between the HOMO of the donor polymer and the LUMO of the acceptor polymer, fine-tuned LUMO-LUMO energy offset, combined optical absorption across the solar spectrum, and/or improved charge transport characteristics due to optimized blend morphology/microstructure relating to favorable intermolecular interaction between the donor polymer and the acceptor polymer.

The aromatic fused-ring diimide-based acceptor polymer in the present polymer-polymer blend can be an alternating or random copolymer where the other repeat unit(s) (i.e., the repeat unit(s) that do not include any aromatic fused-ring diimides) can include one or more conjugated moieties such as one or more monocyclic or polycyclic $C_{6-20}$ aryl moieties or 5-20 membered heteroaryl moieties. A aromatic fused-ring diimide may be referred herein interchangeably as a bis(imide)arene unit. In certain embodiments, the aromatic fused-ring diimide-based acceptor polymer can be an alternating polymer represented by Formula 1:

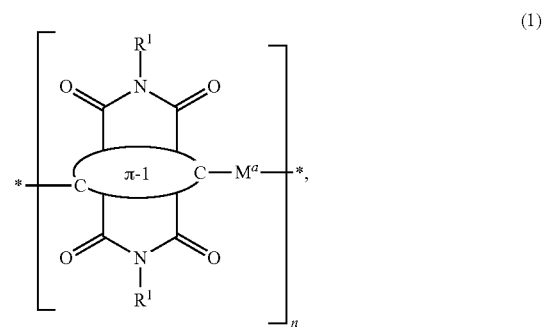

wherein:
π-1 is an optionally substituted fused ring moiety;
$R^1$ is selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;
$M^a$ is a repeat unit comprising one or more conjugated moieties that does not include a rylene diimide; and
n is an integer in the range of 2 to 5,000.

In certain embodiments, the aromatic fused-ring diimide-based acceptor polymer can be a random polymer represented by Formula 2:

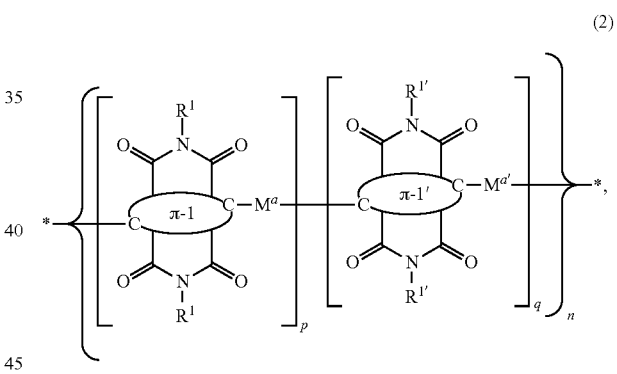

wherein:
π-1 and π-1' can be identical or different and independently are an optionally substituted fused ring moiety;
$R^1$ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;
$M^a$ and $M^{a'}$ can be identical or different and independently are a repeat unit comprising one or more conjugated moieties that does not include a rylene diimide;
p and q independently are a real number, wherein 0.1≤p≤0.9, 0.1≤q≤0.9, and the sum of p and q is about 1; and
n is an integer in the range of 2 to 5,000;
provided that at least one of the following is true: (a) π-1' is different from π-1, (b) $R^{1'}$ is different from $R^1$, or (c) $M^{a'}$ is different from $M^a$.

In various embodiments, the aromatic fused-ring diimide can be selected from the group consisting of a perylene diimide, a naphthalene diimide, an anthracene diimide, a coronene diimide, and a dithienocoronene diimide, with π-1 and π-1' independently being a fused ring moiety selected from the group consisting of:

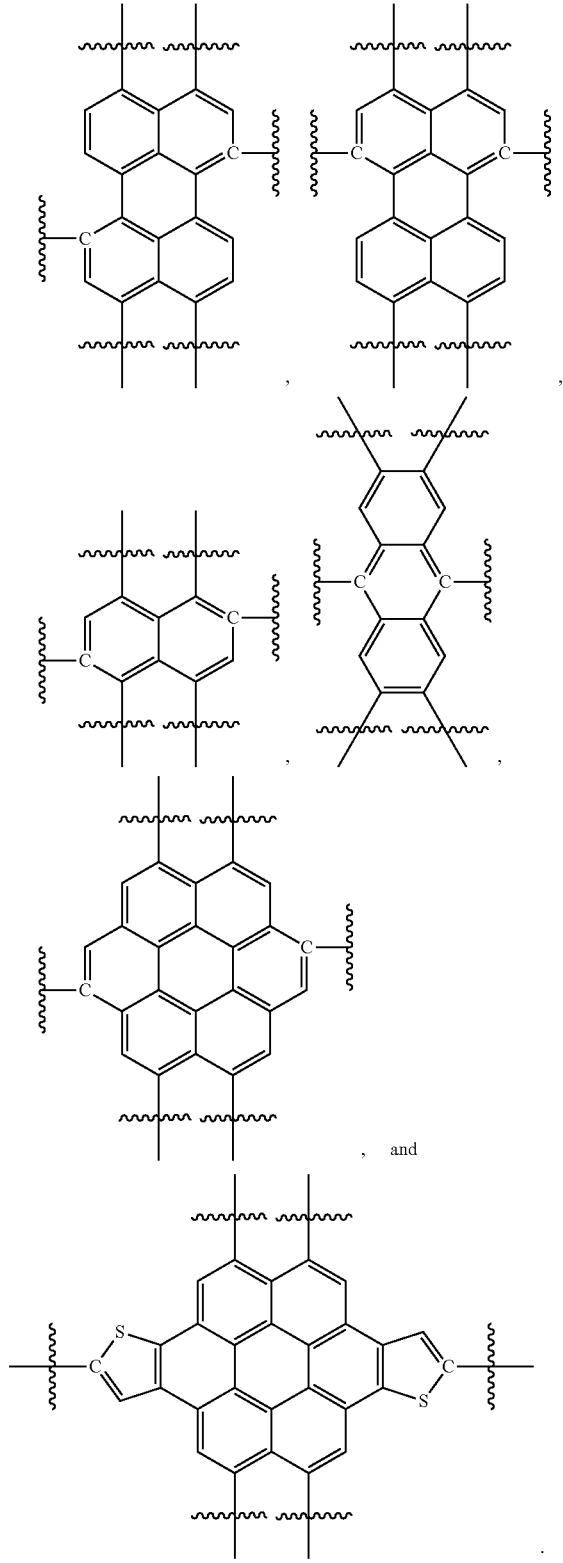

,

The one or more conjugated moieties in the co-repeat unit $M^a$ and $M^{a'}$ can be represented by Ar, π-2, and Z, wherein Ar is an optionally substituted monocyclic aryl or heteroaryl group, π-2 is an optionally substituted polycyclic conjugated moiety, and Z is a conjugated linear linker. In various embodiments, $M^a$ and $M^{a'}$ can have a formula selected from:

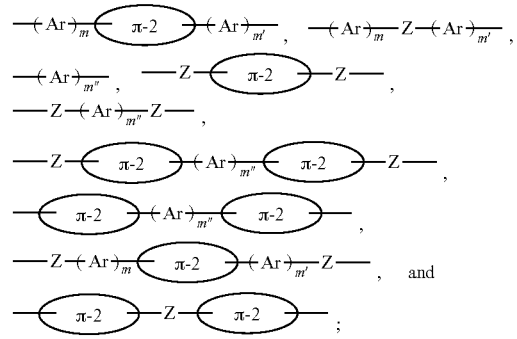

wherein m, m' and m" independently are 0, 1, 2, 3, 4, 5 or 6.

For example, in some embodiments, π-2 can be a polycyclic $C_{8-24}$ aryl group or a polycyclic 8-24 membered heteroaryl group, wherein each of these groups can be optionally substituted with 1-6 $R^e$ groups, wherein:

$R^e$, at each occurrence, is independently a) halogen, b) —CN, c) —NO$_2$, d) oxo, e) —OH, f) =C($R^f$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, or q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^f$, at each occurrence, is independently a) halogen, b) —CN, c) —NO$_2$, d) oxo, e) —OH, f) —NH$_2$, g) —NH($C_{1-20}$ alkyl), h) —N($C_{1-20}$ alkyl)$_2$, i) —N($C_{1-20}$ alkyl)—$C_{6-14}$ aryl, j) —N($C_{6-14}$ aryl)$_2$, k) —S(O)$_w$H, l) —S(O)$_w$-$C_{1-20}$ alkyl, m) —S(O)$_2$OH, n) —S(O)$_w$—O$C_{1-20}$ alkyl, o) —S(O)$_w$—$C_{6-14}$ aryl, p) —CHO, q) —C(O)—$C_{1-20}$ alkyl, r) —C(O)—$C_{6-14}$ aryl, s) —C(O)OH, t) —C(O)—O$C_{1-20}$ alkyl, u) —C(O)—O$C_{6-14}$ aryl, v) —C(O)NH$_2$, w) —C(O)NH—$C_{1-20}$ alkyl, x) —C(O)N($C_{1-20}$ alkyl)$_2$, y) —C(O)NH—$C_{6-14}$ aryl, z) —C(O)N($C_{1-20}$ alkyl)—$C_{6-14}$ aryl, aa) —C(O)N($C_{6-14}$ aryl)$_2$, ab) —C(S)NH$_2$, ac) —C(S)NH—$C_{1-20}$ alkyl, ad) —C(S)N($C_{1-20}$ alkyl)$_2$, ae) —C(S)N($C_{6-14}$ aryl)$_2$, af) —C(S)N($C_{1-20}$ alkyl)—$C_{6-14}$ aryl, ag) —C(S)NH—$C_{6-14}$ aryl, ah) —S(O)$_w$NH$_2$, ai) —S(O)$_w$NH($C_{1-20}$ alkyl), aj) —S(O)$_w$N($C_{1-20}$ alkyl)$_2$, ak) —S(O)$_w$NH($C_{6-14}$ aryl), al) —S(O)$_w$N($C_{1-20}$ alkyl)—$C_{6-14}$ aryl, am) —S(O)$_w$N($C_{6-14}$ aryl)$_2$, an) —SiH$_3$, ao) —SiH($C_{1-20}$ alkyl)$_2$, ap) —SiH$_2$($C_{1-20}$ alkyl), aq) —Si($C_{1-20}$ alkyl)$_3$, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;

Y, at each occurrence, is independently selected from a divalent $C_{1-6}$ alkyl group, a divalent $C_{1-6}$ haloalkyl group, and a covalent bond; and w is 0, 1, or 2.

To illustrate, in certain embodiments, π–2 can be selected from:

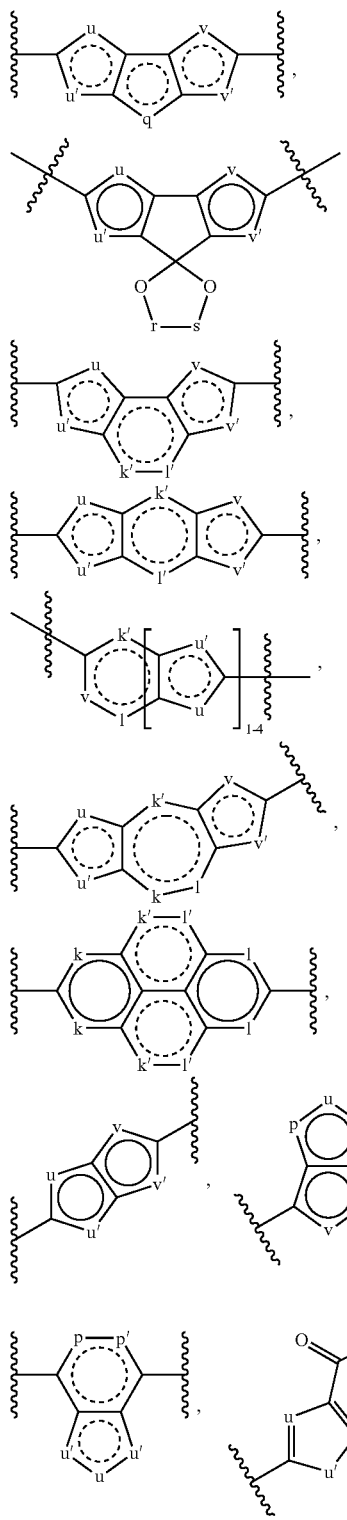

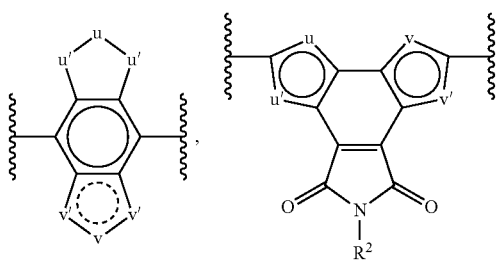

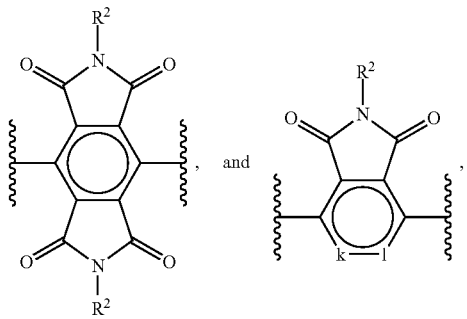

wherein:

k, k', l and l' independently can be selected from —$CR^2$=, =$CR^2$—, —C(O)—, and —C(C(CN)$_2$)—;

p, p', q and q' independently can be selected from —$CR^2$=, =$CR^2$—, —C(O)—, —C(C(CN)$_2$)—, —O—, —S—, —N=, =N—, —N($R^2$)—, —Si$R^2$=, =Si$R^2$—, and —Si$R^2R^2$—;

r and s independently can be —$CR^2R^2$— or —C(C(CN)$_2$)—;

u, u', v and v' independently can be selected from —$CR^2$=, =$CR^2$—, —C(O)—, —C(C(CN)$_2$)—, —S—, —S(O)—, —S(O)$_2$—, —O—, —N=, =N—, —Si$R^2$=, =Si$R^2$—, —Si$R^2R^2$—, —$CR^2R^2$—$CR^2R^2$—, and —$CR^2$=$CR^2$—; and $R^2$, at each occurrence, independently can be H or $R^e$, wherein $R^e$ is as defined herein.

In certain embodiments, π–2 can be selected from:

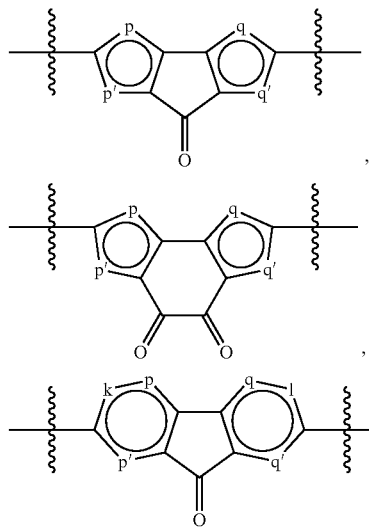

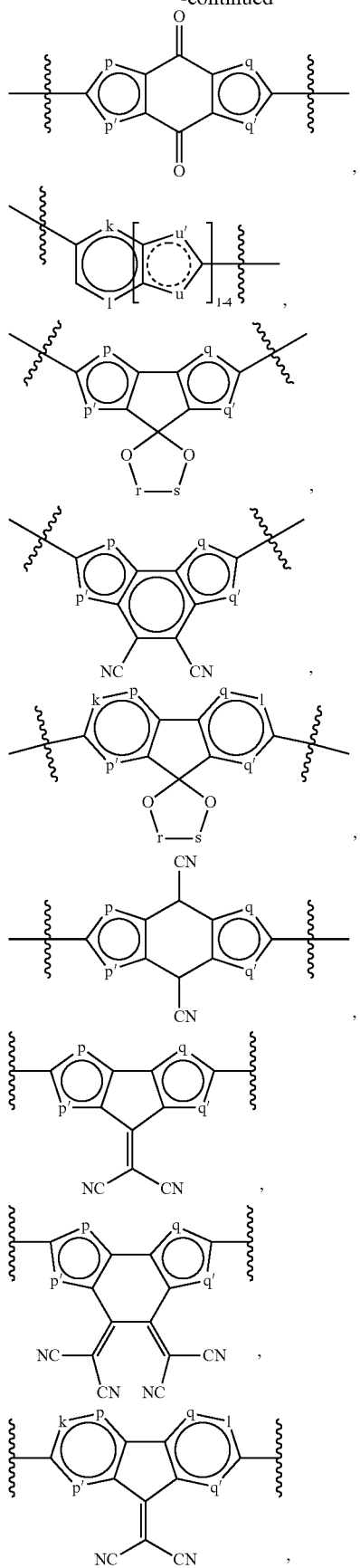
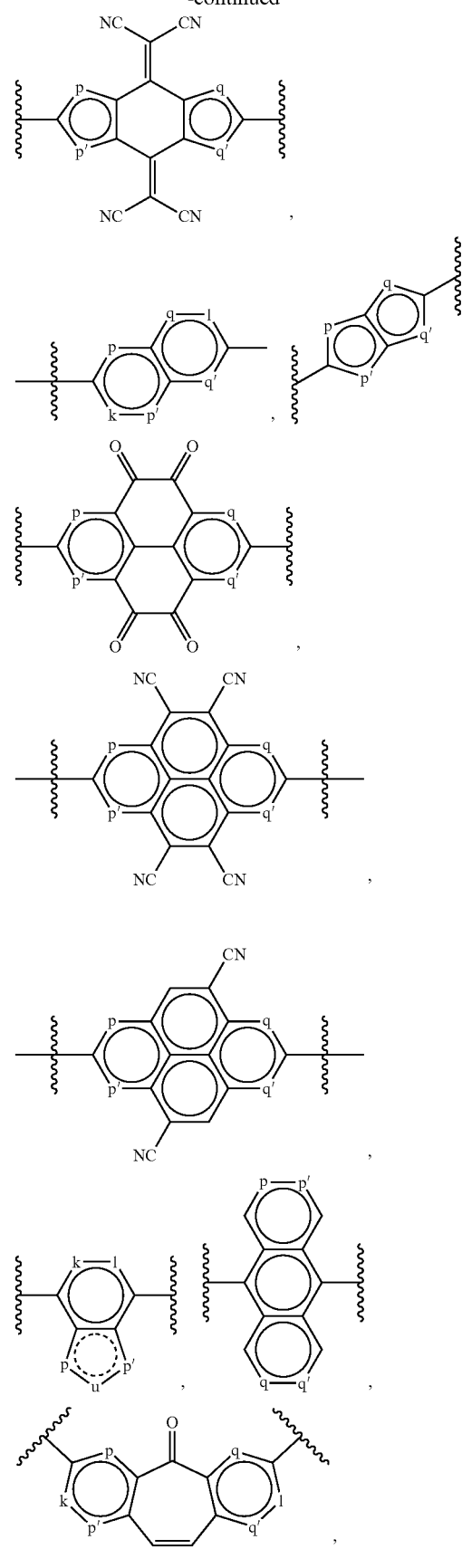

-continued

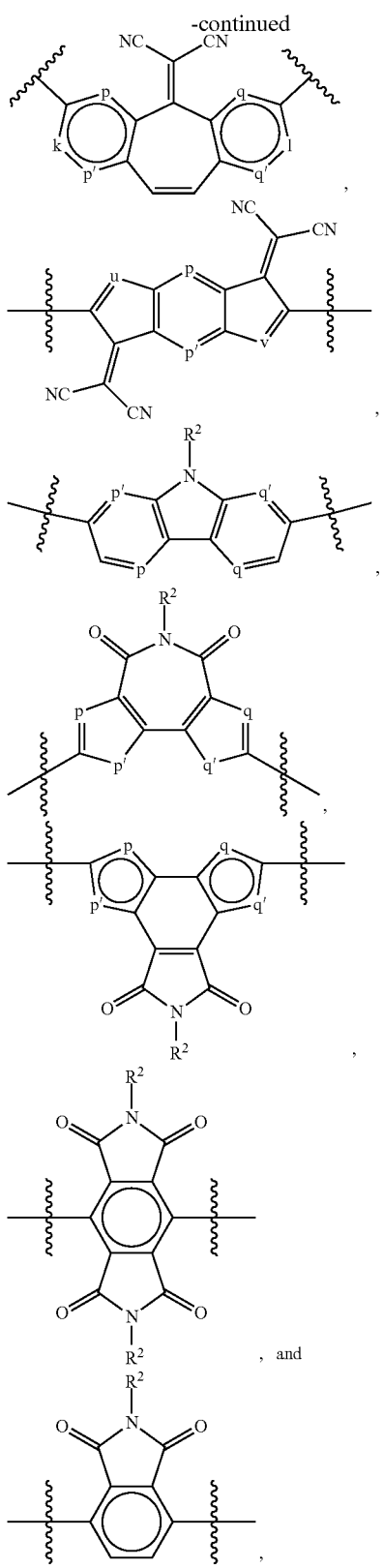

where k, l, p, p', q, q', r, s and R² are as defined herein. In some embodiments, k and l independently can be selected from —CR²=, =CR²—, and —C(O)—; p, p', q, and q' independently can be selected from —O—, —S—, —N(R²)—, —N=, =N—, —CR²=, and =CR²—; u and v independently can be selected from —CR²=, =CR²—, —C(O)—, —C(C(CN)₂)—, —S—, —O—, —N=, =N—, —CR²R²—CR²R²—, and —CR²=CR²—; where R² is as defined herein. For example, R², at each occurrence, independently can be selected from H, a halogen, —CN, —OR$^c$, —N(R$^c$)₂, a C$_{1-20}$ alkyl group, and a C$_{1-20}$ haloalkyl group, where R$^c$ is as defined herein. Each of r and s can be CH₂.

In certain embodiments, π-2 can be a polycyclic moiety including one or more thienyl, thiazolyl, or phenyl groups, where each of these groups can be optionally substituted as disclosed herein. For example, π-2 can be selected from:

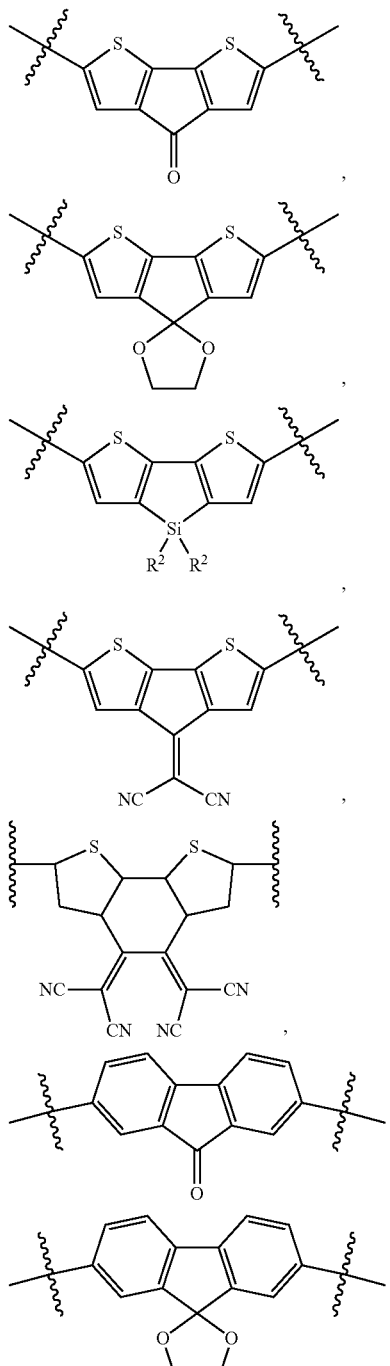

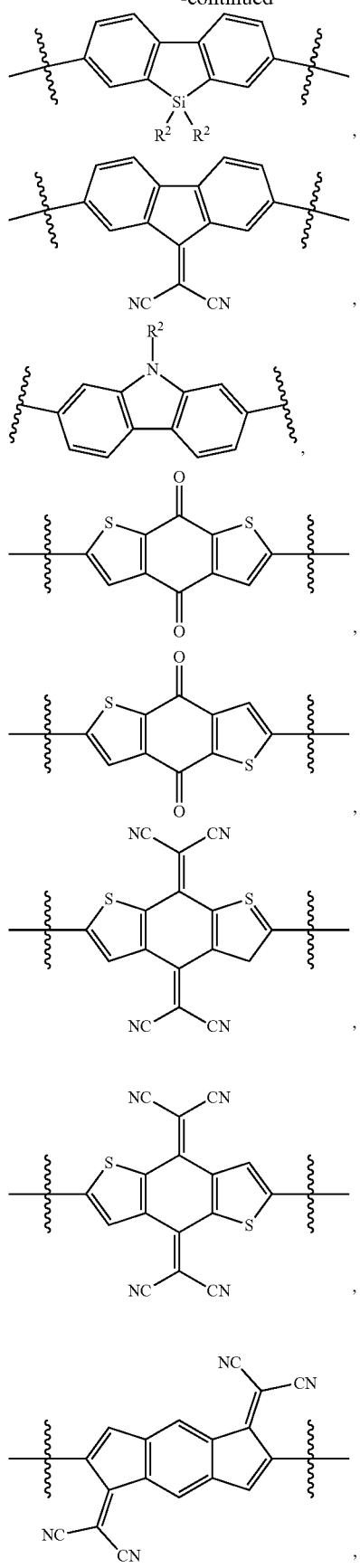
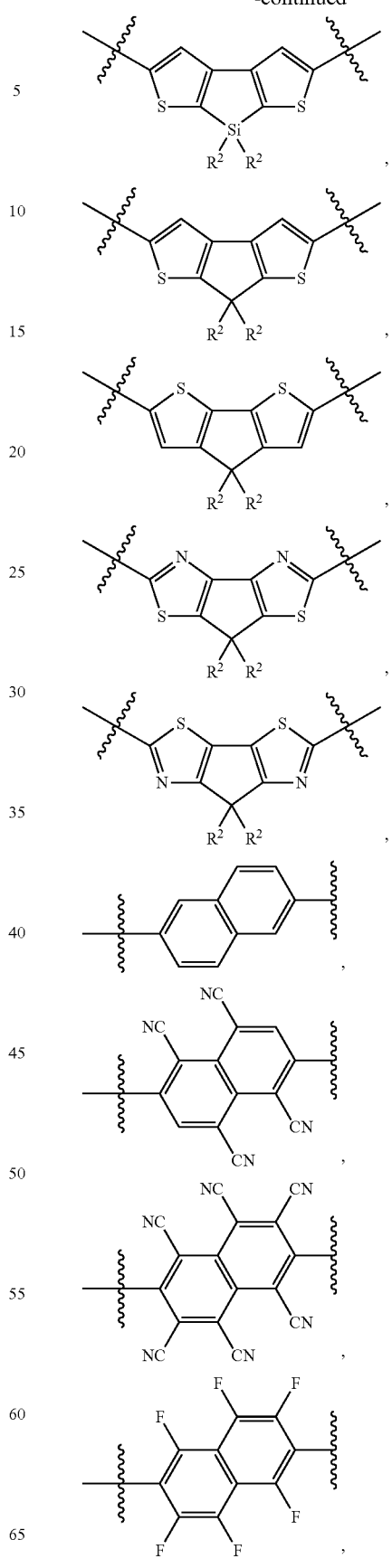

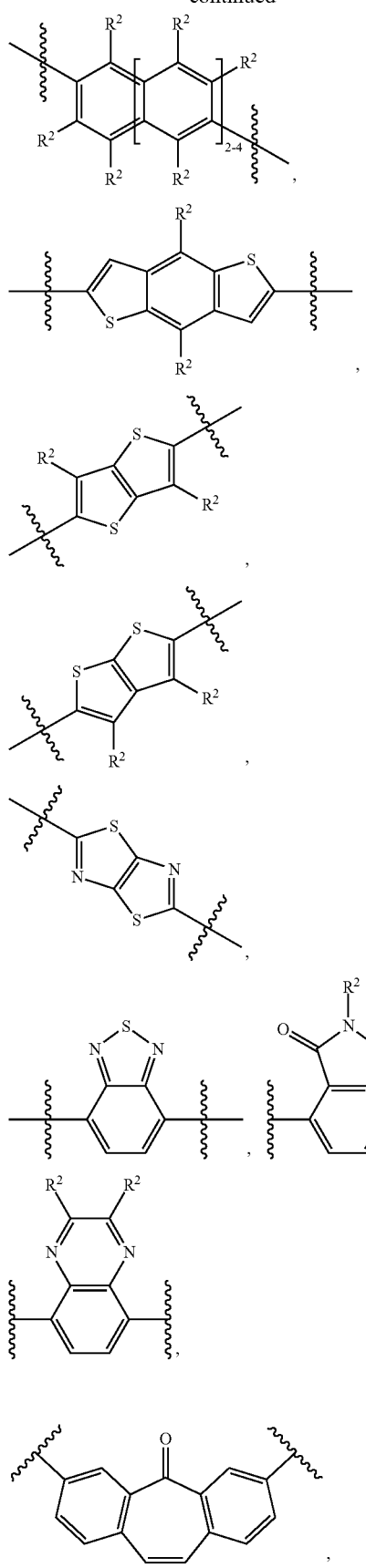
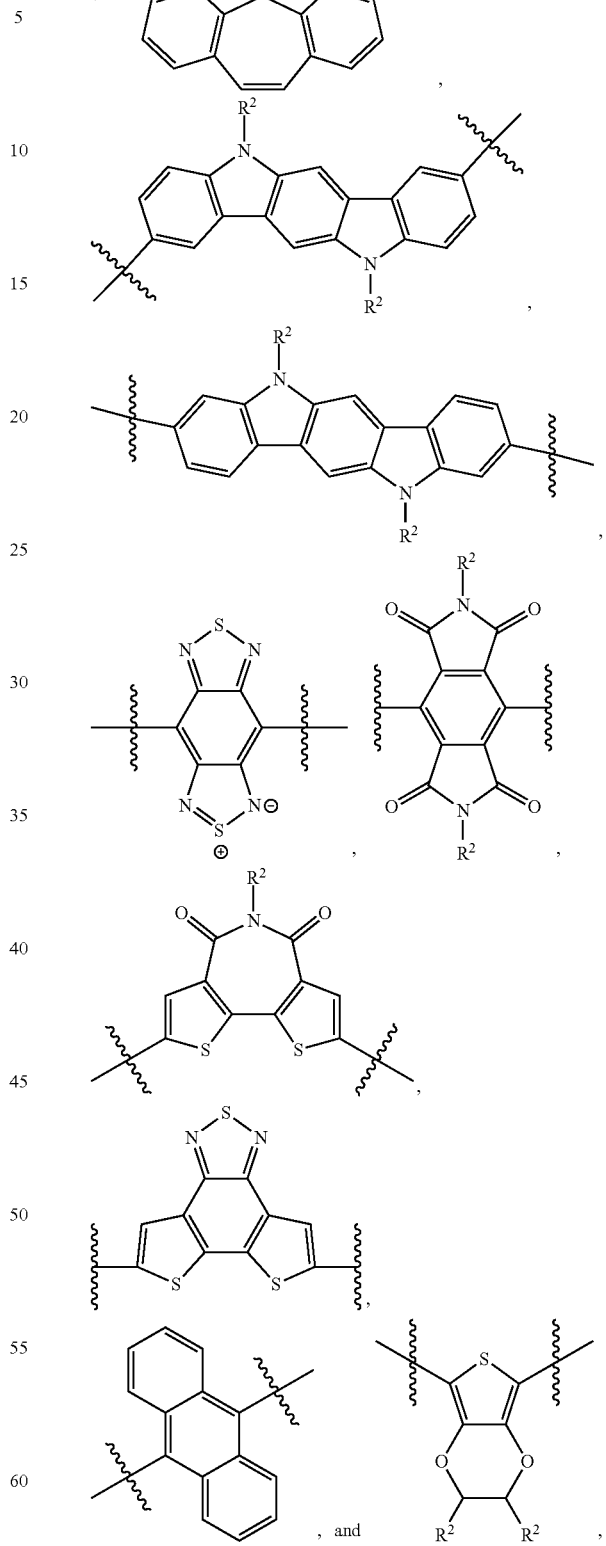
wherein $R^2$ is as defined herein. For example, $R^2$ can be selected from H, a $C_{1-20}$ alkyl group, a $C_{1-20}$ alkoxy group, and a $C_{1-20}$ haloalkyl group.

In some embodiments, Ar, at each occurrence, independently can be an optionally substituted monocyclic moiety selected from:

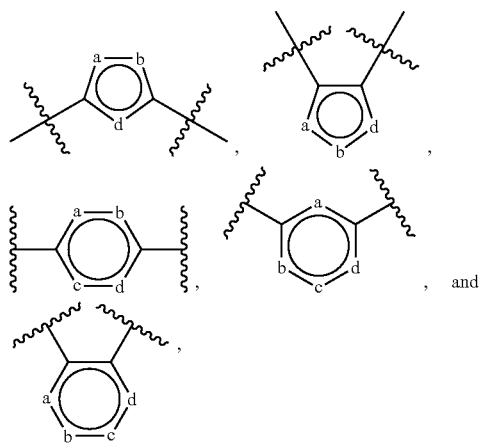

wherein:
a, b, c and d independently are selected from —S—, —O—, —CH=, =CH—, —CR³=, =CR³—, —C(O)—, —C(C(CN)₂)—, —N=, =N—, —NH— and —NR³—;
R³, at each occurrence, is independently selected from a) halogen, b) —CN, c) —NO₂, d) —N(R$^c$)₂, e) —OR$^c$, f) —C(O)R$^c$, g) —C(O)OR$^c$, h) —C(O)N(R$^c$)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{3-14}$ cycloalkyl group, p) a —Y—$C_{6-14}$ aryl group, q) a —Y-3-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R$^e$ groups;
R$^c$, at each occurrence, is independently selected from H, a $C_{1-6}$ alkyl group, and a —Y—$C_{6-14}$ aryl group;
Y and R$^e$ are as defined herein.

In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl)₂. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, $(Ar)_m$, $(Ar)_{m'}$, and $(Ar)_{m''}$ can be selected from:

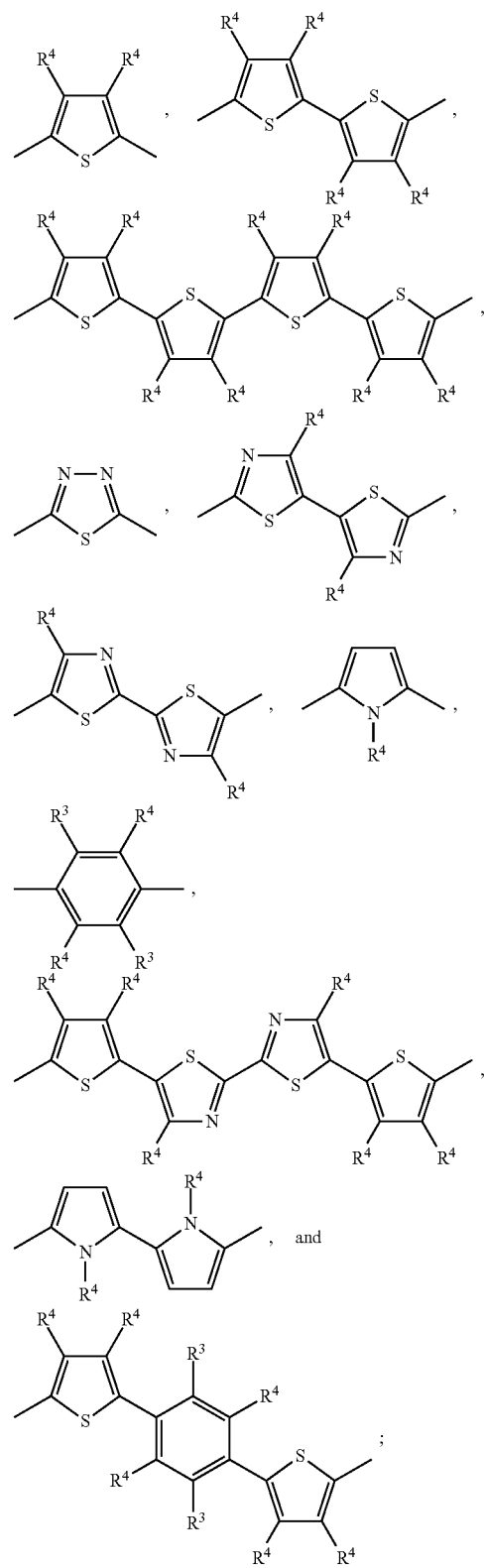

wherein R⁴, at each occurrence, independently is H or R³, and R³ is as defined herein. In particular embodiments,

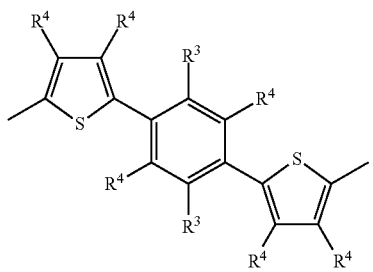

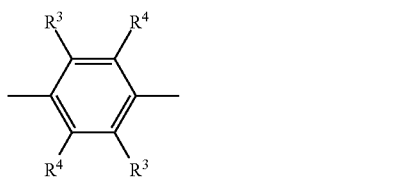

of can be selected from:

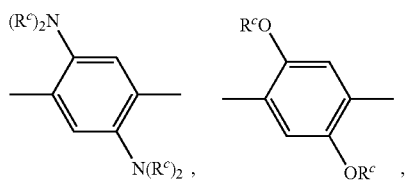

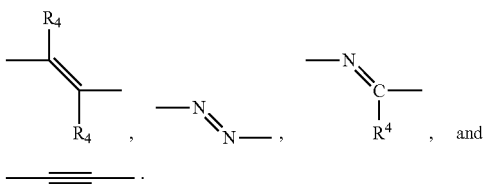

wherein $R^4$ is as defined herein. In certain embodiments, Z can be selected from:

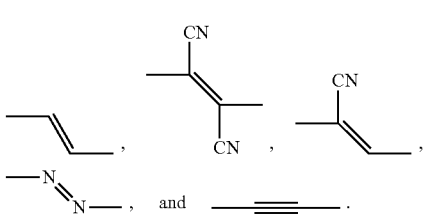

In some embodiments, $M^a$ and $M^{a'}$ can include at least one optionally substituted monocylic aryl or heteroaryl group. For example, $M^a$ and $M^{a'}$ can have the formula:

$$\text{---}(\text{Ar})_{m''}\text{---},$$

wherein m" is selected from 1, 2, 3, 4, 5, or 6; and Ar is as defined herein. For example, $M^a$ and $M^{a'}$ can be selected from:

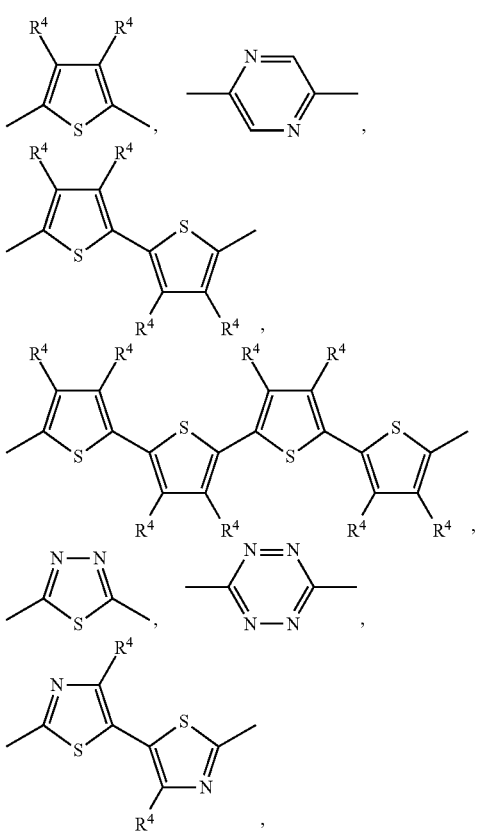

wherein $R^c$ is as defined herein.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

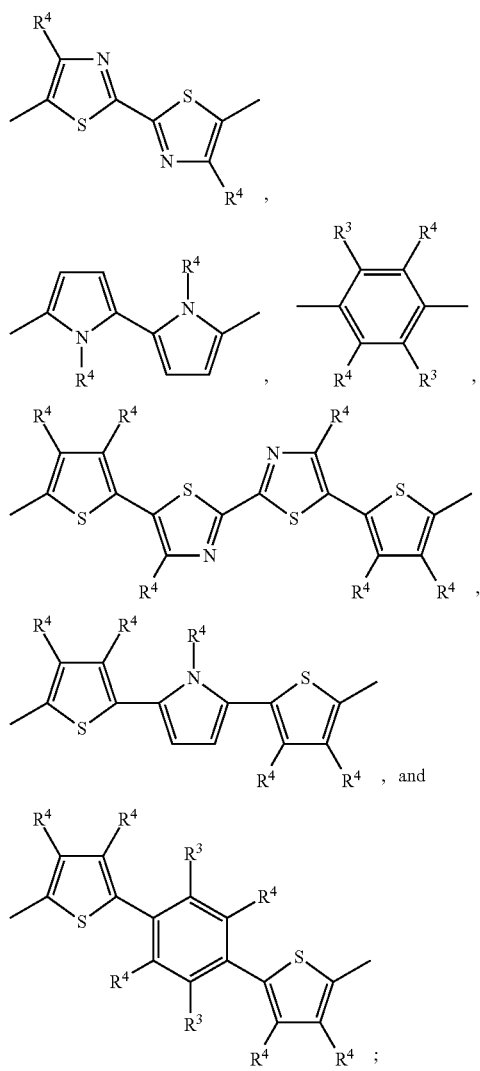

wherein $R^3$ and $R^4$ are as defined herein. In particular embodiments, $M^a$ and $M^{a'}$ can be selected from:

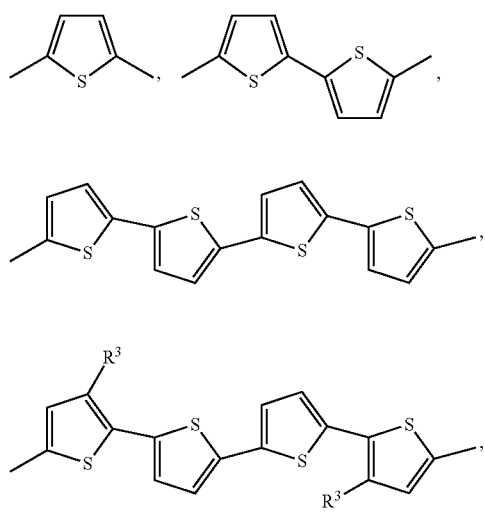

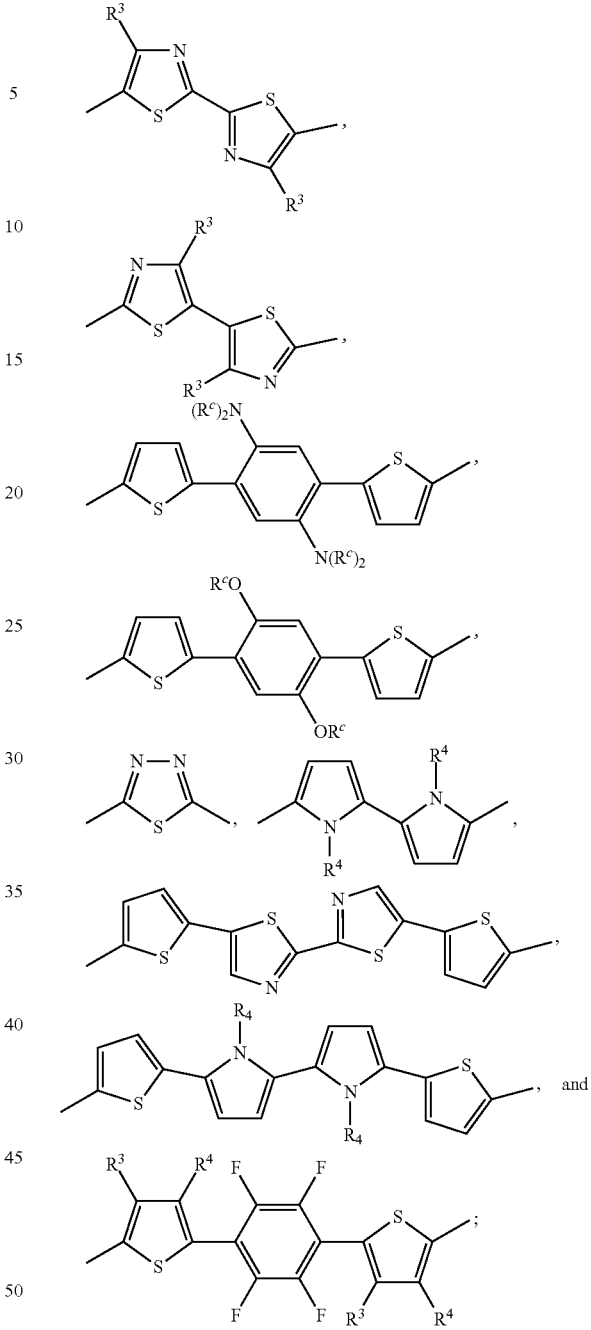

wherein $R^3$ can be independently selected from a halogen, —CN, a $C_{1-20}$ alkyl group, a $C_{1-20}$ alkoxy group, and a $C_{1-20}$ haloalkyl group; $R^4$ can be independently selected from H, a halogen, —CN, a $C_{1-20}$ alkyl group, a $C_{1-20}$ alkoxy group, and a $C_{1-20}$ haloalkyl group; and $R^c$, at each occurrence, can be independently H or a $C_{1-6}$ alkyl group.

In some embodiments, $M^a$ and $M^{a'}$ in addition to the one or more optionally substituted monocyclic aryl or heteroaryl group, can include a linker. For example, $M^a$ and $M^{a'}$ can have the formula:

$$-(Ar)_{m'}Z-(Ar)_m- \text{ or } -Z-(Ar)_{m''}Z-,$$

wherein m and m' are selected from 1, 2, 4, or 6; m" is selected from 1, 2, 3, or 4; and Ar and Z are as defined herein. In certain embodiments, $M^a$ and $M^{a'}$ can be selected from:

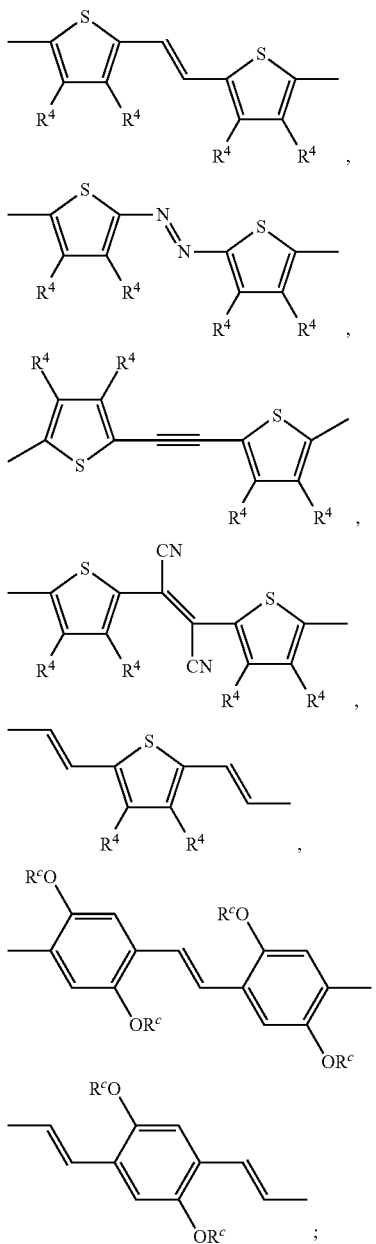

wherein R⁴ and R$^c$ are as defined herein.

In some embodiments, M$^a$ and M$^{a'}$, in addition to the one or more optionally substituted monocyclic aryl or heteroaryl group, can include one or more optionally substituted polycyclic moieties. For example, M$^a$ and M$^{a'}$ can have the formula:

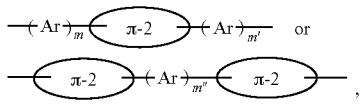

wherein m and m' are selected from 1, 2, 4, or 6; and Ar and π-2 are as defined herein. In certain embodiments, M$^a$ and M$^{a'}$ can be selected from:

wherein R² and R⁴ are as defined herein.

In some embodiments, M$^a$ and M$^{a'}$, in addition to the one or more optionally substituted monocyclic aryl or heteroaryl group, can include one or more linkers and/or optionally substituted polycyclic moieties. For example, M$^a$ and M$^{a'}$ can have a formula selected from:

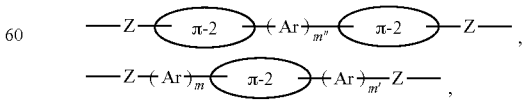

wherein m, m' and m" independently are 1, 2, 3 or 4; and Ar, π-2 and Z are as defined herein. In certain embodiments, M$^a$ and M$^{a'}$ can be selected from

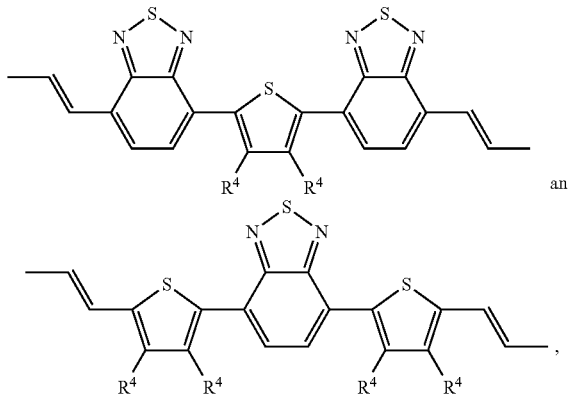

wherein R⁴ is as defined herein.

In other embodiments, $M^a$ and $M^{a'}$ can have a formula selected from:

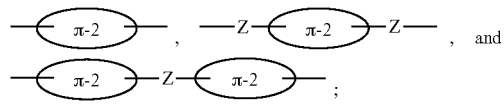

wherein π–2 and Z are as defined herein.

To illustrate, $M^a$ and $M^{a'}$ can be selected from the group consisting of:

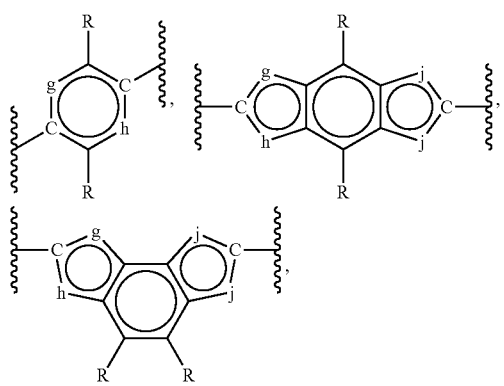

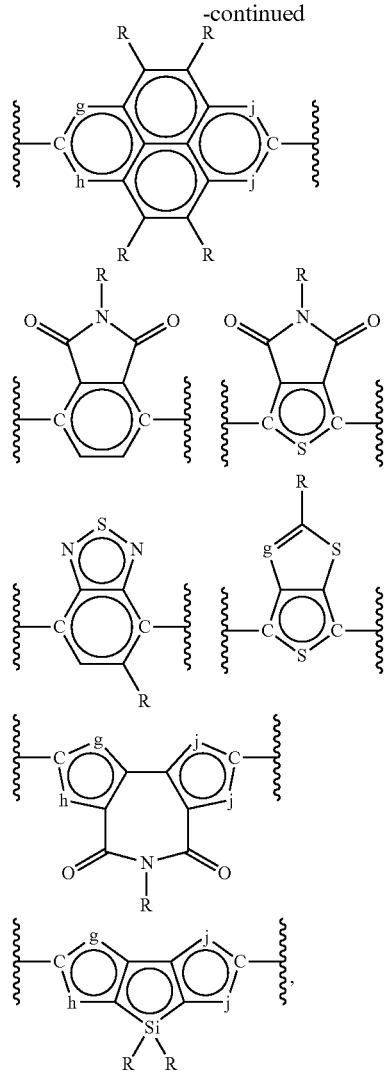

wherein g, h, i and j independently can be selected from —CR²=, =CR²—, —S—, —N=, =N—, and —N(R²)—; R² and R, at each occurrence, independently can be H or $R^e$; and $R^e$ is as defined herein.

In particular embodiments, the electron-acceptor polymer of the present polymer-polymer blend can be represented by Formula 3 or 4:

(3)

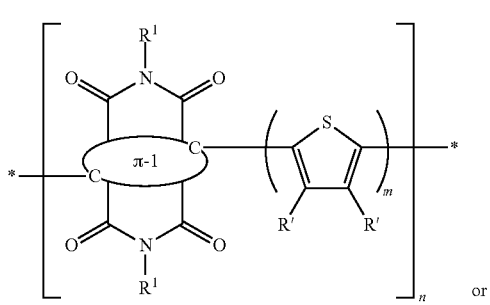

or

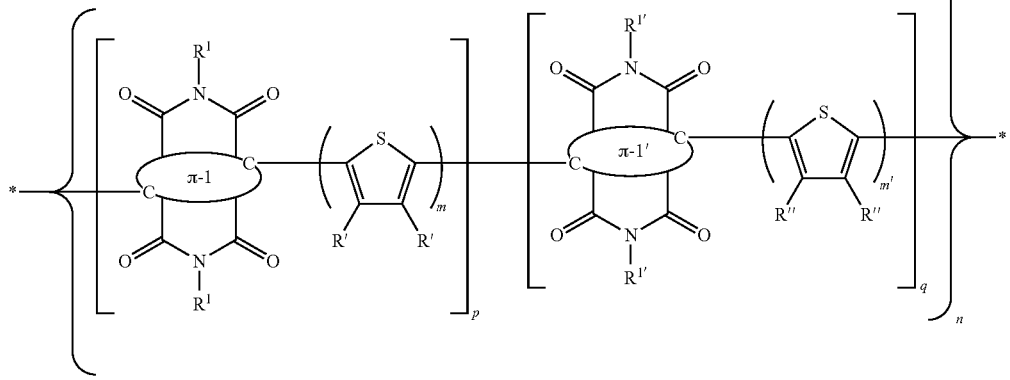

(4)

wherein:
π–1 and π–1' can be identical or different and independently are an optionally substituted fused ring moiety;
$R^1$ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;
R' and R" can be identical or different and independently are selected from the group consisting of H, F, Cl, —CN, and —L—R, wherein L, at each occurrence, independently is selected from the group consisting of —O—, —S—, —C(O), —C(O)O—, and a covalent bond; and R, at each occurrence, independently can be selected from the group consisting of a $C_{6-20}$ alkyl group, a $C_{6-20}$ alkenyl group, and a $C_{6-20}$ haloalkyl group;
m and m' independently can be 1, 2, 3, 4, 5 or 6; and
p and q independently are a real number, wherein $0.1 \leq p \leq 0.9$, $0.1 \leq q \leq 0.9$, and the sum of p and q is about 1; and
n is an integer in the range of 2 to 5,000;
provided that at least one of the following is true: (a) π–1' is different from π–1, (b) $R^{1'}$ is different from $R^1$, or (c) R" is different from R'.

To illustrate further, embodiments of the electron-acceptor polymer of the present polymer-polymer blend can be represented by Formula 5, 6, 7, or 8:

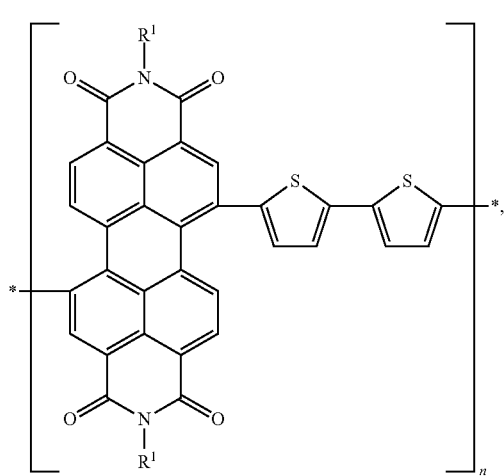

(5)

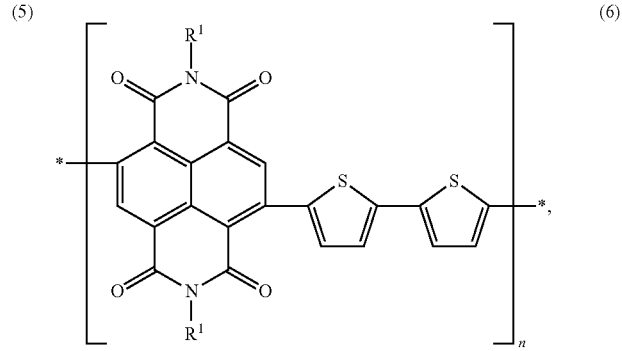

(6)

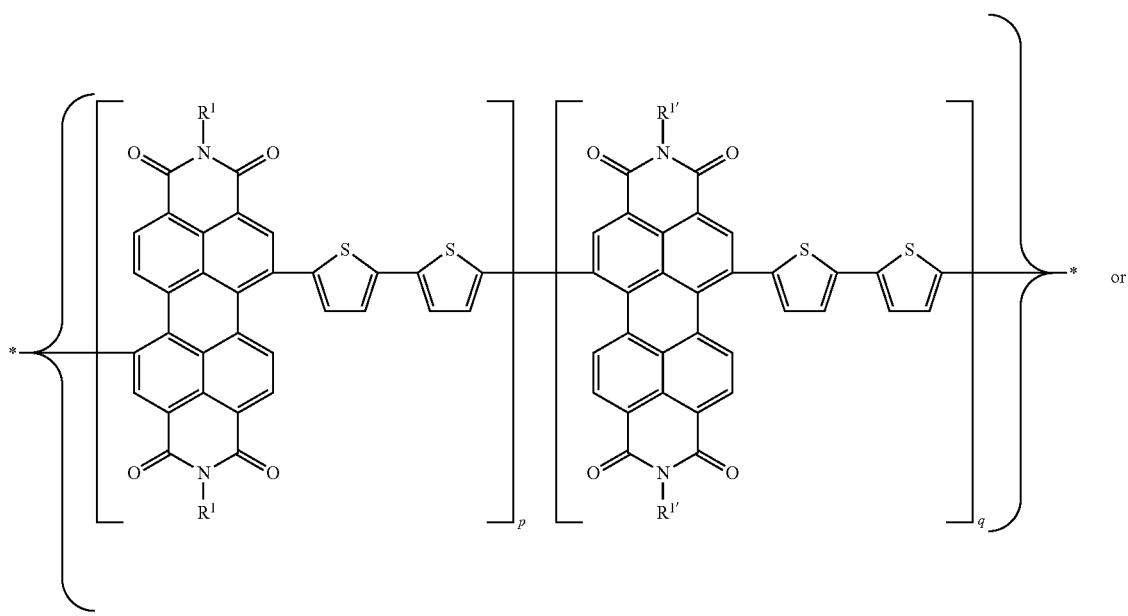
(7)
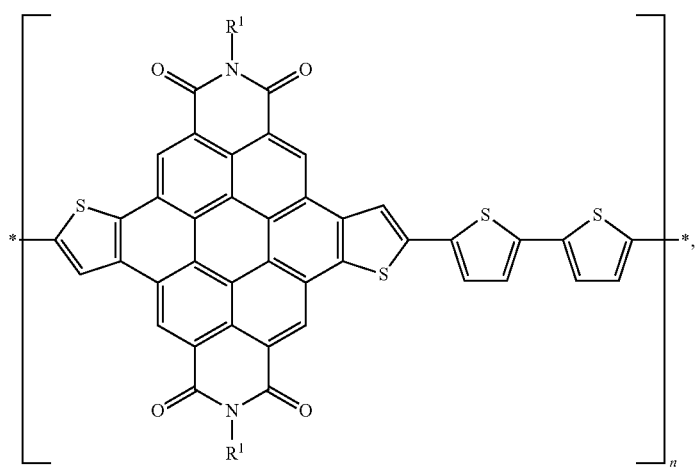
(8)
wherein $R^1$, $R^{1'}$, p, q, and n are as defined herein.
For example, $R^1$ and $R^{1'}$ can be selected from the group consisting of a branched $C_{3-20}$ alkyl group, a branched $C_{4-20}$ alkenyl group, and a branched $C_{3-20}$ haloalkyl group such as:
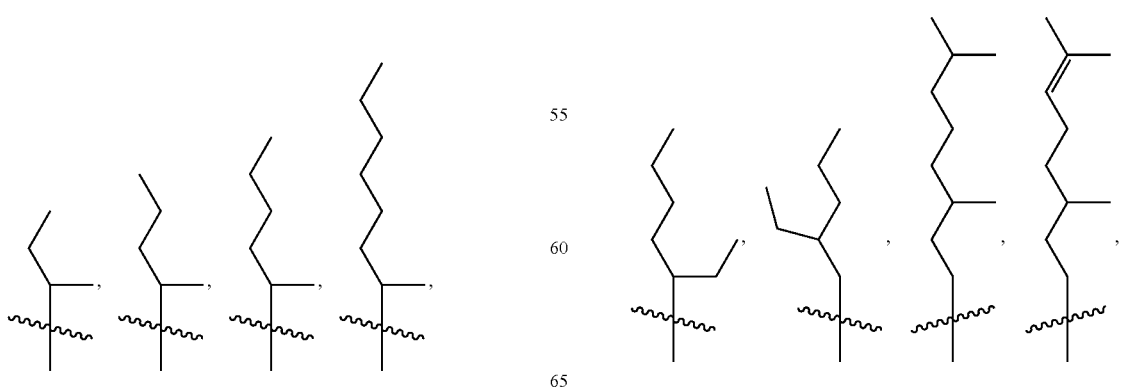
-continued

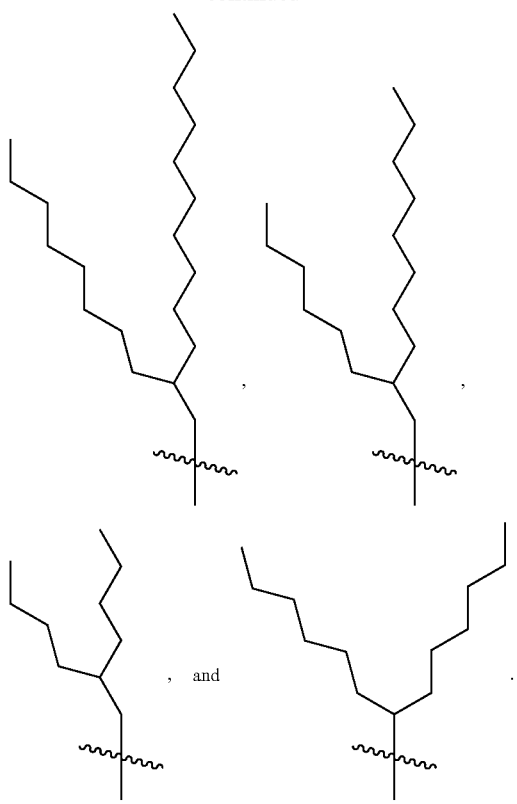

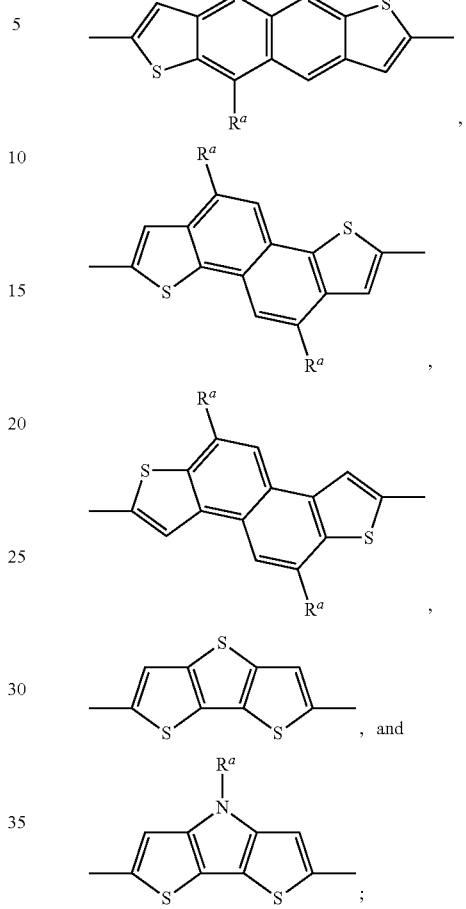

The donor polymer in the present polymer-polymer blend can have an alternating push-pull structure represented by formula 9:

*—[—D-A—]—*       (9), where the donor subunit (D) includes a bridged dithiophene moiety selected from the group consisting of a benzodithiophene moiety, a naphthodithiophene moiety, a thienodithiophene moiety, and a pyridodithiophene moiety; the acceptor subunit (A) includes an electron-poor conjugated moiety; and either the donor subunit (D) or the acceptor subunit (A) comprises one or more thienyl or thienothienyl groups. For example, the bridged dithiophene moiety of the donor subunit (D) can be selected from the group consisting of:

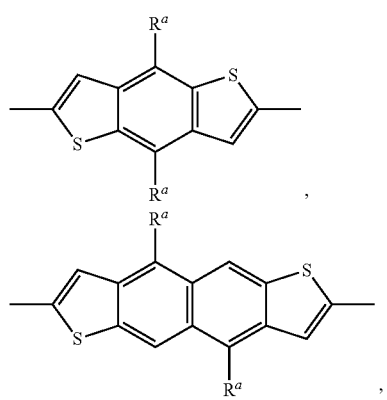

where $R^a$, at each occurrence, independently can be selected from the group consisting of —L'—$R^b$, —L'—Ar', and —L'—Ar'—Ar', where L' is selected from the group consisting of —O—, —S—, —C(O)O—, —OC(O)—, and a covalent bond; $R^b$ is selected from the group consisting of a $C_{3-40}$ alkyl group, a $C_{3-40}$ alkenyl group, and a $C_{3-40}$ haloalkyl group; and Ar', at each occurrence, independently is a 5-14 membered heteroaryl group optionally substituted with 1-2 $R^b$ groups.

For example, in certain embodiments, $R^a$ can be selected from the group consisting of a linear $C_{5-40}$ alkyl group, a branched $C_{5-40}$ alkyl group, a linear $C_{5-40}$ alkoxy group, a branched $C_{5-40}$ alkoxy group, a linear $C_{5-40}$ alkylthio group, and a branched $C_{5-40}$ alkylthio group. Accordingly, using benzodithiophene as the representative donor subunit, D can be selected from the group consisting of:

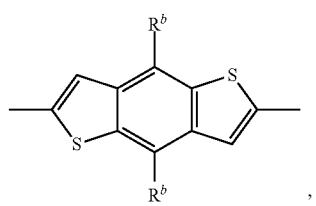

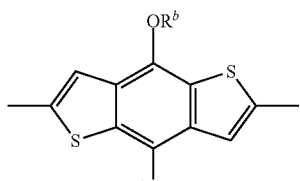

, and

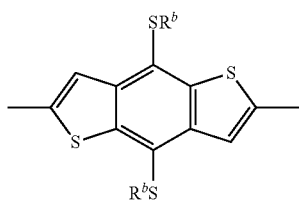

, where $R^b$, at each occurrence, can be a linear or branched $C_{5-40}$ alkyl group.

In other embodiments, each $R^a$ can be —L'—Ar' or —L'—Ar'—Ar', where L' and Ar' are as defined herein. For example, each Ar' can be a thienyl group or a thienyl-fused polycyclic group, each of which can be optionally substituted as described herein. To illustrate, the bridged dithiophene moiety can be functionalized with a thienyl group, a bithienyl group, or a thienyl-fused polycyclic group, each of which can be optionally substituted as described herein. To illustrate further, and using benzodithiophene again as the representative donor subunit, D can be selected from the group consisting of:

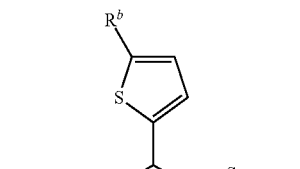

,

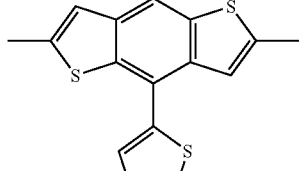

,

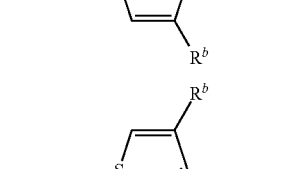

,

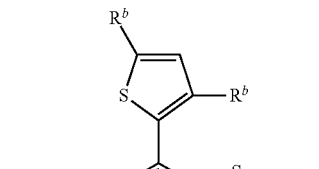

,

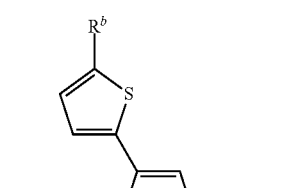

,

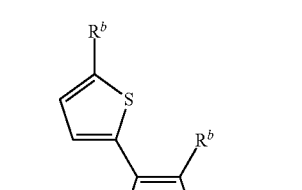

,

-continued
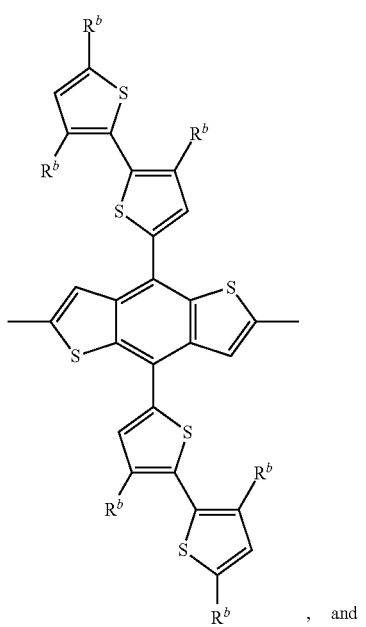
, and
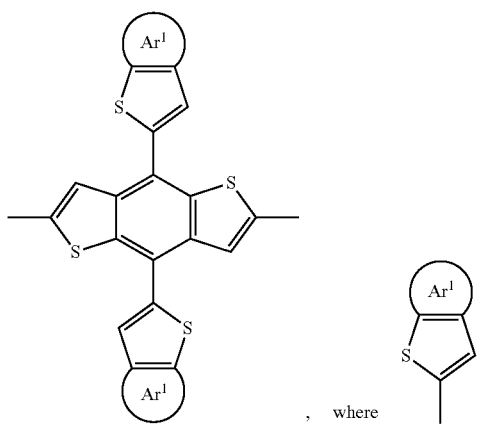
, where
can be selected from the group consisting of:
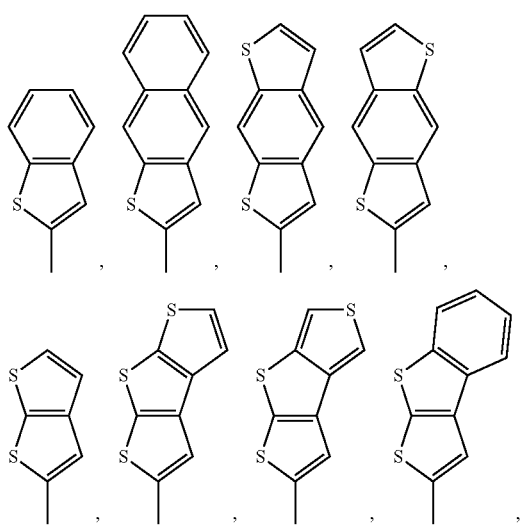
-continued
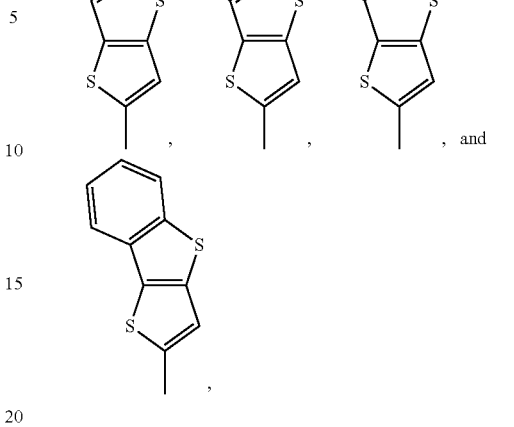
, and
each of which can be optionally substituted with 1-2 $R^b$ groups, and $R^b$, at each occurrence, independently can be a $C_{3-40}$ alkyl group.
In further embodiments, the donor subunit (D) can have a formula selected from
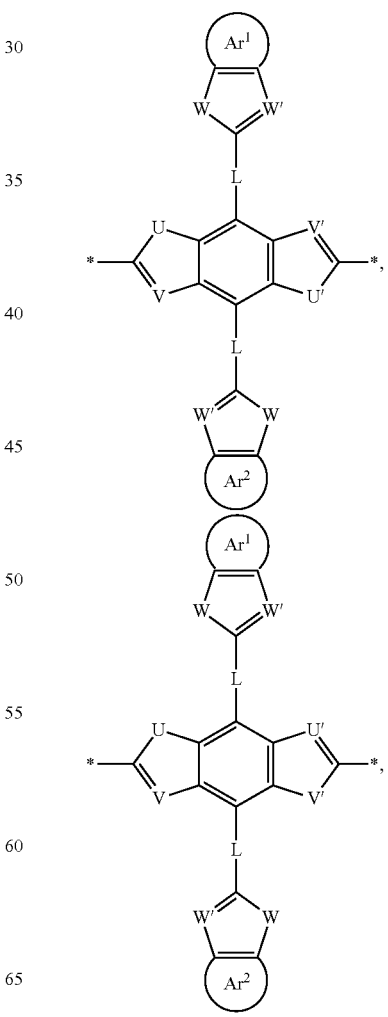

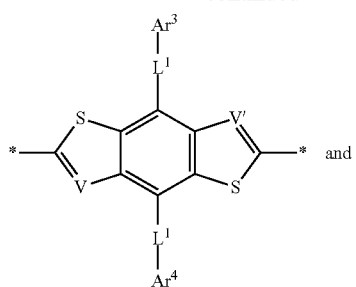

and

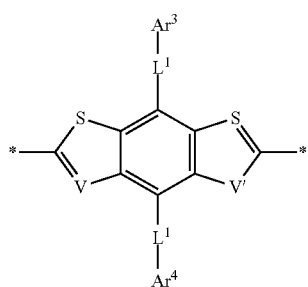

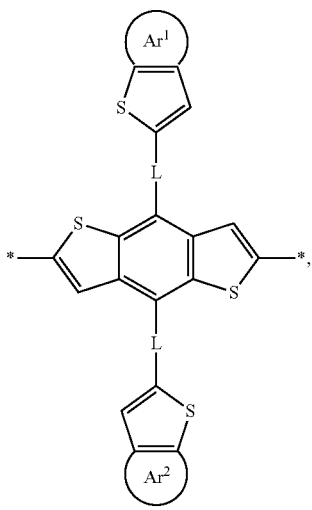

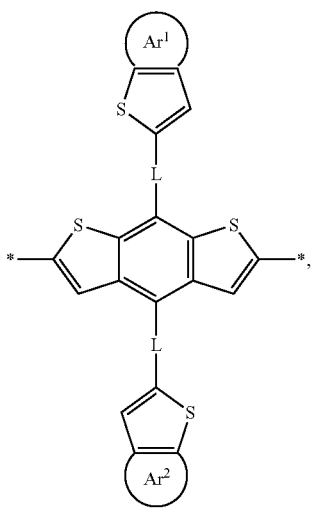

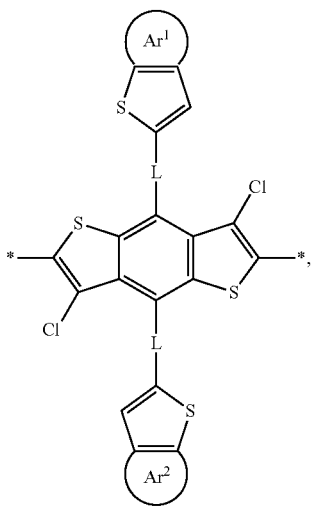

wherein:

Ar$^1$ and Ar$^2$ independently are an optionally substituted C$_{6-14}$ aryl group or an optionally substituted 5-14 membered heteroaryl group;

Ar$^3$ and Ar$^4$ independently are an optionally substituted phenyl group or an optionally substituted 5- or 6-membered heteroaryl group;

L, at each occurrence, independently is selected from —O—, —S—, —Se—, —OC(O)—, —C(O)O—, a divalent C$_{1-20}$ alkyl group, a divalent C$_{1-20}$ haloalkyl group, and a covalent bond;

L$^1$, at each occurrence, independently is selected from —O—, —S—, —Se—, —OC(O)—, —C(O)O—, a divalent C$_{1-20}$ alkyl group, and a divalent C$_{1-20}$ haloalkyl group;

U and U' independently are selected from —O—, —S—, and —Se—;

V and V' independently are —CR═ or —N═;

W, at each occurrence, independently is selected from —O—, —S—, and —Se—;

W', at each occurrence, independently is —CR═ or —N═; and

R, at each occurrence, independently is selected from H, a halogen, —CN, and L'R', wherein L', at each occurrence, is selected from —O—, —S—, —Se—, —C(O)—, —OC(O)—, —C(O)O—, and a covalent bond; and R', at each occurrence, independently is selected from a C$_{1-40}$ alkyl group, a C$_{2-40}$ alkenyl group, a C$_{2-40}$ alkynyl group, and a C$_{1-40}$ haloalkyl group.

In certain embodiments, each of U, U' and W can be —S—, and each of V, V' and W' can be —CH═ or —CCl═, thus providing a π group having a formula selected from:

-continued
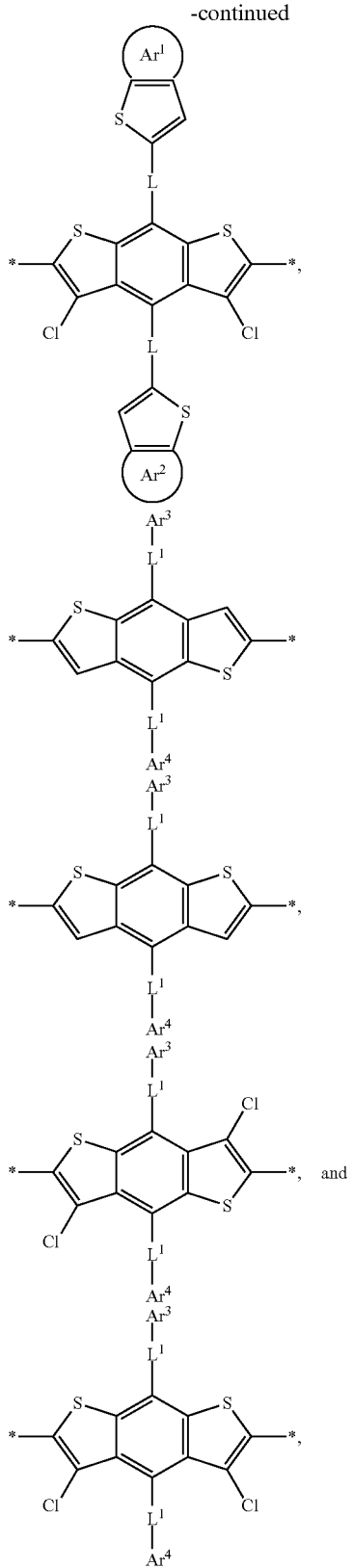
and
wherein $Ar^1$, $Ar^2$, $Ar^3$, $Ar^4$, L and L' are as defined herein. To illustrate, L and L' can be selected from —O—, —S—, —OC(O)—, —C(O)O—, a divalent $C_{1-20}$ alkyl group, and a covalent bond.
In certain embodiments, the donor subunit (D) can include a chlorinated bridged-dithiophene unit. Examples of chlorinated bridged-dithiophene unit include:
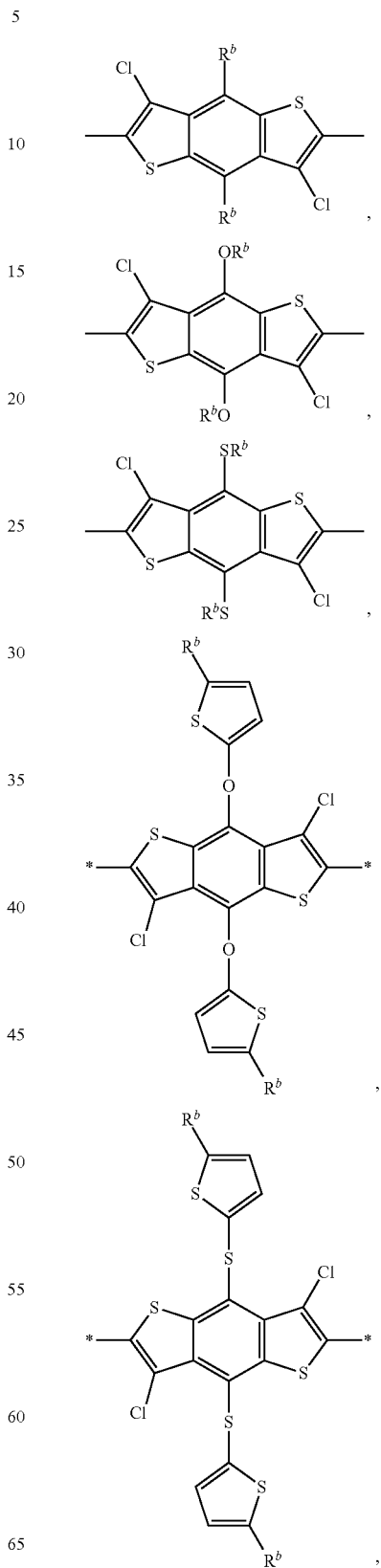

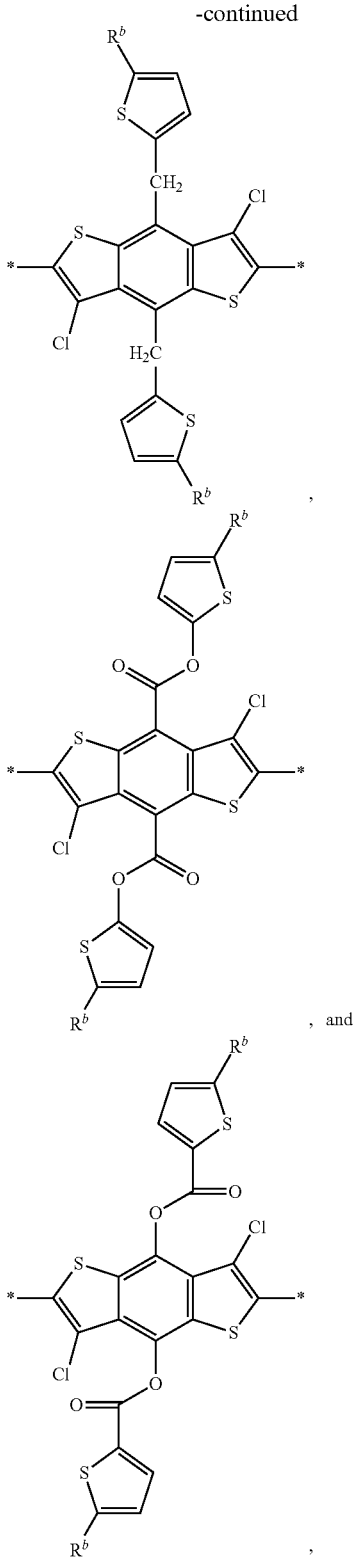

, and

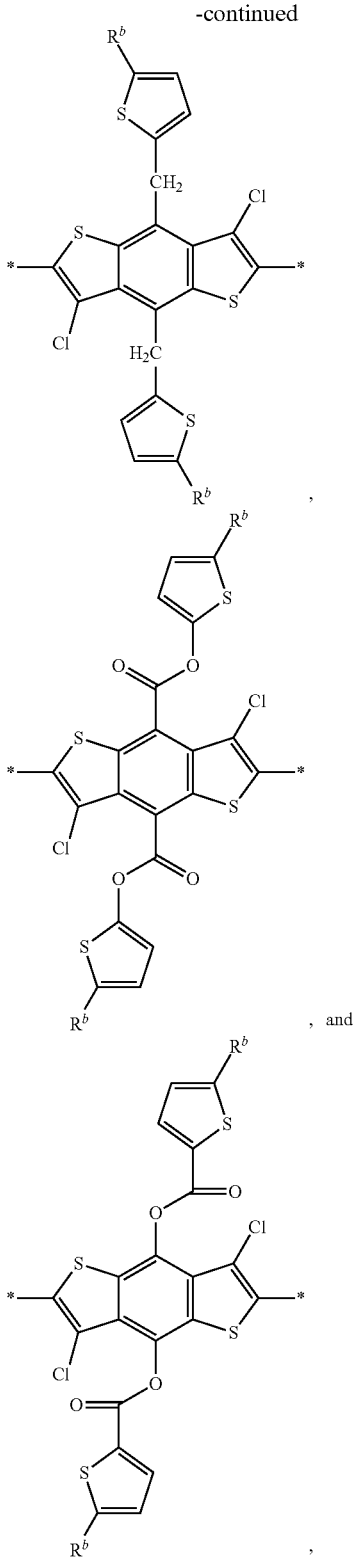

, wherein $R^b$, at each occurrence, independently can be a $C_{3-40}$ alkyl group.

In some embodiments, the donor subunit (D) can include one or more thienyl groups optionally substituted with 1-2 alkoxy groups.

The acceptor subunit (A) includes an electron-poor conjugated moiety (δ). In certain embodiments, the electron-poor conjugated moiety can be an 8-14 membered polycyclic heteroaryl moiety including either at least one ring that has two or more heteroatoms selected from N and S, and/or at least one ring that is substituted with one or more electron-withdrawing groups such as F, Cl, an oxo group, a carbonyl group, a carboxylic ester group, or a sulfonyl group. In particular embodiments, the electron-poor conjugated moiety can be flanked by optionally substituted thienyl or thieno[3,2-b]thiophenyl groups. In certain embodiments, the electron-poor conjugated moiety (δ) can include one or more chlorinated thienyl groups.

Accordingly, in various embodiments, the acceptor subunit (A) can be represented by the formula:

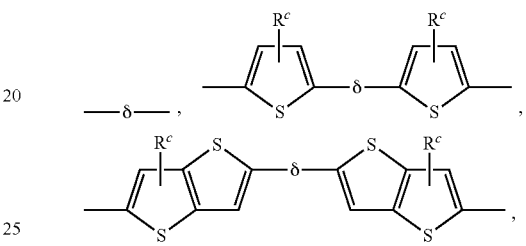

where δ represents the electron-poor conjugated moiety, and $R^c$, at each occurrence, can be H or R, where R, at each occurrence, independently can be selected from the group consisting of a $C_{6-20}$ alkyl group, a $C_{6-20}$ alkenyl group, and a $C_{6-20}$ haloalkyl group.

Examples of electron-poor conjugated moieties (δ) include, but are not limited to:

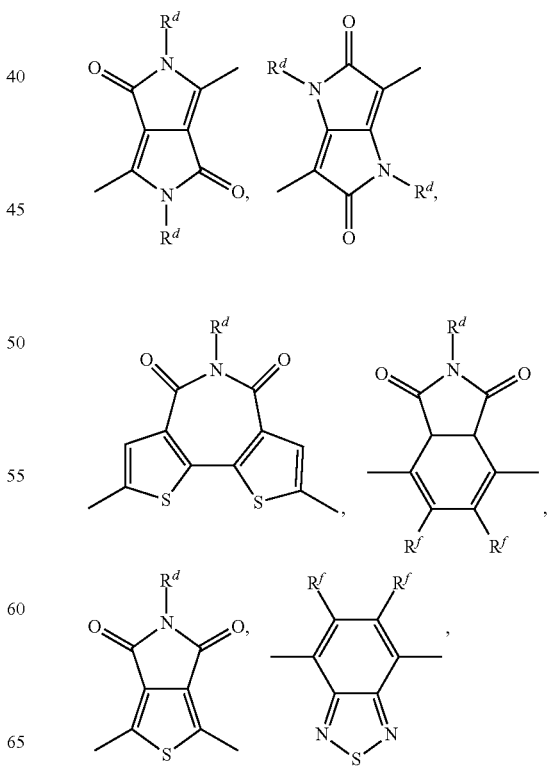

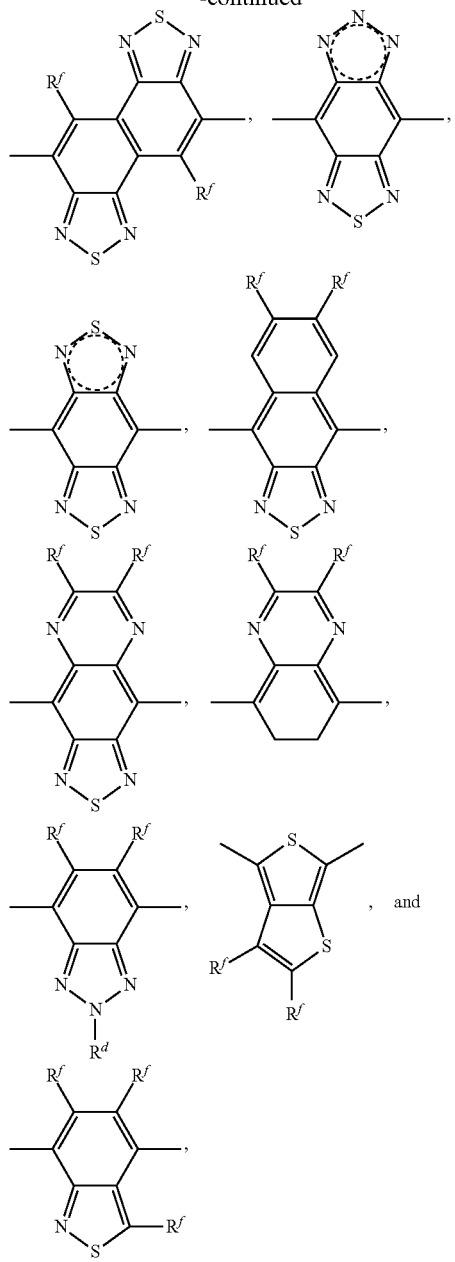

where $R^d$, at each occurrence, independently can be selected from a $C_{3-40}$ alkyl group, a $C_{3-40}$ alkenyl group, and a $C_{3-40}$ haloalkyl group; and $R^f$, at each occurrence, independently can be selected from the group consisting of H, F, Cl, —CN, —S(O)$_2$—C$_{1-20}$ alkyl, —C(O)—OC$_{1-20}$ alkyl, —C(O)—C$_{1-20}$ alkyl, a C$_{1-20}$ alkyl group, a C$_{2-20}$ alkenyl group, a C$_{1-20}$ alkoxy group, a C$_{1-20}$ alkylthio group, and a C$_{1-20}$ haloalkyl group. For example, $R^d$, at each occurrence, independently can be a linear or branched C$_{6-20}$ alkyl group; and $R^f$, at each occurrence, independently can be selected from H, F, Cl, C(O)R$^e$, C(O)OR$^e$, and S(O)$_2$R$^e$; where $R^e$, at each occurrence, independently can be a linear or branched C$_{6-20}$ alkyl group.

Accordingly, in some embodiments, the electron donor polymer can be an alternating copolymer having the formula 10, 11, or 12:

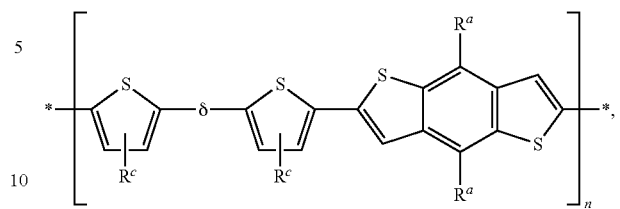

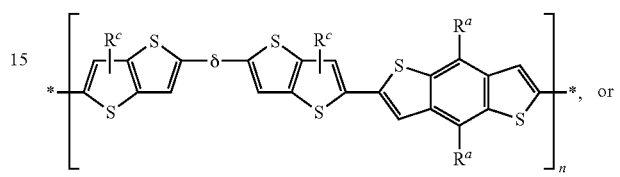

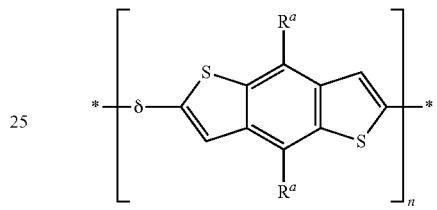

wherein:

$R^a$, at each occurrence, can be selected from the group consisting of —L'—R$^b$, —L'—Ar', and —L'—Ar'—Ar', where L' is selected from the group consisting of —O—, —S—, and a covalent bond; $R^b$ is selected from the group consisting of a C$_{3-40}$ alkyl group, a C$_{3-40}$ alkenyl group, and a C$_{3-40}$ haloalkyl group; and Ar', at each occurrence, independently is a 5-14 membered heteroaryl group optionally substituted with 1-2 R$^b$ groups;

$R^c$, at each occurrence, is H or R, where R, at each occurrence, independently is selected from the group consisting of a C$_{6-20}$ alkyl group, a C$_{6-20}$ alkenyl group, and a C$_{6-20}$ haloalkyl group; δ is selected from the group consisting of:

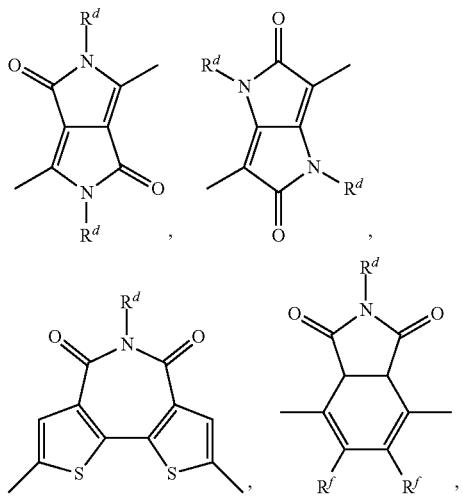

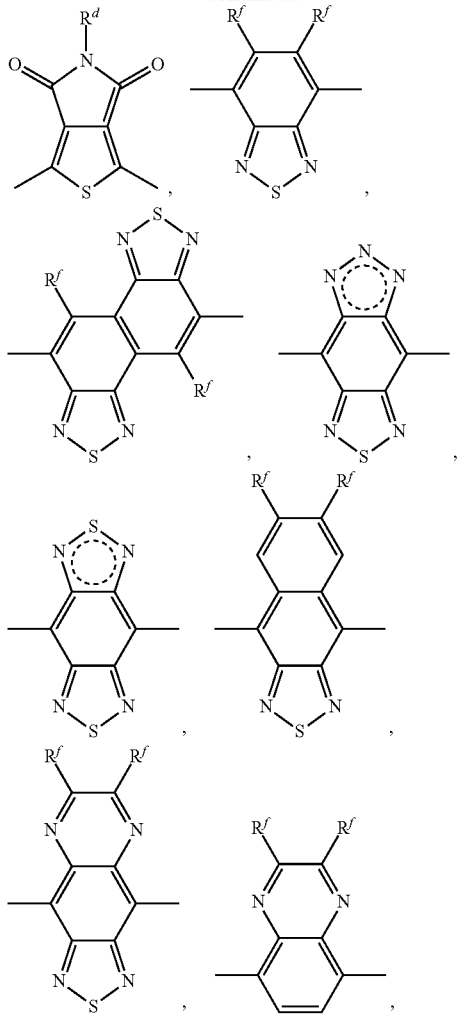

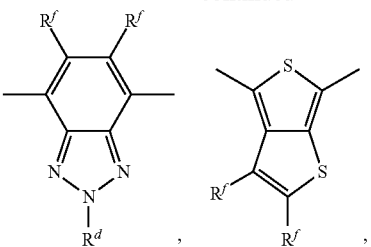

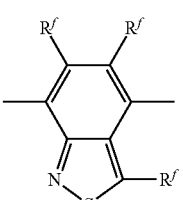

where $R^d$, at each occurrence, independently can be selected from a $C_{3-40}$ alkyl group, a $C_{3-40}$ alkenyl group, and a $C_{3-40}$ haloalkyl group; and $R^f$, at each occurrence, independently can be selected from the group consisting of H, F, Cl, —CN, —S(O)$_2$—C$_{1-20}$ alkyl, —C(O)—OC$_{1-20}$ alkyl, —C(O)—C$_{1-20}$ alkyl, a C$_{1-20}$ alkyl group, a C$_{2-20}$ alkenyl group, a C$_{1-20}$ alkoxy group, a C$_{1-20}$ alkylthio group, and a C$_{1-20}$ haloalkyl group. For example, $R^d$, at each occurrence, independently can be a linear or branched C$_{6-20}$ alkyl group; and $R^f$, at each occurrence, independently can be selected from H, F, Cl, C(O)R$^e$, C(O)OR$^e$, and S(O)$_2$R$^e$; where $R^e$, at each occurrence, independently can be a linear or branched C$_{6-20}$ alkyl group; and n is an integer in the range of 2 to 5,000.

In other embodiments, the electron donor polymer can be a random copolymer having the formula 13 or 14:

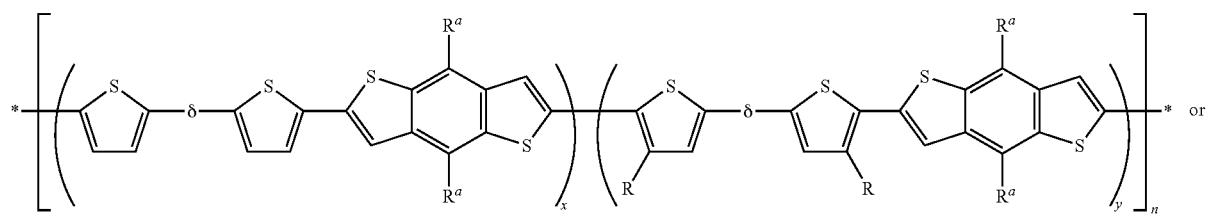

(13)

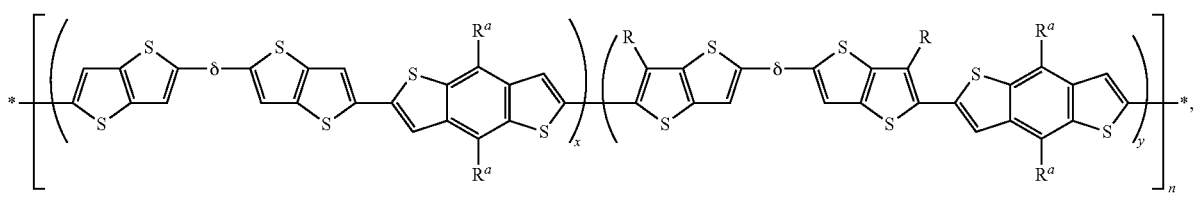

(14)

wherein:

R$^a$, at each occurrence, can be selected from the group consisting of —L'—R$^b$, —L'—Ar', and —L'—Ar'—Ar', where L' is selected from the group consisting of —O—, —S—, and a covalent bond; R$^b$ is selected from the group consisting of a C$_{3-40}$ alkyl group, a C$_{3-40}$ alkenyl group, and a C$_{3-40}$ haloalkyl group; and Ar', at each occurrence, independently is a 5-14 membered heteroaryl group optionally substituted with 1-2 R$^b$ groups;

R, at each occurrence, independently can be a C$_{6-20}$ alkyl group;

δ, at each occurrence, independently can be selected from the group consisting of:

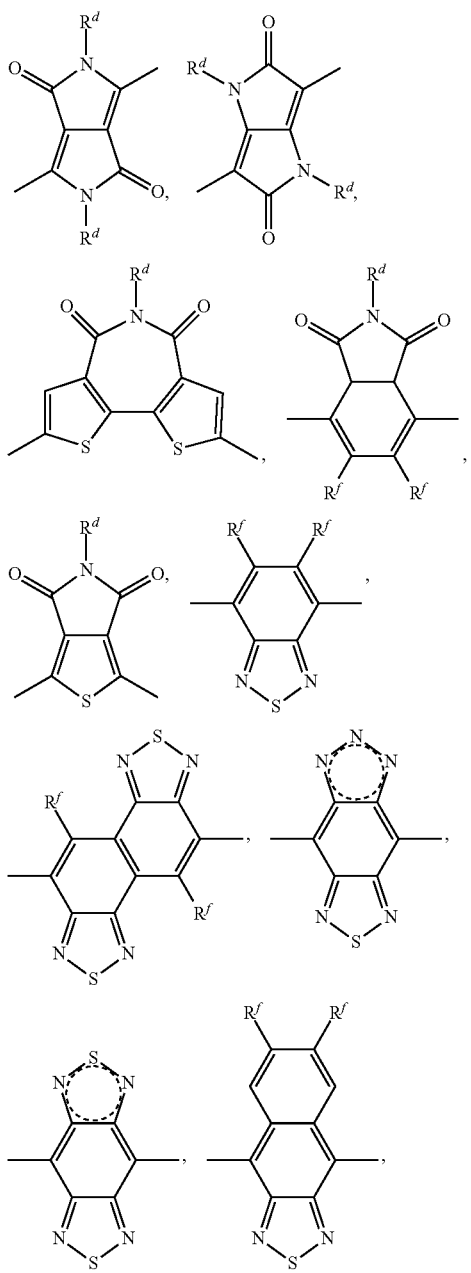

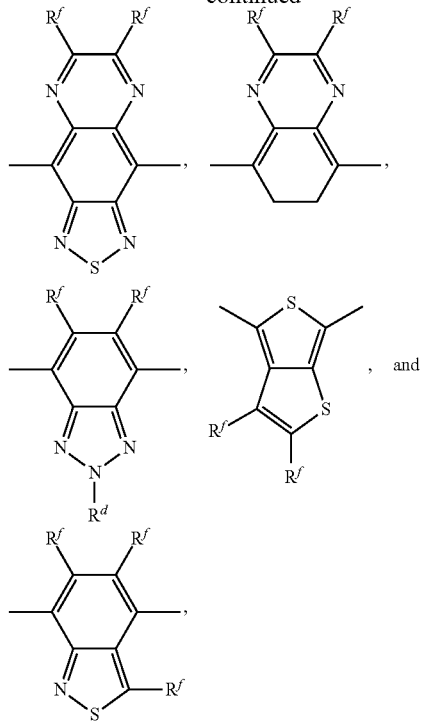

where R$^d$, at each occurrence, independently can be selected from a C$_{3-40}$ alkyl group, a C$_{3-40}$ alkenyl group, and a C$_{3-40}$ haloalkyl group; and R$^f$, at each occurrence, independently can be selected from the group consisting of H, F, Cl, —CN, —S(O)$_2$—C$_{1-20}$ alkyl, —C(O)—OC$_{1-20}$ alkyl, —C(O)—C$_{1-20}$ alkyl, a C$_{1-20}$ alkyl group, a C$_{2-20}$ alkenyl group, a C$_{1-20}$ alkoxy group, a C$_{1-20}$ alkylthio group, and a C$_{1-20}$ haloalkyl group. For example, R$^d$, at each occurrence, independently can be a linear or branched C$_{6-20}$ alkyl group; and R$^f$, at each occurrence, independently can be selected from H, F, Cl, C(O)R$^e$, C(O)OR$^e$, and S(O)$_2$R$^e$; where R$^e$, at each occurrence, independently can be a linear or branched C$_{6-20}$ alkyl group;

x and y independently are a real number, wherein 0.1≤x≤0.9, 0.1≤y≤0.9, and the sum of x and y is about 1; and n is an integer in the range of 2 to 5,000.

Accordingly, the present polymer-polymer blend can include an electron acceptor polymer according to any of formula 1-8 and an electron donor polymer according to any of formula 10-14. In certain preferred embodiments, the present polymer-polymer blend can include an electron acceptor polymer according to formula 5-8 and an electron donor polymer that is an alternating copolymer of a formula selected from the group consisting of (15)

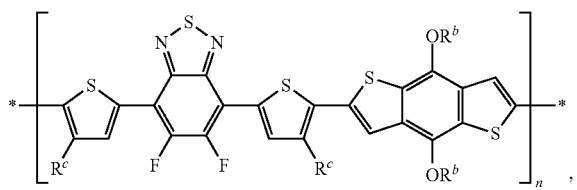
(16)

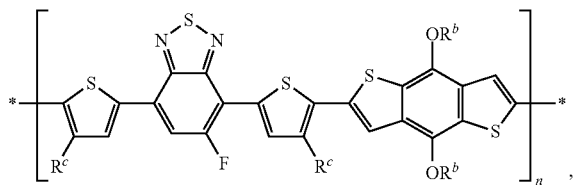
(17)

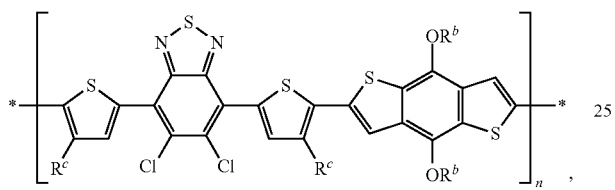
(18)

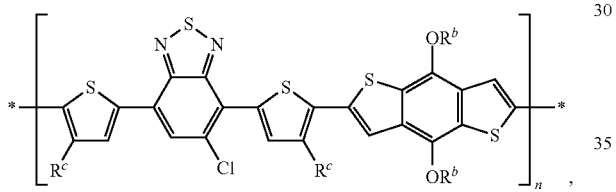
(19)

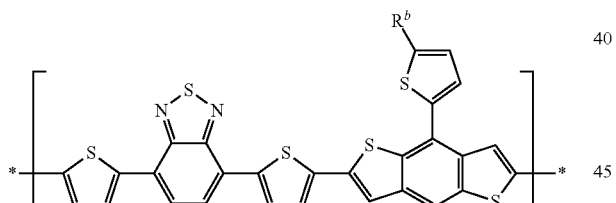
(20)

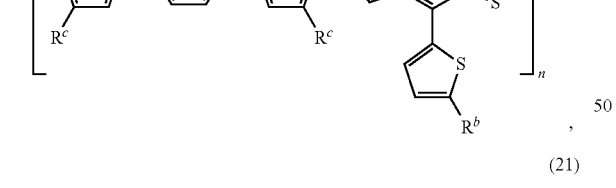
(21)

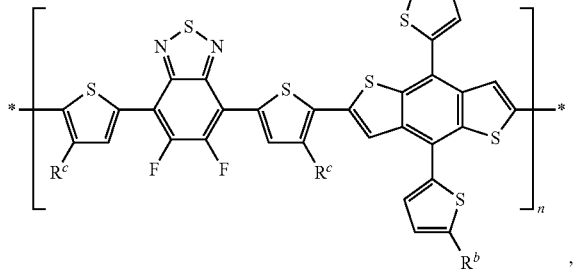

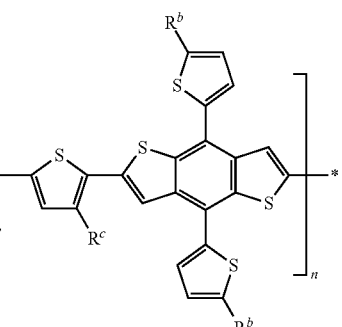
(22)

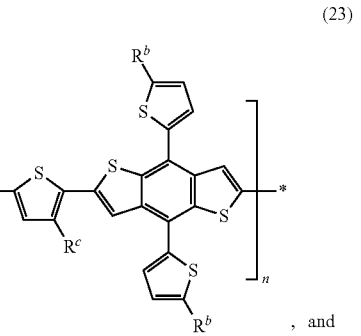
(23) , and

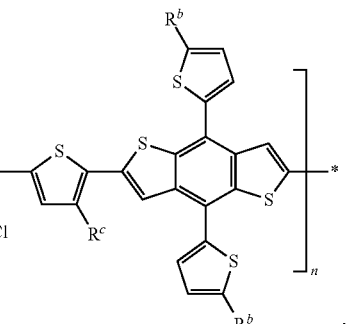
(24) , where $R^b$, at each occurrence, can be a linear or branched $C_{3-40}$ alkyl group; $R^c$, at each occurrence, can be H or a $C_{6-20}$ alkyl group; and n can be an integer in the range of 5 to 5,000.

In other preferred embodiments, the present polymer-polymer blend can include an electron acceptor polymer according to any of formula 5-8 and an electron donor polymer that is a random copolymer of a formula selected from the group consisting of:

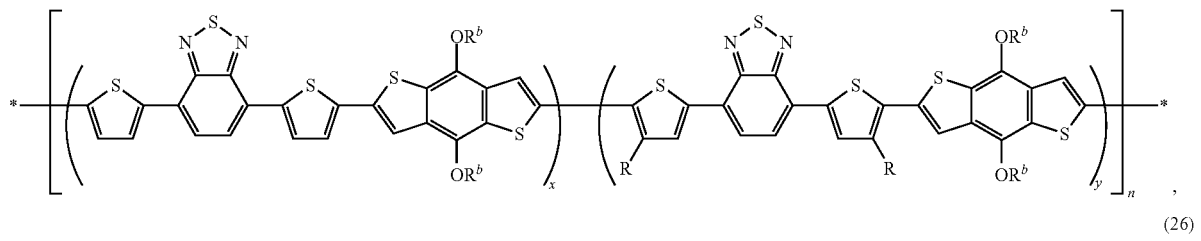
(25)
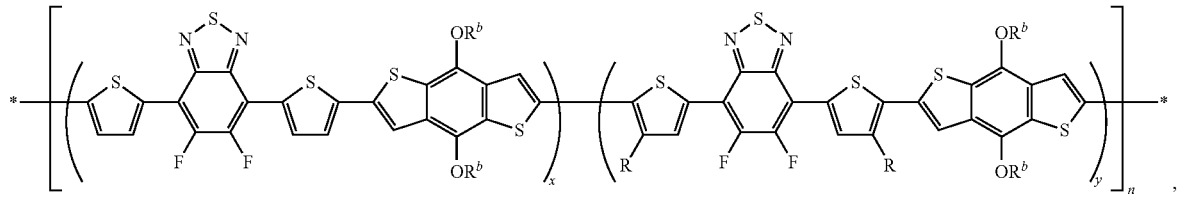
(26)
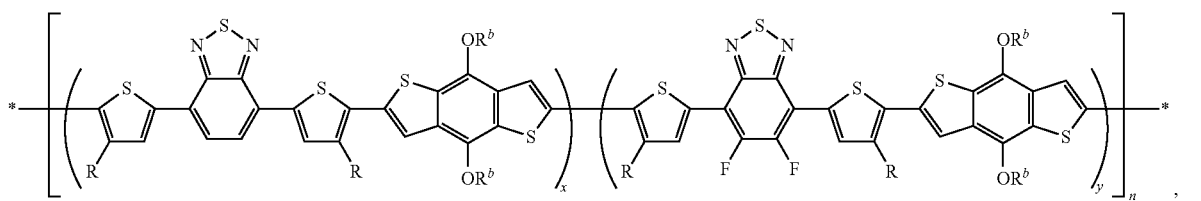
(27)
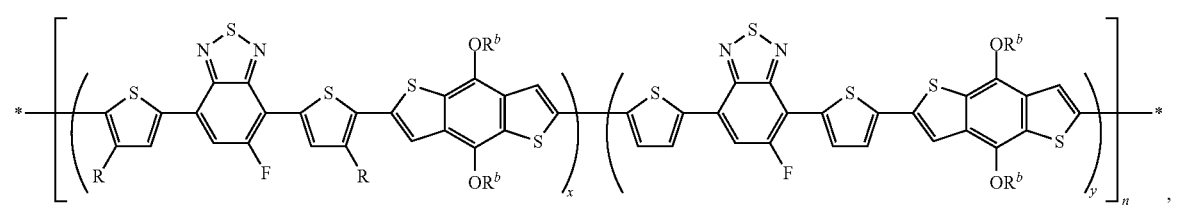
(28)
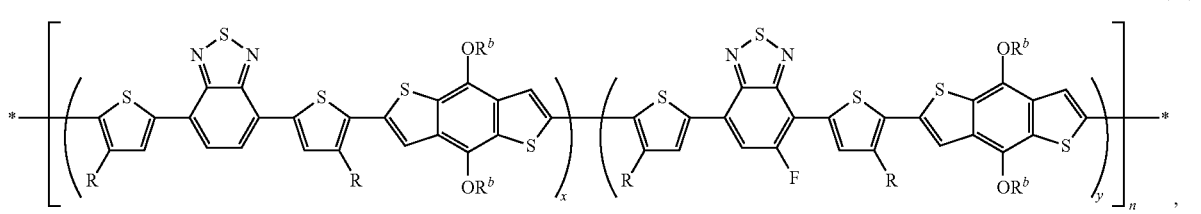
(29)
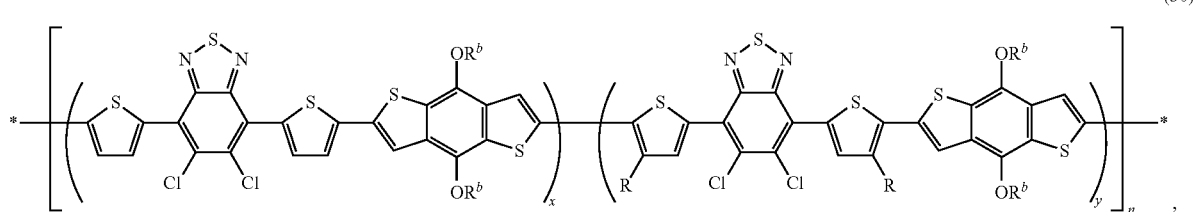
(30)
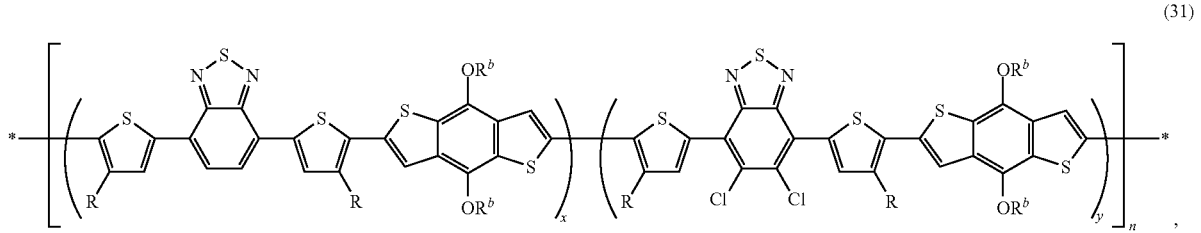
(31)

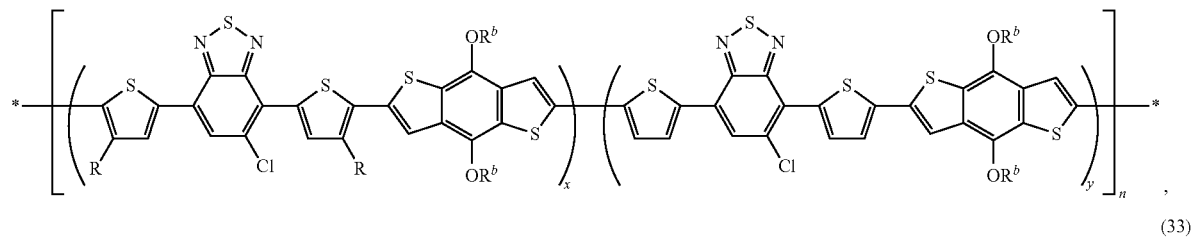
(32)
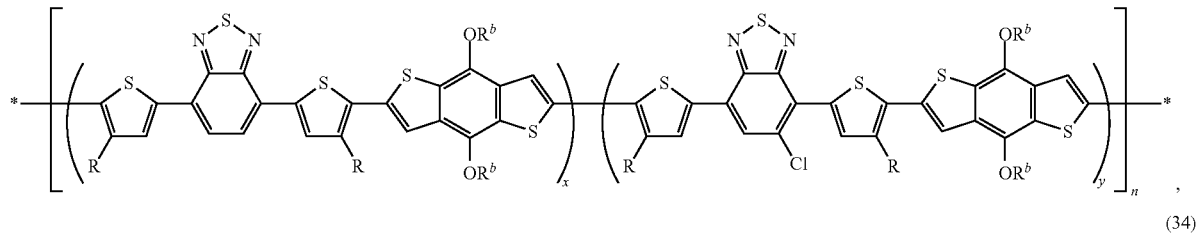
(33)
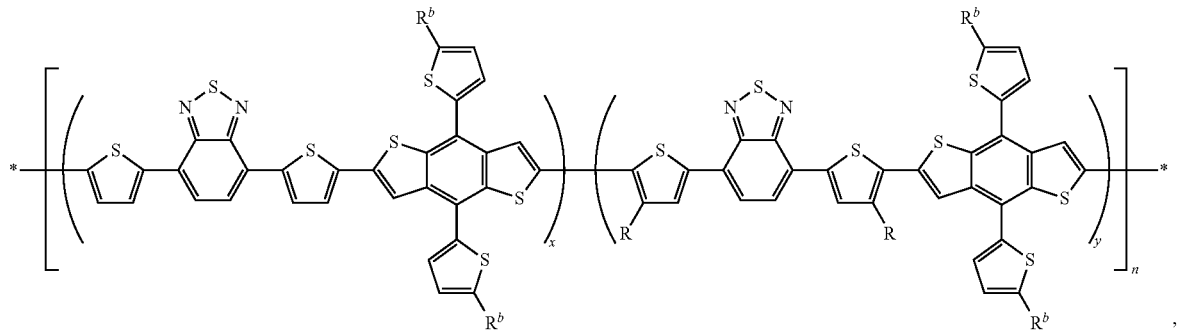
(34)
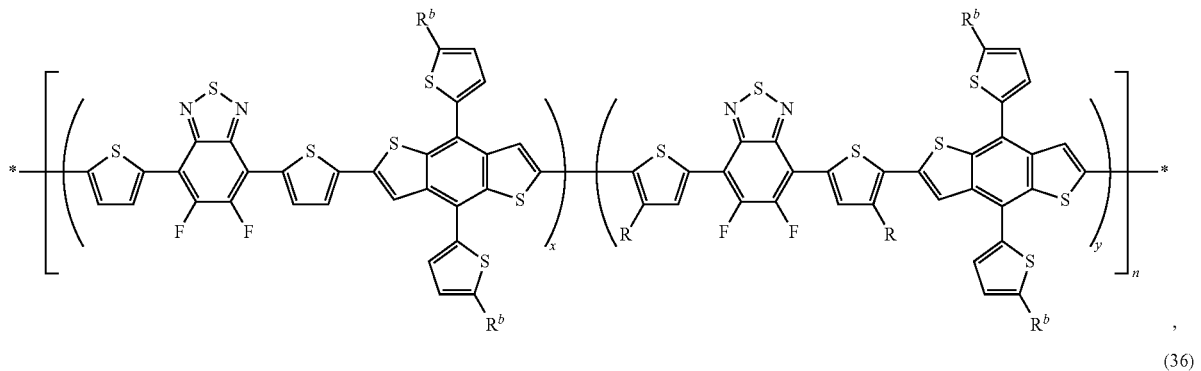
(35)
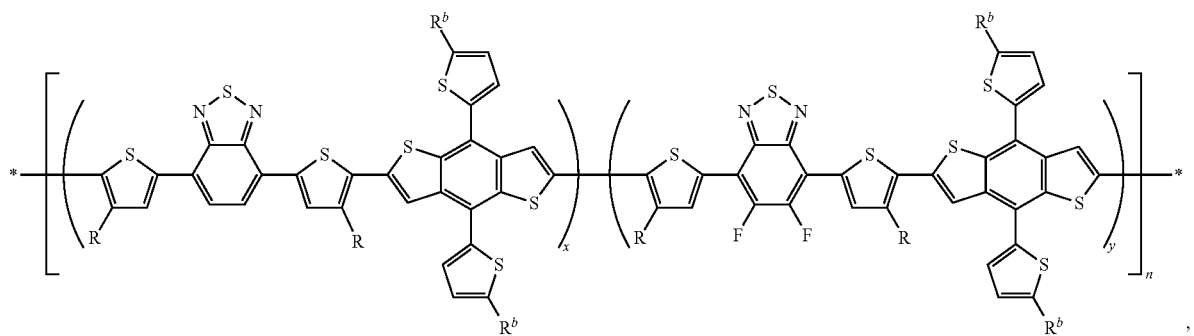
(36)

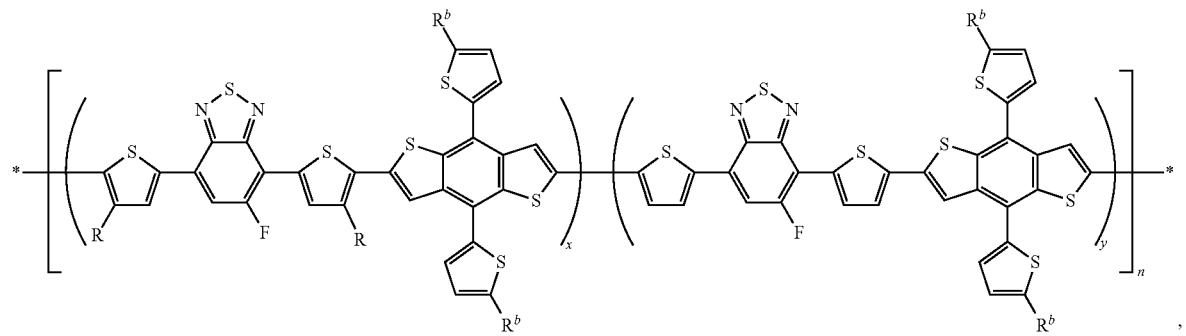
(37)
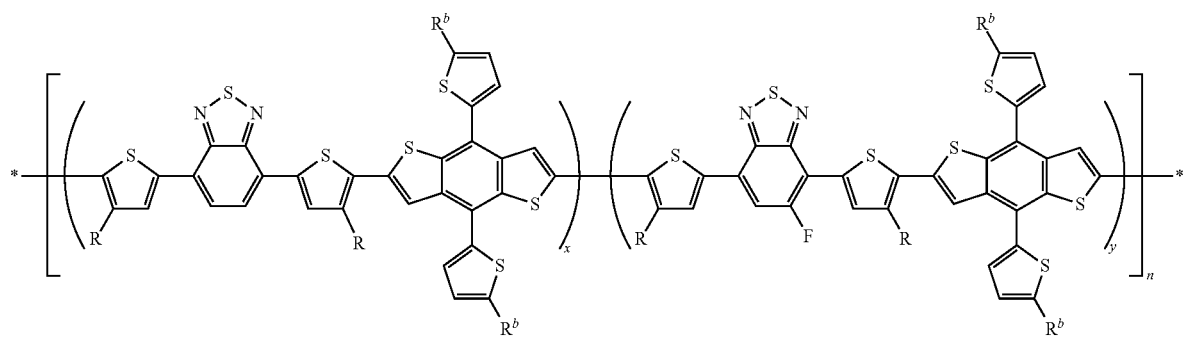
(38)
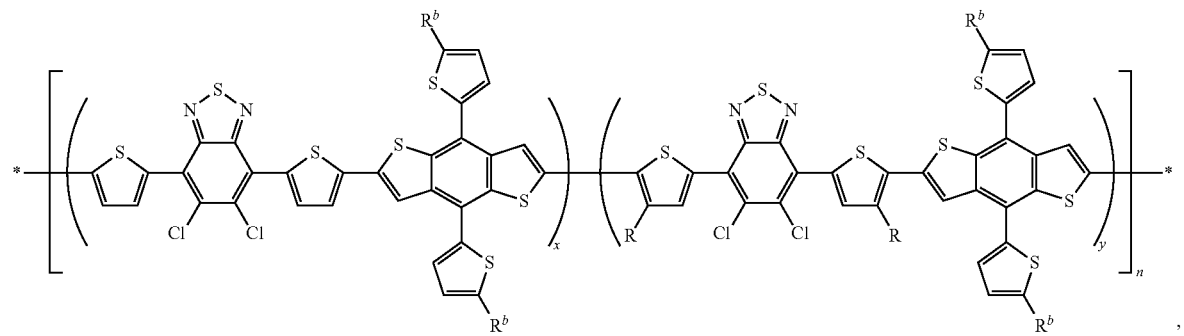
(39)
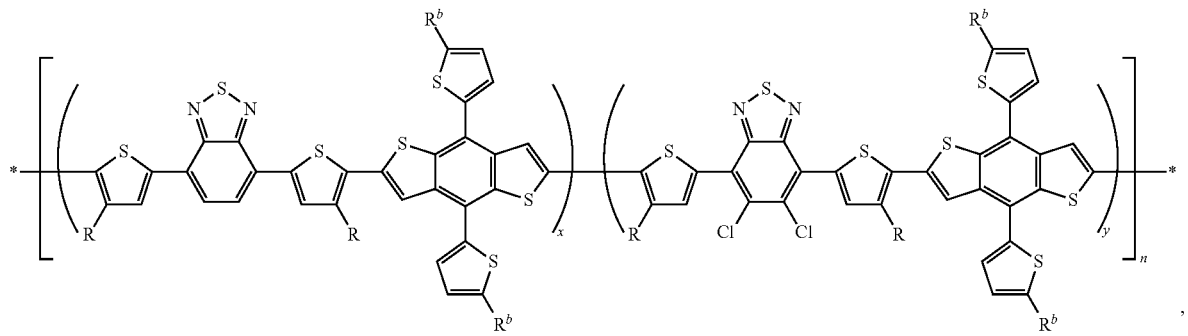
(40)

(41)

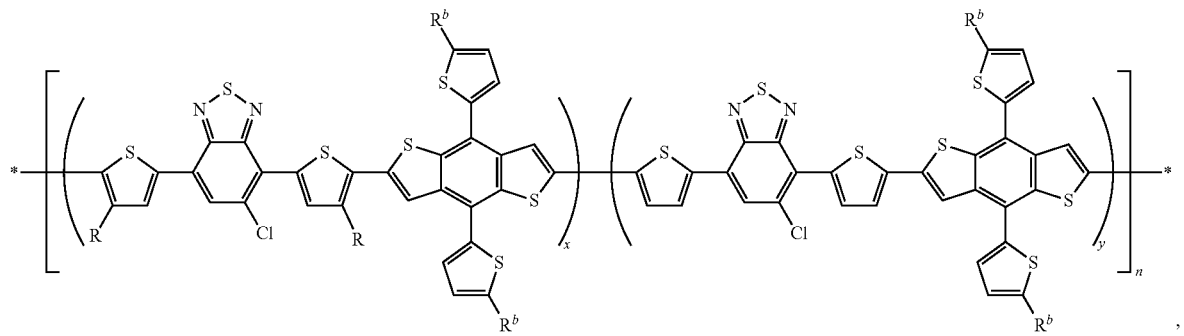

(42)

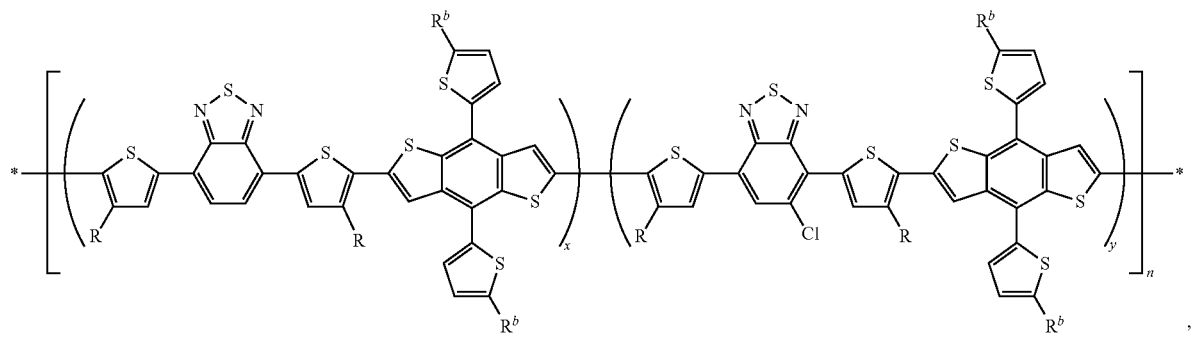

where $R^b$, at each occurrence, can be a linear or branched $C_{3-40}$ alkyl group; R, at each occurrence, can be a $C_{6-20}$ alkyl group; x and y independently are a real number, wherein $0.1 \le x \le 0.9$, $0.1 \le y \le 0.9$ ($0.2 \le x \le 0.8$, $0.2 \le y \le 0.8$), and the sum of x and y is about 1; and n can be an integer in the range of 5 to 5,000.

In certain preferred embodiments, the present polymer-polymer blend can include an electron acceptor polymer according to any of formula 5-8 and an electron donor polymer that is an alternating copolymer of a formula selected from the group consisting of:

(43)

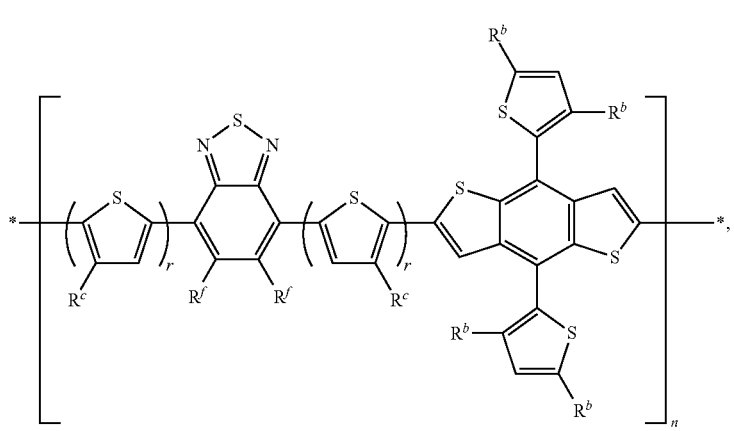

(44)
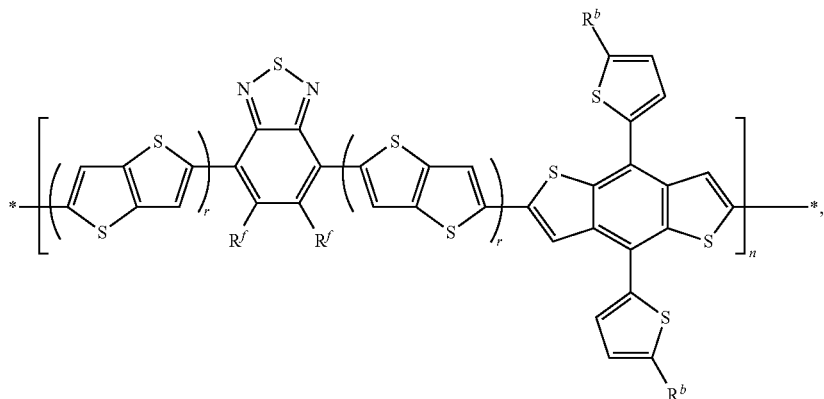
(45)
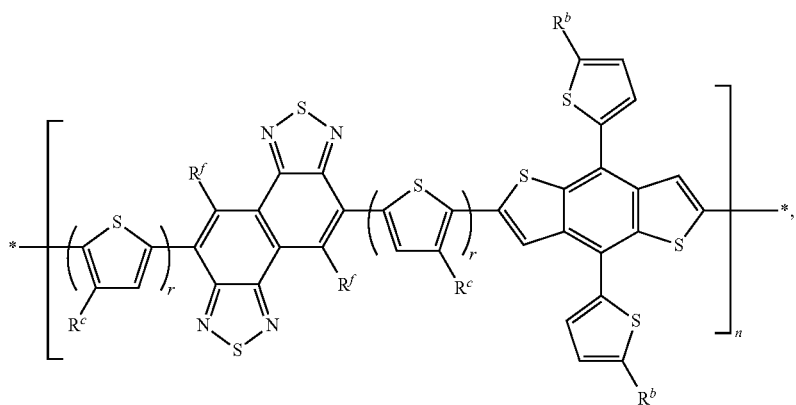
(46)
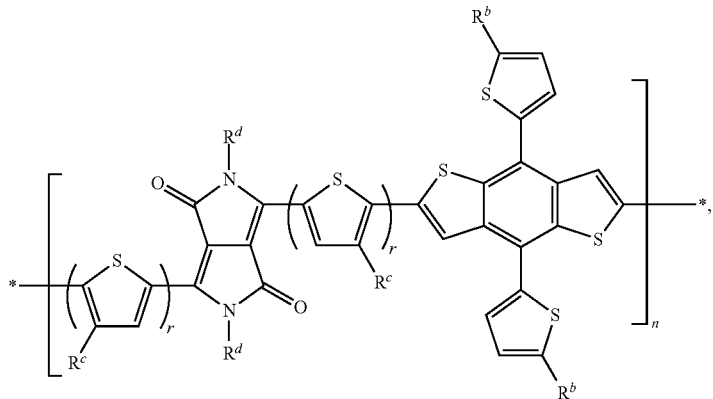
(47)
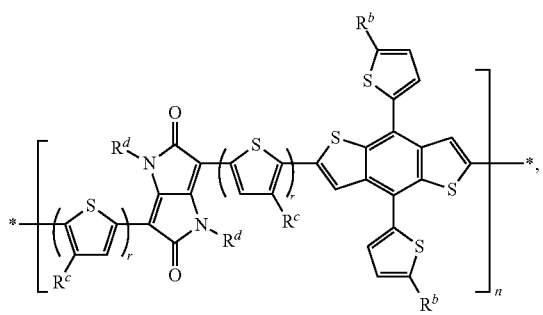
(48)
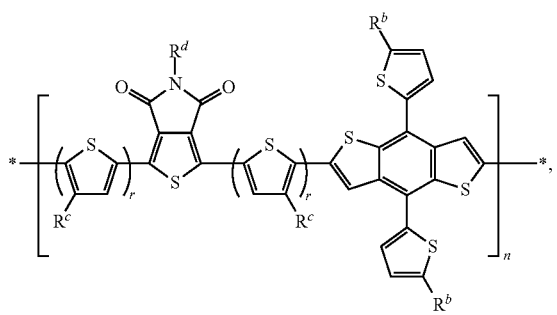

-continued
(49)
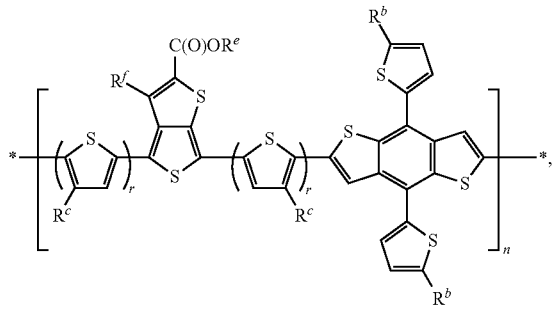
(50)
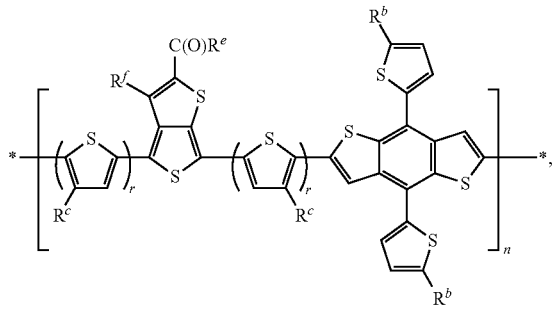
(51)
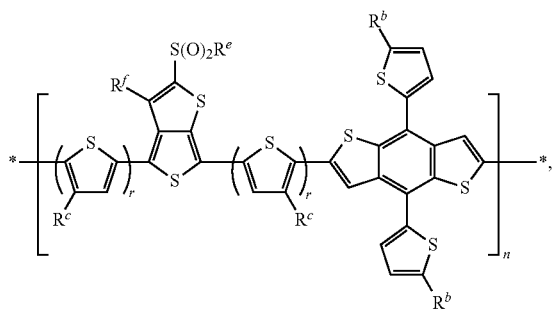
(52)
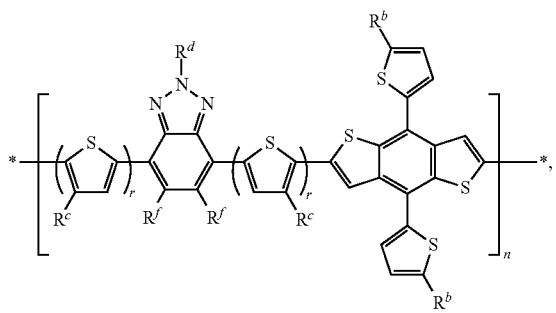
(53)
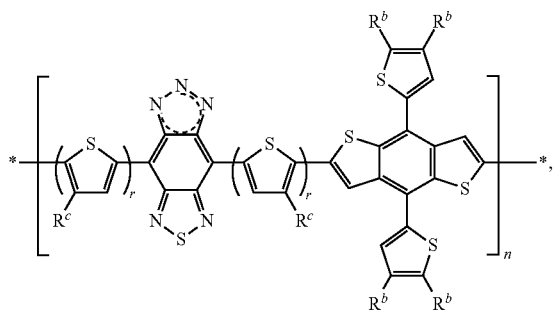
(54)
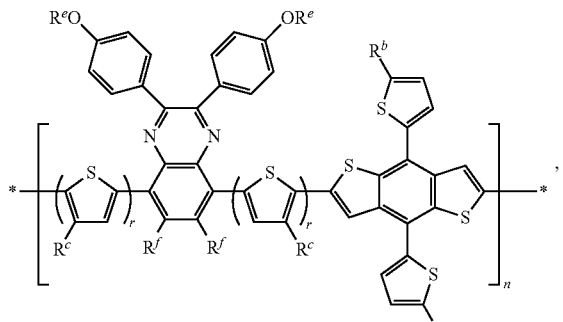
(55)
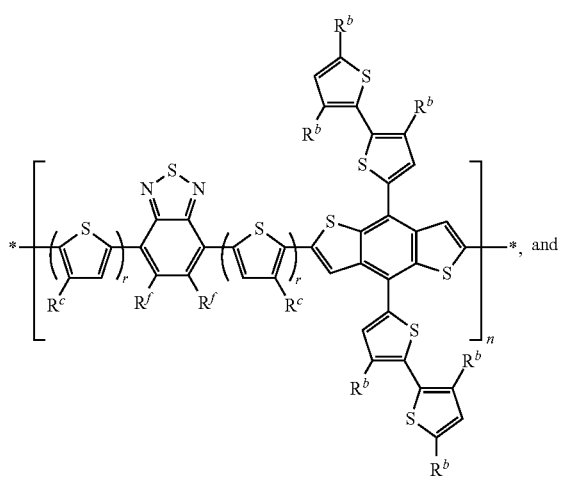, and
(56)
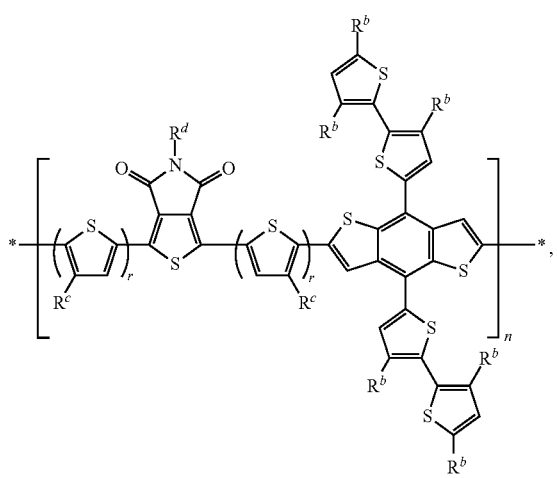

where $R^b$, $R^d$, $R^e$, at each occurrence, independently can be a linear or branched $C_{3-40}$ alkyl group; $R^c$, at each occurrence, can be H or a $C_{6-20}$ alkyl group; $R^f$, at each occurrence, independently can be selected from H, F, Cl, $C(O)R^e$, $C(O)OR^e$, and $S(O)_2R^e$; where $R^e$, at each occurrence, independently can be a linear or branched $C_{6-20}$ alkyl group; r can be 0 or 1; and n can be an integer in the range of 5 to 5,000. In certain embodiments, the electron donor polymer can be a random copolymer having two repeat units of any of formula 43-56. For example, the electron donor polymer can be a random copolymer having two repeat units of formula 43, where in one repeat unit, r is 1 and $R^c$ is H, and in the other repeat unit r is 1 and $R^c$ is a $C_{6-20}$ alkyl group.

Illustrative examples of embodiments where the electron donor polymer includes a naphthodithiophene moiety as the donor subunit can include:

(57)

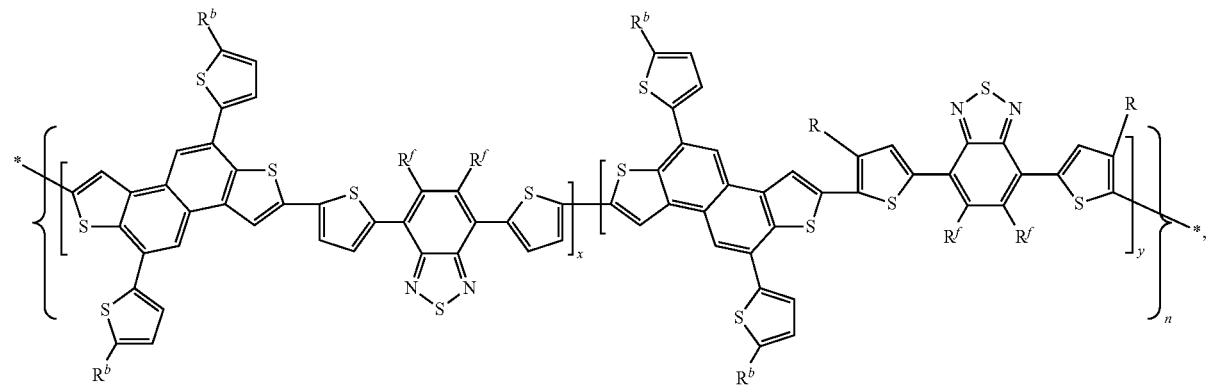

(58)

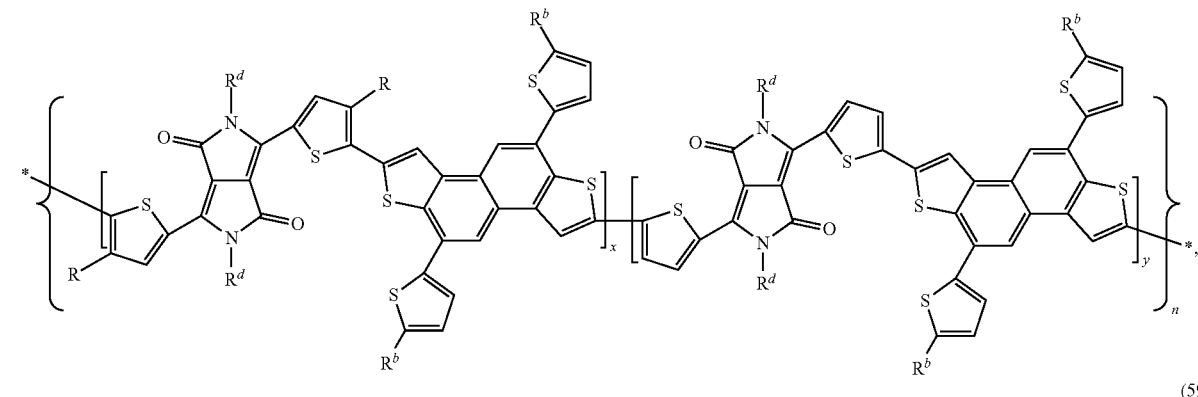

(59)

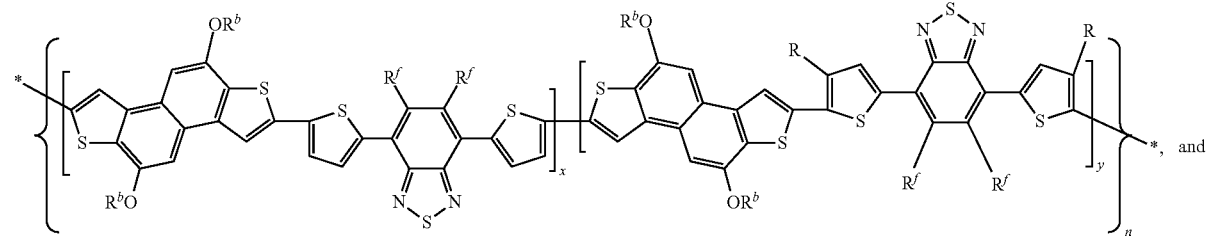

and (60)

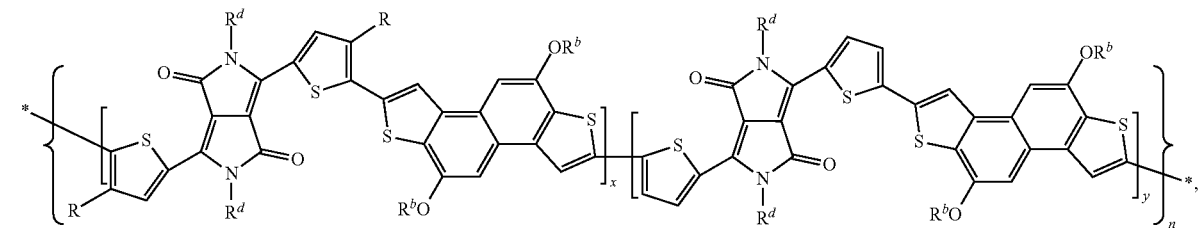

where $R^b$, $R^d$, $R^f$, R, x, y, and n are as defined herein.

Illustrative examples of embodiments where the electron donor polymer includes one or more chlorinated groups can include:
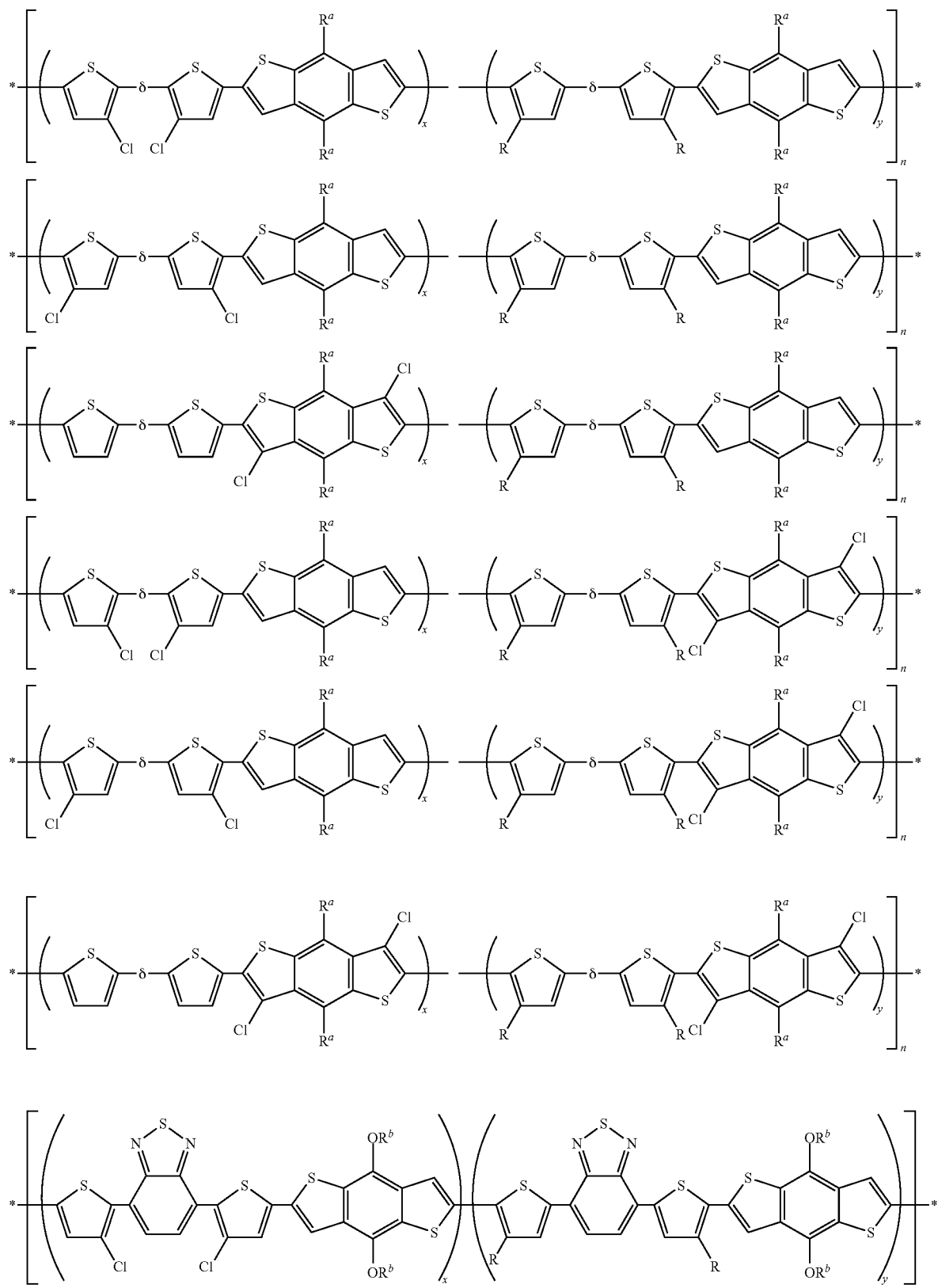

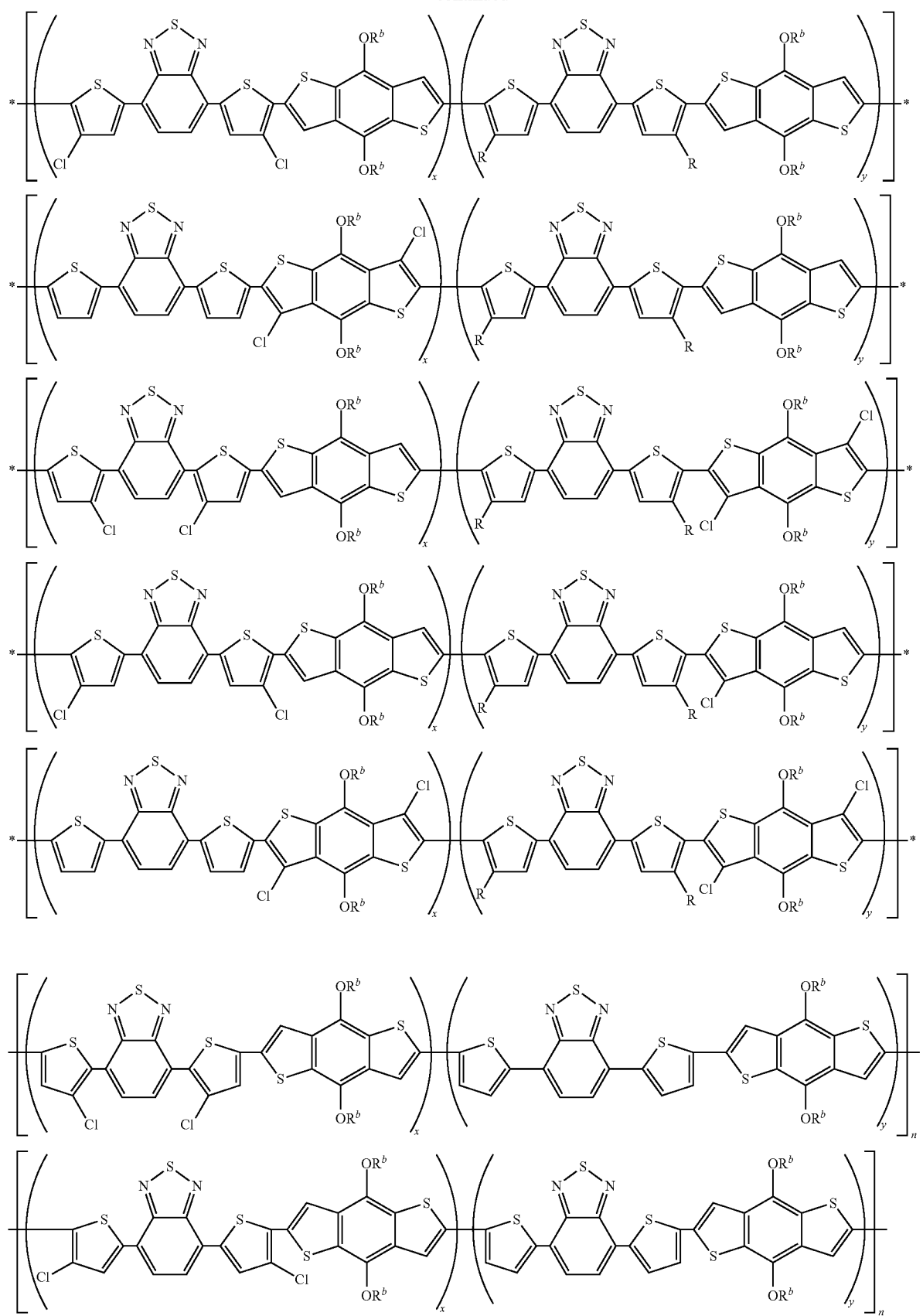

-continued

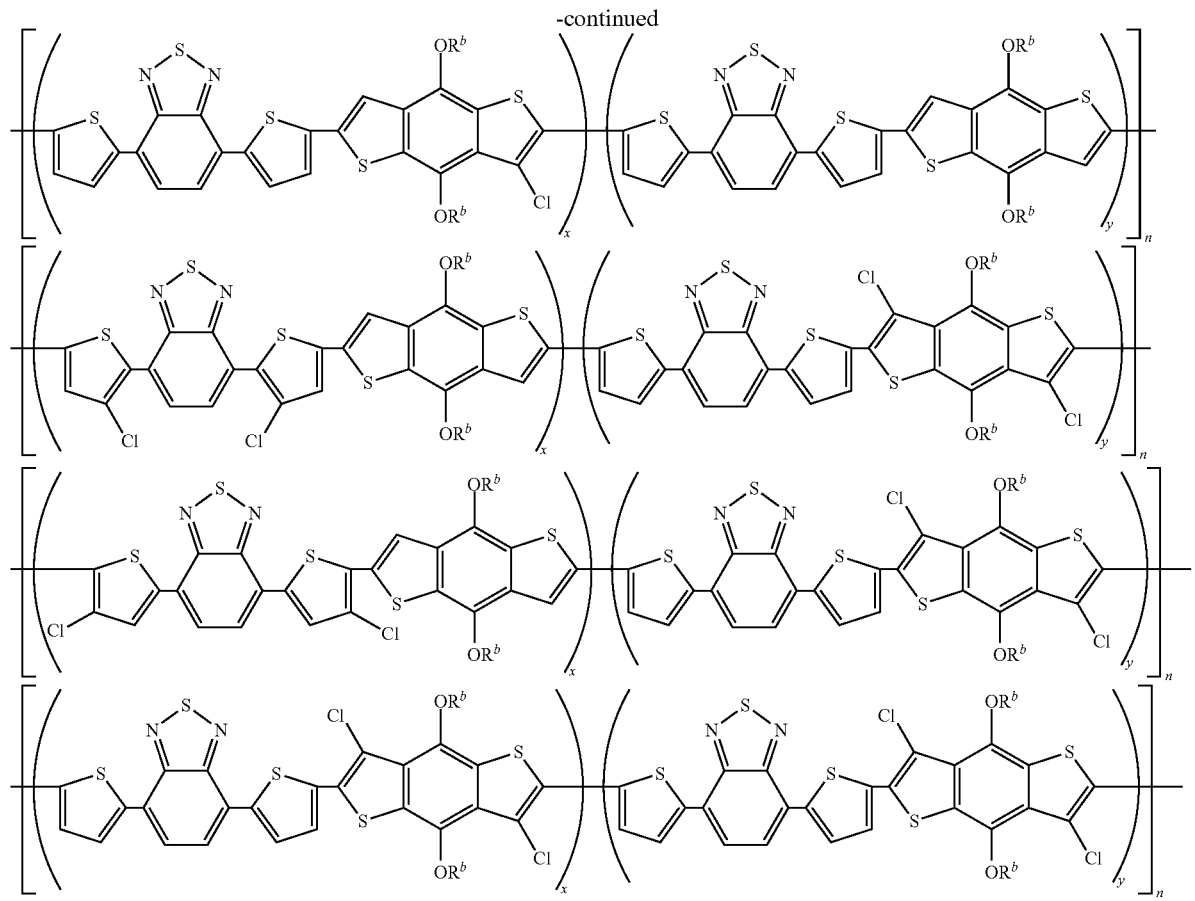

where $R^a$ can be —L'—Ar' or —L'—Ar'—Ar', where L' is selected from the group consisting of —O—, —S—, —C(O)O—, —OC(O)—, and a covalent bond; each Ar' can be a thienyl group or a thienyl-fused polycyclic group, each of which can be optionally substituted as described herein; $R^b$, at each occurrence, can be a linear or branched $C_{3-40}$ alkyl group; R, at each occurrence, can be a $C_{6-20}$ alkyl group; x and y independently are a real number, wherein $0.1 \leq x \leq 0.9$, $0.1 \leq y \leq 0.9$ ($0.2 \leq x \leq 0.8$, $0.2 \leq y \leq 0.8$), and the sum of x and y is about 1; and n can be an integer in the range of 5 to 5,000.

Electron-donor polymers and electron-acceptor polymers according to the present teachings and monomers leading to them can be prepared according to procedures analogous to those described in the Examples. In particular, Stille coupling or Suzuki coupling reactions can be used to prepare co-polymeric compounds according to the present teachings with high molecular weights and in high yields ($\geq 75\%$) and purity, as confirmed by $^1$H NMR spectra, elemental analysis, and/or GPC measurements. Alternatively, the present polymers can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field.

The electron-donor polymers and electron-acceptor polymers in the present polymer-polymer blends can be soluble in various common organic solvents. As used herein, a polymer can be considered soluble in a solvent when at least 0.1 mg of the polymer can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone. In preferred embodiments, the solvent can be selected from the group consisting of chlorobenzene, dichlorobenzene (o-dichlorobenzene, m-dichlorobenzene, p-dichlorobenzene, or mixtures thereof), trichlorobenzene, benzene, toluene, chloroform, dichloromethane, dichloroethane, xylenes, α,α,α-trichlorotoluene, methyl naphthalene (e.g., 1-methylnaphthalene, 2-methylnaphthalene, or mixtures thereof), chloronaphthalene (e.g., 1-chloronaphthalene, 2-chloronaphthalene, or mixtures thereof), and mixtures thereof.

The electron-donor polymers and electron-acceptor polymers described herein can be dissolved, dispersed or suspended in a single solvent or mixture of solvents to provide a blend composition suitable for solution processing techniques. Common solution processing techniques include, for example, spin coating, slot coating, doctor blading, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

An organic photoactive semiconductor component can be prepared as a blended film deposited from a solution or dispersion containing a polymer-polymer blend according to the present teachings. For example, an all-polymer blend according to the present teachings can be dissolved in chloroform, chlorobenzene, or a mixture thereof, where the electron-donor and electron-acceptor polymers together can be present in the solution from about 0.5 wt % to about 10 wt %, preferably, from about 0.8 wt % to about 5 wt %, and more preferably, from about 1 wt % to about 3 wt %. The weight ratio of the electron-donor polymers to the electron-acceptor polymers in the blend can be from about 20:1 to about 1:20, for example, from about 10:1 to about 1:10, preferably from about 5:1 to about 1:5, from about 3:1 to about 1:3, from about 2: to about 1:2, and more preferably about 1:1. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA). In some embodiments, the polymeric blend can be used together with additional components that are optically active, for example, components that can assist in light harvesting by capturing and transferring excitons to one or both of the electron-donor polymers/electron-acceptor polymers in the blend, and/or optically non-active components to modify and/or improve processing and/or device performance. Such optically non-active components can include alkanethiols (e.g., alkanedithiols) and other $\alpha,\omega$-functionalized alkanes (e.g., diiodoalkanes) as known in the art. See e.g., U.S. Pat. No. 8,227,691.

An organic semiconductor film can be prepared from a polymeric blend according to the present teachings in any form that provides for separation of electron-hole pairs. In some embodiments, the organic semiconductor film can be in a planar bilayer form. In other embodiments, the organic semiconductor film can be in a bilayer form with a diffuse interface. In preferred embodiments, the organic semiconductor film can be a single layer in a bulk heterojunction (BHJ) form. As used herein, a "film" means a continuous piece of a substance having a high length to thickness ratio and a high width to thickness ratio.

An organic semiconductor film prepared from an all-polymer blend according to the present teachings can be photoactive because the electron-donor polymers and/or the electron-acceptor polymers therein are capable of absorbing photons to generate excitons for the generation of a photocurrent. Accordingly, the present all-polymer blend can be used to prepare a photoactive component in an optoelectronic device, where the photoactive component or layer can be fabricated by first preparing a blend composition (e.g., a solution or dispersion) that includes an electron-donor polymer and an electron-acceptor polymer disclosed herein dissolved or dispersed in a liquid medium such as a solvent or a mixture of solvents, depositing the blend composition on a substrate (e.g., an electrode-substrate) preferably via a solution-phase process, and removing the solvent or mixture of solvents to provide the photoactive layer. By having the blend composition provided as an intimate mixture of the electron-donor polymers and the electron-acceptor polymers, bulk heterojunctions can be created upon removal of the solvent (optionally under reduced pressure and/or elevated temperature), during which nanoscale phase separation of the electron-donor polymers and the electron-acceptor polymers takes place. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, slot-die coating, drop-casting, zone casting, dip coating, blade coating, or spraying. When the film is formed by spin coating, the spin speed can range from about 300 rpm to about 6000 rpm, or from about 500 rpm to about 2000 rpm. Subsequent processing steps can include thermal annealing or irradiation of the deposited film. For example, the blended film can be annealed from about 50° C. to about 300° C., preferably from about 70° C. to about 200° C., more preferably from about 90° C. to about 180° C. for about 1 min to about 20 minutes. The annealing step can be carried out under an inert atmosphere (e.g., under nitrogen). Irradiation of the deposited film can be carried out using infrared light or ultraviolet light. As used herein, "annealing" refers to a post-deposition heat treatment to the semicrystalline polymer film in ambient or under reduced/increased pressure for a time duration of more than 60 seconds, and "annealing temperature" refers to the maximum temperature that the polymer film is exposed to for at least 30 seconds during this process of annealing. Without wishing to be bound by any particular theory, it is believed that annealing can result in improved PCEs of the all-polymer blend. Furthermore, an advantage of the present all-polymer blend can include improved stability during the annealing step compared to known polymer: fullerene blends. The photoactive layer typically can have a thickness ranging from about 30 nm to about 500 nm. In preferred embodiments, the photoactive layer can be a thin film having a thickness of about 80-300 nm.

Optoelectronic devices that can incorporate a photoactive layer prepared from an all-polymer blend according to the present teachings include, but are not limited to, photovoltaic/solar cells, photodetectors (or photodiodes), light-emitting diodes, and light-emitting transistors. The present polymeric blends can offer processing and operation advantages in the fabrication and/or the use of these devices.

For example, articles of manufacture such as the various devices described herein can be an optoelectronic device including a first electrode, a second electrode, and a photoactive component disposed between the first electrode and the second electrode, where the photoactive component includes a polymeric blend of the present teachings.

In various embodiments, the optoelectronic device can be configured as a solar cell, in particular, a bulk-heterojunction solar cell. FIG. 1 illustrates a representative structure of a bulk-heterojunction organic solar cell which can incorporate a polymeric blend according to the present teachings. As shown, a representative solar cell generally includes a substrate 20, an anode 22, a cathode 26, and a photoactive layer 24 between the anode and the cathode. In some embodiments, one or more optional interlayers can be present between the anode and the photoactive layer and/or between the cathode and the photoactive layer.

The substrate can be a solid, rigid or flexible layer designed to provide robustness to the device. In preferred embodiments, the substrate can be transparent or semi-transparent in the spectral region of interest. As used herein, a material is considered "transparent" when it has transmittance over 50%, and a material is considered "semi-transparent" when it has transmittance between about 50% and about 5%. The substrate can comprise any suitable material known in the art such as glass or a flexible plastic (polymer) film.

The first and second electrodes should have different work functions, with the electrode having the higher work function at or above about 4.5 eV (the "high work function electrode") serving as the hole-injecting electrode or anode, and the electrode having the lower work function at or below about 4.3 eV (the "low work function electrode") serving as the electron-injecting electrode. In a traditional OPV device structure, the high work function electrode or anode typically is composed of a transparent conducting metal oxide or metal sulfide such as indium tin oxide (ITO), gallium indium tin oxide (GITO), and zinc indium tin oxide (ZITO), or a thin, transparent layer of gold or silver. The low work function electrode or cathode typically is composed of a low work function metal such as aluminum, indium, calcium, barium, and magnesium. The electrodes can be deposited by thermal vapor deposition, electron beam evaporation, RF or Magnetron sputtering, chemical vapor deposition or the like.

In various embodiments, the solar cell can include one or more optional interface layers ("interlayers") between the anode and the photoactive layer and/or between the cathode and the photoactive layer. For example, in some embodiments, an optional smoothing layer (e.g., a film of 3,4-polyethylenedioxythiophene (PEDOT), or 3,4-polyethylenedioxythiophene:polystyrene-sulfonate (PEDOT:PSS)) can be present between the anode and the photoactive layer. The optional interlayer(s) can perform other functions such as reducing the energy barrier between the photoactive layer and the electrode, forming selective contacts for a single type of carrier (e.g., a hole-blocking layer), modifying the work function of the adjacent electrode, and/or protecting the underlying photoactive layer. In some embodiments, a transition metal oxide layer such as $V_2O_5$, $MoO_3$, $WO_3$ and NiO can be deposited on top of the ITO anode, instead of using PEDOT or PEDOT:PSS as the p-type buffer. To improve device stability via modification of the cathode, an n-type buffer composed of LiF, CsF or similar fluorides can be provided between the cathode and the photoactive layer. Other n-type buffer materials include $TiO_x$, $ZnO_x$ and Cs-doped $TiO_x$. Depending on the composition, the interlayers can be solution-processed (e.g., sol-gel deposition, self-assembled monolayers) or deposited by vacuum processes such as thermal evaporation or sputtering.

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer is composed of an all-polymer blend as described above, and can have a layer thickness of, e.g., about 80 nm to a few μm. Before a counter electrode (cathode) is applied, an electrically insulating transition layer can be applied onto the photoactive layer. This transition layer can be made of an alkali halide, e.g., LiF, and can be vapor-deposited in vacuum. Again, similar to the anode, other similar interlayers can be optionally present between the photoactive layer and the cathode for improving mechanical, chemical, and/or electronic properties of the device.

In certain embodiments, a solar cell according to the present teachings can have an inverted device structure, where a modified ITO film is used as the cathode. For example, the ITO can be modified by n-type metal oxides or metal carbonates such as $TiO_x$, $ZnO_x$, Cs-doped $TiO_x$, and caesium carbonate. In particular embodiments, the inverted OPV can include a solution-processed $ZnO_x$ n-type interface layer as described in Lloyd et al., "Influence of the hole-transport layer on the initial behavior and lifetime of inverted organic photovoltaics," *Solar Energy Materials and Solar Cells*, 95(5): 1382-1388 (2011). Compared with the traditional device structure, inverted-type devices can demonstrate better long-term ambient stability by avoiding the need for the corrosive and hygroscopic hole-transporting PEDOT:PSS and low work function metal cathode. The anode of an inverted OPV cell can be composed of Ag, Au, and the like, with an optional p-type interface layer composed of transition metal oxides such as $V_2O_5$, $MoO_3$, $WO_3$ and NiO.

EXAMPLES

The following examples are provided to illustrate further and to facilitate the understanding of the present teachings and are not in any way intended to limit the invention.

All reagents were purchased from commercial sources and used without further purification unless otherwise noted. Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest Microlab, LLC.

Preparation of Electron-Acceptor Polymers

Example 1

Preparation of poly{[N,N-bis(2-ethylhexyl)-1,4,5,8-naphthalenediimide-2,6-diyl]-alt-5,5'-(2,2'-bithiophene)} [P(NDI2EH-T2)]

Preparation of 2,6-dibromonaphthalene-1,4,5,8-tetracarboxydianhydride (NDA-Br$_2$): A mixture of 1,4,5,8-naphthalenetetracarboxylic dianhydride (2.8 g, 10.3 mmol) and oleum (20% SO$_3$, 100 mL) was stirred at 55° C. for 2 hours. To this mixture, a solution of dibromoisocyanuric acid (3.0 g, 10.5 mmol) in oleum (50 mL) was added over 40 minutes. The resulting mixture was then warmed to 85° C. and maintained at this temperature for 43 hours. After cooling to room temperature, the reaction mixture was poured onto crushed ice (420 g), diluted with water (400 mL), and then stirred at room temperature for 1 hour. The resulting precipitates were collected by centrifugation, washed with water and methanol, collected by centrifugation and finally dried under vacuum, leading to a greenish yellow solid (3.6 g, 8.5 mmol, yield 82.2%). Elemental Analysis (calc. C, 39.47; H, 0.47; N, 0.00): found C, 38.20; H, 0.79; N, 0.00.

Preparation of N,N'-bis(2-ethylhexyl)-2,6-dibromonaphthalene-1,4,5,8-bis(dicarboximide) (NDI2EH-Br$_2$): A mixture of NDA-Br$_2$ (above, 1.6 g, 3.9 mmol), 2-ethylhexylamine (1.4 mL, 8.5 mmol), o-xylene (6 mL), and propionic acid (2 mL) was stirred at 140° C. for 1 hour. After cooling to room temperature, methanol (10 mL) was added to the reaction mixture and the resulting precipitate was collected by filtration, washed with methanol, and dried in vacuum leading to the crude product as a red solid (0.81 g). Further purification was carried out by column chromatography on silica gel using a mixture of chloroform:hexane (5:1, v/v) as eluent, affording a slightly yellow solid as the product (0.61 g, 0.94 mmol, yield 24.4%). $^1$H NMR (CDCl$_3$, 500 MHz): δ 9.01 (s, 2H), 4.10-4.25 (m, 4H), 19.4-1.97 (m, 2H), 1.20-1.40 (m, 16H), 0.87-1.03 (m, 12H). $^{13}$C NMR (CDCl$_3$, 125 MHz): δ 161.4, 161.2, 139.4, 128.6, 127.9, 125.5, 124.3, 45.3, 38.0, 30.8, 28.7, 24.2, 23.3, 14.3, 10.8.

Preparation of P(NDI2EH-T2): Under argon, a mixture of NDI2EH-Br$_2$ (above, 98 mg, 0.15 mmol), 5,5'-bis(trimethylstannyl)-2,2'-bithiophene (74 mg, 0.15 mmol), and Pd(PPh$_3$)$_2$Cl$_2$ (3.5 mg, 0.005 mmol) in anhydrous toluene (5 mL) was stirred at 90° C. for 4 days. Bromobenzene (0.3 mL) was then added to the reaction and the resulting mixture was stirred for an additional 12 hours. After cooling to room temperature, a solution of potassium fluoride (1.2 g) in water (2.5 mL) was added. This mixture was stirred at room temperature for 2 hours and the precipitate was collected by filtration. The solid was taken with a small amount of chloroform, methanol was added, and the solid collected by filtration. This procedure was repeated using chloroform and acetone, leading to a deep blue solid as the crude product. This crude product was purified by Soxhlet extraction with acetone for 24 hours (80 mg, yield 80.7%). $^1$H NMR (CDCl$_3$, 500 MHz): δ 8.82 (br, 2H), 7.35 (br, 4H), 4.15 (br, 4H), 1.97 (br, 2H), 1.18-1.70 (m, br, 16H). 0.80-1.12 (m, br, 12H). Elemental Analysis (calc. C, 69.91; H, 6.18; N, 4.29): found C, 69.63; H, 5.66; N, 3.71.

Example 2

Preparation of poly {[N,N'-bis(2-ethylhexyl)-1,4,5,8-naphthalenediimide-2,6-diyl]-alt-2,5-thiophene} [P(NDI2EH-T1)]

Preparation of P(NDI2EH-T1): Under argon, a mixture of NDI2EH-Br$_2$ (Example 1, 84 mg, 0.13 mmol), 2,5-bis(trimethylstannyl)thiophene (53 mg, 0.13 mmol), and Pd(PPh$_3$)$_2$Cl$_2$ (3.0 mg, 0.004 mmol) in anhydrous toluene (5 mL) was stirred at 90° C. for 4 days. Bromobenzene (0.3 mL) was then added and the resulting mixture was stirred at 90° C. for an additional 12 hours. Upon cooling to room temperature, a solution of potassium fluoride (1.2 g) in water (2.5 mL) was added. This mixture was stirred at room temperature for 2 hours and the precipitate collected by filtration. The solid was taken with a small amount of chloroform, methanol was added, and the resulting solid collected by filtration. This procedure was repeated using chloroform and acetone, leading to a deep blue solid as the crude product (20.0 mg, yield 20.7%). Elemental Analysis (calc. C, 71.55; H, 6.71; N, 4.91): found C, 71.59; H, 6.00; N, 4.56.

Example 3

Preparation of Poly {[N,N'-bis(2-octyldodecyl)-1,4,5,8-naphthalenediimide-2,6-diyl]-alt-5,5'-(2,2'-bithiophene)} [P(NDI2OD-T2)]

Preparation of 1-iodo-2-octyldodecane: Iodine (12.25 g, 48.3 mmol) was added to a solution of 2-octyl-1-dodecanol (12.42 g, 41.6 mmol), triphenylphosphine (13.17 g, 50.2 mmol), and imidazole (3.42 g, 50.2 mmol) in 80 mL dichloromethane at 0° C. After stirring for 30 minutes, the reaction mixture was allowed to warm to room temperature over 4 hours before 12 mL of saturated Na$_2$SO$_3$ (aq) was added. The organics were concentrated by evaporation and the mixture taken up in 500 mL pentane, washed three times with 200 mL water, and once with 150 mL brine. The mixture was then passed through a 3 cm silica gel plug, and dried over Na$_2$SO$_4$. The organics were concentrated by evaporation to give a colorless oil (15.78 g, yield 92.9%). $^1$H NMR (CDCl$_3$ 500 MHz): δ: 2.60 (d, J=5.0 Hz, 2H), 2.00 (t, J=5.0 Hz, 1H), 1.30-1.20 (b, 32H), 0.89 (t, J=7.5 Hz, 6H); MS (EI): m/z (%) 408.23 (100) [M$^+$]. Elemental Analysis (calc. C, 58.81; H, 10.12): found C, 58.70; H, 9.97.

Preparation of 2-octyldodecylamine: 1-Iodo-2-octyldodecane (5.90 g, 14.5 mmol) and potassium phthalimide (2.94 g, 15.9 mmol) were dissolved in 25 mL of DMF and vigorously stirred for 72 h at 25° C. The reaction mixture was poured into 200 mL of pentane, and washed four times with 100 mL water. The mixture was then passed through a 3 cm silica gel plug, and concentrated to give a colorless oil. The oil was next dissolved in 150 mL of ethanol, and 4 mL of hydrazine hydrate were added, leading to a mixture which was heated to reflux overnight. The resulting precipitates were collected by filtration, dissolved in 100 mL water, and the solution was made alkaline by addition of 6 M NaOH (aq). The resulting mixture was dissolved in 200 mL pentane, washed four times with 100 mL of water, once with 70 mL of brine, dried over MgSO$_4$, and concentrated to give a colorless oil (3.08 g, 72% yield). $^1$H NMR (CDCl$_3$ 500 MHz): δ: 2.60 (d, J=5.0 Hz, 2H), 2.00 (t, J=5.0 Hz, 1H), 1.30-1.20 (b, 32H), 0.89 (t, J=7.5 Hz, 6H); MS (EI): m/z (%) 297.34 (100) [M$^+$]. Elemental Analysis (calc. C, 80.73; H, 14.57): found C, 80.78; H, 14.52.

Preparation of N,N'-bis(2-octyldodecyl)-2,6-dibromonaphthalene-1,4,5,8-bis(dicarboximide) (NDI2OD-Br$_2$): A mixture of NDA-Br$_2$ (Example 1, 2.34 g, 5.49 mmol), 2-octyldodecylamine (4.10 g, 13.78 mmol), o-xylene (18 mL), and propionic acid (6 mL) was stirred at 140° C. for 1 hour. Upon cooling to room temperature, most of the solvent was removed in vacuo, and the residue was purified by a column chromatography on silica gel with a mixture of chloroform:hexane (1:1, v/v) as the eluent, affording a slightly yellow solid as the product (1.98 g, 2.01 mmol, yield 36.7%). $^1$H NMR (CDCl$_3$ 500 MHz): δ: 8.95 (s, 2H), 4.12 (d, J=7.5 Hz, 4H), 1.97 (m, 2H), 1.20-1.40 (m, 64H), 0.84-0.89 (m, 12H). $^{13}$C NMR (CDCl$_3$, 125 MHz): δ: 161.3, 161.1, 139.3, 128.5, 127.8, 125.4, 124.2, 45.6, 36.6, 32.1, 32.0, 31.7, 30.2, 29.9, 29.8, 29.7, 29.6, 29.5, 26.5, 22.9, 22.8, 14.3. Elemental Analysis (calc. C, 65.84; H, 8.60; N, 2.84): found C, 65.68; H, 8.60; N, 2.89.

Preparation of P(NDI2OD-T2): Under argon, a mixture of NDI-2OD-Br$_2$ (95 mg, 0.096 mmol), 5,5'-bis(trimethylstannyl)-2,2'-bithiophene (48 mg, 0.096 mmol), and Pd(PPh$_3$)$_2$Cl$_2$ (3.5 mg, 0.005 mmol) in anhydrous toluene (5 mL) was stirred at 90° C. for 4 days. Bromobenzene (0.2 mL) was then added and the reaction mixture was maintained at 90° C. for an additional 12 hours. Upon cooling to room temperature, a solution of potassium fluoride (1 g) in water (2 mL) was added. This mixture was stirred at room temperature for 2 hours before it was extracted with chloroform (60 mL×2). Organic layers were combined, washed with water (50 mL×2), dried over anhydrous sodium sulfate, and concentrated on a rotary evaporator. The residue was taken with a small amount of chloroform and precipitated in methanol and acetone in sequence. The obtained blue solid product was purified by Soxhlet extraction with acetone for 48 hours. The remaining solid residue was redissolved in chloroform (50 mL) and the resulting mixture was heated to boil. Upon cooling to room temperature, the chloroform solution was filtered through a 5 μm filter, and the filtrate was added slowly to methanol (50 mL). The precipitates were collected by filtration, washed with methanol, and dried in vacuum, leading to a deep blue solid as the product (88.0 mg, yield 92.1%). $^1$H NMR (CDCl$_3$ 500 MHz): δ: 8.53-8.84 (m, br, 2H), 7.20-

7.48 (br, 4H), 4.13 (s, br, 2H), 2.00 (s, br, 4H), 1.05-1.30 (s, br, 64H), 0.87 (s, br, 12H). GPC: $M_n$=47.8 K Da, $M_w$=264.4 K Da, PDI=5.53. Elemental Analysis (calc. C, 75.26; H, 8.96; N, 2.83, Br, 0.00): found C, 75.22; H, 9.01; N, 2.77, Br, 0.00.

Example 4

Preparation of Poly {[N,N'-bis(1-methylhexyl)-1,4,5, 8-naphthalenediimide-2,6-diyl]-alt-5,5'-(2,2'-bithiophene)} [P(NDI1MH-T2)]

Preparation of N,N'-bis(1-methylhexyl)-2,6-dibromonaphthalene-1,4,5,8-bis(dicarboximide) (NDI1MH-Br$_2$): A mixture of NDA-Br$_2$ (Example 1, 2.42 g, 5.68 mmol), 1-methylhexylamine (2.5 mL, 16.55 mmol), propionic acid (12 mL), and o-xylene (36 mL) was stirred under argon at 140° C. for 17 hours. Upon cooling to room temperature, solvents were removed in vacuo and the residue was subject to a column chromatography on silica gel using a mixture of CHCl$_3$:hexane (1:1, v/v) as the eluent, leading to slightly yellow solid as the product (0.24 g, 0.39 mmol, yield 6.9%). $^1$H NMR (CDCl$_3$, 500 MHz): δ 8.96 (s, 2H), 5.24 (m, 2H), 2.13 (m, 2H), 1.94 (m, 2H), 1.56 (d, J=7.0 Hz, 6H), 1.10-1.40 (m, 12H), 0.81-0.86 (t, J=7.0 Hz, 6H). $^{13}$C NMR (CDCl$_3$, 125 MHz): δ: 161.3, 161.3, 139.3, 128.3, 127.8, 125.7, 124.5, 51.5, 33.5, 31.8, 26.9, 22.7, 18.3, 14.2.

Preparation of P(NDI1MH-T2): Under argon, a mixture of NDI1MH-Br$_2$ (above, 151 mg, 0.24 mmol), 5,5'-bis(trimethylstannyl)-2,2'-bithiophene (120 mg, 0.24 mmol), and Pd(PPh$_3$)$_2$Cl$_2$ (6.5 mg, 0.009 mmol) in anhydrous toluene (12 mL) was stirred at 90° C. for 24 hours. Bromobenzene (0.2 mL) was then added and the reaction mixture was maintained at 90° C. for an additional 12 hours. Upon cooling to room temperature, the reaction mixture was added slowly to methanol (50 mL) and the resulting mixture was stirred at room temperature for 10 minutes. The precipitates were collected by filtration and washed with methanol. The isolated solid was then taken with chloroform (30 mL) and sonicated for 5 minutes. A solution of potassium fluoride (4 g) in water (8 mL) was added, and this mixture was vigorously stirred at room temperature for 1 hour. The mixture was then diluted with chloroform (100 mL), and washed with water (100 mL×2). The organic layer was concentrated on rotary evaporator. The residue was taken with chloroform (30 mL), followed by sonication for 5 minutes. This mixture was precipitated in methanol (150 mL), leading to deep blue precipitates, which were collected by filtration, washed with methanol, and dried in a vacuum (143 mg, yield 94%). Further purification involved Soxhlet extraction with acetone and then another precipitation in methanol. $^1$H NMR (CDCl$_3$, 500 MHz): δ 8.70-8.82 (br, 2H), 7.05-7.73 (m, br, 3H), 6.64 (br, 1H), 5.15-5.50 (m, br, 2H), 0.71-2.43 (m, br, 28H).

Example 5

Preparation of poly{[N,N'-bis(2-octyldodecyl)-1,4,5, 8-naphthalenediimide-2,6-diyl]-alt-5,5'''-(quarter-thiophene)} [P(NDI2OD-T4)]

Preparation of N,N'-bis(2-octyldodecyl)-2,6-bis(2-thienyl)naphthalene-1,4,5,8-bis(dicarboximide) (NDI2OD-T1): Under argon, a mixture of NDI2OD-Br$_2$ (Example 1, 280.0 mg, 0.28 mmol), 2-trimethylstannylthiophene (400.0 mg, 1.62 mmol), Pd(PPh$_3$)$_2$Cl$_2$ (28.0 mg, 0.04 mmol) in anhydrous toluene (20 mL) was stirred at 90° C. for 22 hours. Upon cooling to room temperature, the reaction mixture was diluted with chloroform (100 mL), and the resulting mixture was washed with water (80 mL×2), dried over anhydrous sodium sulfate (Na$_2$SO$_4$), and concentrated on rotary evaporator. The residue was subject to column chromatography on silica gel with a mixture of chloroform:hexane (3:2, v/v) as eluent, leading to an orange solid as the product (240.0 mg, 0.24 mmol, 85.2%). $^1$H NMR (CDCl$_3$, 500 MHz): δ: 8.77 (s, 2H), 7.57 (d, J=5.0 Hz, 2H), 7.31 (d, J=3.5 Hz, 2H), 7.21 (m, 2H), 4.07 (d, J=7.5 Hz, 4H), 1.95 (m, 2H), 1.18-40 (m, br, 64H), 0.84-0.88 (m, 12H); $^{13}$C NMR (CDCl$_3$, 125 MHz): δ: 162.8, 162.6, 141.1, 140.4, 136.8, 128.4, 128.2, 127.7, 127.6, 125.6, 123.6, 45.0, 36.6, 32.1, 31.7. 30.3, 29.9, 29.8, 29.7, 29.6, 29.5, 26.6, 22.9, 14.4, 14.3.

Preparation of N,N'-bis(2-octyldodecyl)-2,6-bis(5-bromo-2-thienyl)naphthalene-1,4,5,8-bis(dicarboximide) (NDI2OD-BrT1): Under argon, a mixture of NDI2OD-T1 (200.0 mg, 0.20 mmol) and NBS (125.0 mg, 0.70 mmol) in DMF (20 mL) was stirred at 80° C. for 25 hours. Upon cooling to room temperature, the reaction mixture was poured into water (100 mL), and the resulting mixture was extracted with chloroform (100 mL). The organic layer was separated, washed with water (100 mL×2), dried over anhydrous Na$_2$SO$_4$, and concentrated on rotary evaporator. The residue was subject to column chromatography on silica gel with a mixture of chloroform:hexane (2:3, v/v, slowly up to 1:1) as eluent, leading to a red solid as the product (145.0 mg, 0.13 mmol, 62.5%). $^1$H NMR (CDCl$_3$, 500 MHz): δ: 8.73 (s, 2H), 7.15 (d, J=4.0 Hz, 2H), 7.09 (d, J=4.0, 2H), 4.08 (d, J=7.5 Hz, 4H), 1.93-1.98 (m, 2H), 1.20-1.40 (br, m, 64H), 0.83-0.89 (m, 12H). Elemental Analysis (calc. C, 64.79; H, 7.72; N, 2.44): found C, 64.50; H, 7.74; N, 2.49.

Preparation of P(NDI2OD-T4): Under argon, a mixture of NDI2OD-BrT1 (92.1 mg, 0.08 mmol), 5,5'-bis(trimethylstannyl)-2,2'-bithiophene (39.4 mg, 0.08 mmol), and Pd(PPh$_3$)$_2$Cl$_2$ (2.8 mg, 0.004 mmol) in anhydrous toluene (5 mL) was stirred at 90° C. for 4 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous Na$_2$SO$_4$, and concentrated on rotary evaporator. The residue was taken with chloroform (30 mL) and precipitated in methanol (50 mL). This procedure was repeated using chloroform and acetone, leading to a dark blue solid as crude product. This crude product was purified by Soxhlet extraction with acetone for 48 hours. The isolated solid was dissolved in chloroform (50 mL) and then heated to boil. After cooling to room temperature, the chloroform solution was passed through a syringe filter (5 μm), and the filtrate was precipitated in methanol (50 mL). The precipitates were collected by filtration, washed with methanol, and dried in vacuum, leading to a dark blue solid (87.0 mg, 94.1%). $^1$H NMR (CDCl$_2$CDCl$_2$, 500 MHz): δ: 8.70-8.81 (m, br, 2H), 7.10-7.40 (m, br, 8H), 4.10 (br, 4H), 1.99 (s, br, 2H), 1.10-1.45 (m, br, 64H), 0.86 (m, br, 12H). GPC: $M_n$=67.4 K Da, $M_w$=170.3 K Da, PDI=2.5. Elemental Analysis (calc. C, 72.87; H, 8.04; N, 2.43): found C, 72.69; H, 8.06; N, 2.47.

Example 6

Preparation of Poly{[N,N'-bis(2-octyldodecyl)-1,4,5, 8-naphthalenediimide-2,6-diyl]-alt-5,5'(2,2'-bithiazole)} [P(NDI2OD-TZ2)]

Preparation of P(NDI2OD-TZ2): Under argon, a mixture of NDI2OD-Br$_2$ (Example 1, 235 mg, 0.239 mmol), 5,5'-bis (trimethylstannyl)-2,2'-bithiazole (118 mg, 0.239 mmol), and Pd(PPh$_3$)$_2$Cl$_2$ (7.0 mg, 0.010 mmol) in anhydrous toluene (12 mL) was stirred at 90° C. for 3 days. Bromobenzene (0.3 mL) was then added and the resulting mixture was stirred for an additional 12 hours. After cooling to room temperature, a solution of potassium fluoride (2 g) in water (4 mL) was added. This mixture was stirred and shaken at room temperature for 1 hour, before it was diluted with chloroform (150 mL). The resulting mixture was washed with water (100 mL×3), dried over anhydrous Na$_2$SO$_4$, and concentrated on a rotary evaporator. The residue was taken with chloroform (50 mL) and precipitated in methanol (100 mL). This procedure was repeated using chloroform and acetone, leading to a dark red solid as the crude product. This crude product was purified by Soxhlet extraction with acetone for 72 hours. The isolated solid was dissolved in chloroform (80 mL) and then heated to boil. Upon cooling to room temperature, this chloroform solution was passed through a syringe filter (5 μm), and the filtrate was precipitated in methanol (80 mL). The precipitates were collected by filtration, washed with methanol, and dried in vacuum, leading to a dark red solid (222 mg, 93.7%). $^1$H NMR (CDCl$_3$, 500 MHz): δ: 7.71 (m, br, 2H), 7.54 (m, br, 2H), 4.20-4.25 (m, br, 4H), 1.69 (m, br, 2H), 1.15-1.50 (m, br, 64H) 0.80-0.95 (m, br, 12H). Elemental Analysis (calc. C, 72.68; H, 8.74; N, 5.65): found C, 72.07; H, 8.61; N, 5.56.

Example 7

Preparation of Poly{[N,N'-bis(2-octyldodecyl)-1,4,5, 8-naphthalenediimide-2,6-diyl]-alt-5,5-(4',7'-di-2-thienyl-2',1',3'-benzothiadiazole)} [P(NDI2OD-TBT)]

Preparation of P(NDI2OD-TBT) (Suzuki Coupling Reaction): Under argon, a mixture of N,N'-bis(2-octyldodecyl)-2,6-bis(5'-bromo-2'-thienyl)naphthalene-1,4,5,8-bis(dicarboximide) (NDI2OD-BrT1) (Example 5, 85.0 mg, 0.074 mmol), 4,7-bis(4,4,5,5-tetramethyl-1,3,2-dioxaborolan-2-yl)-2,1,3-benzothiadiazole (28.7 mg, 0.074 mmol), potassium carbonate (81.0 mg, 0.586 mmol), and Pd(PPh$_3$)$_4$ (1.8 mg, 0.002 mmol) in anhydrous toluene (4 mL) and DMF (2 mL) was stirred at 100° C. for 3 days. Bromobenzene (0.3 mL) was then added and the resulting mixture was stirred for an additional 12 hours. After cooling to room temperature, the reaction mixture was poured into methanol (200 mL), and the resulting mixture was stirred at room temperature for 15 minutes. The precipitates were collected by filtration, washed with methanol, and dried in vacuum, leading a dark solid as the product (62.0 mg, 74.6%). Elemental Analysis (calc. C, 72.68; H, 8.07; N, 4.99): found C, 72.41; H, 7.90; N, 5.00.

Preparation of P(NDI2OD-TBT) (Stille Coupling Reaction): Under argon, a mixture of NDI2OD-Br$_2$ (Example 1, 84.3 mg, 0.086 mmol), 5,5-bis(trimethylstannyl)-4',7'-di-2-thienyl)-2',1',3'-benzothiadiazole (53.6 mg, 0.086 mmol), and Pd(PPh$_3$)$_2$Cl$_2$ (2.5 mg, 0.004 mmol) in anhydrous toluene (6.5 mL) was stirred at 90° C. for 3 days. Bromobenzene (0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous Na$_2$SO$_4$, and concentrated on a rotary evaporator. The residue was taken with chloroform (50 mL) and precipitated in methanol (100 mL). This procedure was repeated using chloroform and acetone, leading to a dark solid as the crude product (58.0 mg, 60.3%).

Example 8

Preparation of Poly{[N,N'-bis(2-hexyldecyl)-1,4,5,8-naphthalenediimide-2,6-diyl]-alt-5,5'-(2,2'-bithiophene)} [P(NDI2HD-T2)]

Preparation of P(NDI2HD-T2): Under argon, a mixture of NDI2OD-Br$_2$ (1.02 g, 1.17 mmol), 5,5'-bis(trimethylstannyl)-2,2'-bithiophene (0.58 g, 1.17 mmol), Pd$_2$dba$_3$ (21.4 mg, 0.023 mmol), and P(o-tol)$_3$ (28.4 mg, 0.093 mmol) in anhydrous chlorobenzene (100 mL) was stirred at 90° C. for 18 hours. Bromobenzene (2 mL) was then added and the reaction mixture was maintained at 90° C. for an additional 14 hours. Upon cooling to room temperature, a solution of KF (4 g) in water (8 mL) was added, and the resulting mixture was stirred for 1 h. This reaction mixture was diluted with chloroform (300 mL), and the resulting mixture was washed with water (200 mL×3), dried over anhydrous Na$_2$SO$_4$, and concentrated in vacuo. The residue was taken with chloroform (250 mL), and precipitated in methanol (300 mL) and acetone (300 mL) in sequence. The resulting crude product was then subject to Soxhlet extraction with methanol (15 h), acetone (24 h), and hexane (24 h). The isolated solid product was dissolved in chloroform (600 mL), and this solution was precipitated in methanol (600 mL). The filtrate was collected by filtration, washed with methanol, and dried in vacuum, leading to a dark blue solid (1.01 g, 98.1%). $^1$H NMR (CDCl$_2$CDCl$_2$, 500 MHz): δ: 8.50-8.80 (br, 2H), 7.37 (br, 4H), 4.13 (br, 4H), 2.00 (br, 2H), 1.20-1.60 (br, m, 48H), 0.87 (br, 12H). Elemental Analysis (calc. C, 73.93; H, 8.27; N, 3.19): found C, 74.29; H, 8.31; N, 3.37. High temperature GPC: Mn=16.7, Mw=55.4, PDI=3.3.

Example 9

Preparation of poly{[N,N'-bis(2-octyldodecyl)-3,4:9, 10-perylenediimide-(1,7 & 1,6)-diyl]-alt-5,5'-(2,2'-bithiophene)} [P(PDI2OD-T2)]

Preparation of N,N'-bis(2-octyldodecyl)-(1,7 & 1,6)-dibromoperylene-3,4:9,10-bis(dicarboxiamide) (PDI2OD-Br$_2$): A mixture of PDA-Br$_2$ (0.44 g, 0.80 mmol), 2-octyldodecylamine (0.71 g, 2.4 mmol), o-xylene (3 mL), and propionic acid (1 mL) was stirred at 140° C. for 2 hours. Upon cooling to room temperature, most of the solvents were removed in vacuo, and the residue was purified by column chromatography on silica gel with a mixture of chloroform:hexane (1:1, v/v, slowly up to 2:1) as eluent, affording a red solid as the product (0.63 g, 0.57 mmol, yield 71.5%). $^1$H NMR (CDCl$_3$ 500 MHz): δ: 9.51 (d, J=8.0 Hz, 2H), 8.94 (s, 2H), 8.71 (d, J=8.0 Hz, 2H), 4.15 (d, J=7.0 Hz, 4H), 2.01 (m, 2H), 1.20-1.50 (m, 64H), 0.84-0.89 (m, 12H). Elemental Analysis (calc. C, 69.30; H, 8.00; N, 2.53): found C, 69.42; H, 8.13; N, 2.61.

Preparation of poly{[N,N'-bis(2-octyldodecyl)-3,4:9,10-perylene diimide-(1,7 & 1,6)-diyl]-alt-5,5'-(2,2'-bithiophene)} [P(PDI2OD-T2)]: Under argon, a mixture of PDI2OD-Br$_2$ (113.9 mg, 0.103 mmol), 5,5'-bis(trimethylstannyl)-2,2'-bithiophene (50.5 mg, 0.103 mmol), and Pd(PPh$_3$)$_2$Cl$_2$ (3.1 mg, 0.004 mmol) in anhydrous toluene (6 mL) was stirred at 90° C. for 2 days. Bromobenzene (0.2 mL) was then added and the reaction mixture was maintained at 90° C. for an additional 12 hours. Upon cooling to room temperature, a solution of potassium fluoride (1 g) in water (2 mL) was added. This mixture was stirred at room temperature for 2 hours before it was diluted with chloroform (150 mL). The resulting mixture was washed with water (100 mL×3), dried over anhydrous sodium sulfate, and concentrated on a rotary evaporator. The residue was taken with chloroform (25 mL) and precipitated in methanol (50 mL) and acetone (50 mL) in sequence. The isolated dark solid was dissolved in chloroform (25 mL) and heated to boil. Upon cooling to room temperature, the chloroform solution was filtered through a 5 μm filter, and the filtrate was added slowly to methanol (50 mL). The precipitates were collected by filtration, washed with methanol, and dried in vacuum, leading to a deep blue solid as the product (105.0 mg, yield 91.5%). $^1$H NMR (CDCl$_2$CDCl$_2$ 500 MHz): δ: 8.72 (m, br, 2H), 8.40 (s, br, 4H), 7.12-7.45 (m, br, 4H), 4.11 (s, br, 4H), 2.01 (s, br, 2H), 1.15-1.50 (m, br, 64H), 0.84 (s, br, 12H). GPC: $M_n$=11.0 K Da, $M_w$=32.1 K Da, PDI=2.9. Elemental Analysis (calc. C, 77.65; H, 8.33; N, 2.52): fond C, 76.60; H, 7.94; N, 2.47.

Example 10

Preparation of Dithienocoronene Diimide-based Copolymer [P(DTC2OD-T2)]

Preparation of PDI2OD-T2Br2: A mixture of PDI2OD-T2 (1.95 g, 1.75 mmol) and NBS (1.12 g, 6.29 mmol) in dry DMF (100 mL) was heated at 110° C. for 17 hours under nitrogen. After cooling to room temperature, the reaction mixture was evaporated to dryness to give a semi-solid crude product. The crude product was initially purified by column chromatography (silica gel, dichloromethane:hexanes (2:1, v/v)) to give a mixture of 1,6 and 1,7 isomers which were separated after a second column chromatography (silica gel, dichloromethane:hexanes (1:1), v/v)) to yield pure 1,7 isomer as a deep purple solid (1.0 g, 45% yield).

Preparation of DTC2OD-Br2: A mixture of PDI2OD-T2Br2 (347 mg, 0.272 mmol) and iodine (147 mg, 0.552 mmol) was dissolved in benzene (200 mL), and exposed to the UV-light for 15 hours in a Rayonet RPR-100 photochemical reactor equipped with sixteen RPR 3000 Å lamps. After the photochemical reaction was done, the precipitate was filtered and washed successively with methanol, acetone and hexane, and dried in a vacuum oven (60° C., overnight) to afford the pure compound as an orange solid (326 mg, 94% yield).

Preparation of P(DTC2OD-T2): The reagents 5,5'-bis(trimethylstannyl)-2,2'-bithiophene (11.6 mg, 0.024 mmol), DTC2OD-Br2 (30 mg, 0.024 mmol), and Pd(PPh$_3$)$_2$Cl$_2$ (0.8 mg, 0.0012 mmol) in anhydrous toluene (4 mL) were heated at 90° C. for 19 h under nitrogen in a sealed flask. After cooling to room temperature, the dark green viscous reaction mixture was poured into methanol (20 mL). After stirring for 2 hours, the precipitated dark solid was collected by gravity filtration.

Preparation of Electron-Donor Polymers

Example 11

Preparation of poly[{4,8-bis[(2-hexyldecyl)oxy] benzo[1,2-b:4,5-b']dithiophene)-2,6-diyl-(3-dodecyl-2,5-thiophenediyl)-2,1,3-benzothiadiazole-4,7- diyl-(4-dodecyl-2,5-thiophenediyl)}-co-[{4,8 -bis[(2-hexyldecyl)oxy]benzo[1,2-b:4,5-b']dithiophene)2,6-diyl-(2,5-thiophenediyl)-2,1,3- benzothiadiazole-4,7-diyl-(2,5-thiophenediyl)}](x=0.23; y=0.77)

To a Schlenk flask were added 4,7-bis(5-bromo-2-thienyl)-2,1,3-benzothiadiazole (46.23 mg, 0.101 mmol), 4,8-bis[(2-hexyldecyl)oxy]-2,6-bis(1,1,1-trimethylstannanyl)benzo[1,2-b:4,5-b']dithiophene (141.65 mg, 0.135 mmol), 4,7-bis(5-bromo-4-dodecyl-2-thienyl)-2,1,3-benzothiadiazole (24.6 mg, 0.0309 mmol), Pa$_2$dba$_3$ (4.93 mg, 0.00538 mmol), and P(o-tol)$_3$ (13.10 mg, 0.431 mmol). The flask was degassed and backfilled with nitrogen three times. Dry chlorobenzene (20 mL) was injected and the reaction was heated to 130° C. for 18 hours. The reaction was cooled to room temperature and the content of the flask was poured into methanol (100 mL). The precipitates were collected by filtration and the solids were extracted with acetone for 1 hour, dichloromethane for 3 hours and chloroform for three hours. Finally, the polymer was extracted with chlorobenzene. The chloroform solution was poured into methanol, and the precipitates were again collected by filtration, dried under vacuum to afford the title polymer (40 mg).

Example 12

Preparation of poly[{4,8-bis[(2-hexyldecyl)oxy] benzo[1,2-b:4,5-b']dithiophene)2,6-diyl-(3-dodecyl-2,5-thiophenediyl)-2,1,3-benzothiadiazole-4,7- diyl-(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-2,1,3-benzothiadiazole-4,7-diyl(2,5-thiophenediyl)}](x=0.29; y=0.71)

To a Schlenk flask were added 4,8-bis[(2-hexyldecyl)oxy]-2,6-bis(1,1,1-trimethylstannanyl)benzo[1,2-b:4,5-b'] dithiophene (129.74 mg, 0.123 mmol), 4,7-bis(5-bromo-2-thienyl)-2,1,3-benzothiadiazole (39.53 mg, 0.0863 mmol), 4,7-bis(5-bromo-4-dodecyl-2-thienyl)-2,1,3-benzothiadiazole (27.43 mg, 0.345 mmol), Pa$_2$dba$_3$ (4.513 mg, 0.000493 mmol), and P(o-tol)$_3$ (12.00 mg, 0.394 mmol). The flask was degassed and backfilled with nitrogen three times. Dry chlorobenzene (20 mL) was injected and the reaction was heated to 130° C. for 18 hours. The reaction was cooled to room temperatuer and the content of the flask was poured into methanol (200 mL). The precipitates were collected by filtration and the solids were extracted with ethyl acetate for 5 hours, and THF for 5 hours. Finally the polymer was extracted with chlorobenzene. The chloroform solution was poured into methanol, and the precipitates were again collected by filtration, dried under vacuum to afford the title polymer (64 mg, 49% yield).

Example 13

Preparation of poly[{4,8-bis[(2-hexyldecyl)oxy] benzo[1,2-b:4,5-b']dithiophene)-2,6-diyl-(3-dodecyl-2,5-thiophenediyl)-2,1,3-benzothiadiazole-4,7- diyl-(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-2,1,3- benzothiadiazole-4,7-diyl(2,5-thiophenediyl)}](x=0.38; y=0.62)

To a Schlenk flask were added 4,8-bis[(2-hexyldecyl)oxy]-2,6-bis(1,1,1-trimethylstannanyl)benzo[1,2-b:4,5-b'] dithiophene (117.27 mg, 0.111 mmol), 4,7-bis(5-bromo-2-thienyl)-2,1,3-benzothiadiazole (30.62 mg, 0.0668 mmol), 4,7-bis(5-bromo-4-dodecyl-2-thienyl)-2,1,3-benzothiadiazole (33.64 mg, 0.0423 mmol), Pa$_2$dba$_3$ (4.08 mg, 0.0045 mmol), and P(o-tol)$_3$ (10.85 mg, 0.0356 mmol). The flask was degassed and backfilled with nitrogen three times. Dry chlorobenzene (20 mL) was injected and the reaction was heated to 130° C. for 18 hours. The reaction was cooled to room temperature and the content of the flask was poured into methanol (100 mL). The precipitates were collected by filtration and the solids were extracted with methanol for 8 hours, ethyl acetate for 5 hours, and then dichloromethane for 15 hours. Finally the polymer was extracted into chloroform. The chloroform solution was poured into methanol, and the precipitates were again collected by filtration, dried under vacuum to afford the title polymer 88 mg (72% yield).

Example 14

Preparation of poly[{4,8-bis[(2-hexyldecyl)oxy]benzo[1,2-b:4,5-b']dithiophene)-2,6-diyl-(3-dodecyl-2,5-thiophenediyl)-2,1,3-benzothiadiazole-4,7- diyl-(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-2,1,3- benzothiadiazole-4,7-diyl(2,5-thiophenediyl)}](x=0.5; y=0.5)

To a Schlenk flask were added 4,8-bis[(2-hexyldecyl)oxy]-2,6-bis(1,1,1-trimethylstannanyl)benzo[1,2-b:4,5-b']dithiophene (600 mg, 0.60 mmol), 4,7-bis(5-bromo-2-thienyl)-2,1,3-benzothiadiazole (137.9 mg, 0.301 mmol), 4,7-bis(5-bromo-4-dodecyl-2-thienyl)-2,1,3-benzothiadiazole (229.60 mg, 0.289 mmol), $Pa_2dba_3$ (22.05 mg, 0.024 mmol), and P(o-tol)$_3$ (58.63 mg, 0.193 mmol). The flask was degassed and backfilled with argon three times. Dry chlorobenzene (90 mL) was injected and the reaction was heated to 130° C. for 18 hours. The reaction was cooled to room temperature and the content of the flask was poured into methanol (200 mL). The precipitates were collected by filtration and the solids were extracted with methanol for 5 hours, ethyl acetate for 5 hours, hexanes for 15 hours, and then dichloromethane for 5 hours. Finally the polymer was extracted into chloroform. The chloroform solution was poured into methanol, and the precipitates were again collected by filtration, dried under vacuum to afford the title polymer 511 mg (75% yield).

Example 15

Preparation of poly[{4,8-bis[(2-hexyldecyl)oxy]benzo[1,2-b:4,5-b']dithiophene)-2,6-diyl-(3-dodecyl-2,5-thiophenediyl)-5,6-difluoro-benzo[1,2,5]thiadiazole-4,7-diyl-(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-5,6-difluoro-benzo[1,2,5]thiadiazole-4,7-diyl(2,5-thiophenediyl)}](x=0.5; y=0.5)

4,7-Bis-(5-bromo-4-dodecyl-thiophen-2-yl)-5,6-difluoro-benzo[1,2,5]thiadiazole (20.77 mg, 0.025 mmol), 4,7-bis-(5-bromo-thiophen-2-yl)-5,6-difluoro-benzo[1,2,5]thiadiazole (12.35 mg, 0.025 mmol), 4,8-bis-(2-hexyl-decyloxy)-2,6-bis-trimethylstannanyl-benzo[1,2-b:4,5-b']dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 130° C. for 18 hours. After cooling down to room temperature, the polymer was precipitated out from methanol and further purified using Soxhlet extraction with methanol, ethyl acetate, and dichloromethane. The product was extracted with chloroform and weighed 16.0 mg (27.5% yield) after removal of the solvent and being dried in vacuo.

Example 16

Preparation of poly[{4,8-bis[(2-hexyldecyl)oxy]benzo[1,2-b:4,5-b']dithiophene)-2,6-diyl-(3-dodecyl-2,5-thiophenediyl)-5,6-difluoro-benzo[1,2,5]thiadiazole-4,7-diyl(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-5,6-difluoro-benzo[1,2,5]thiadiazole-4,7-diyl(2,5-thiophenediyl)}](x=0.6; y=0.4)

4,7-Bis-(5-bromo-4-dodecyl-thiophen-2-yl)-5,6-difluoro-benzo[1,2,5]thiadiazole (24.92 mg, 0.03 mmol), 4,7-bis-(5-bromo-thiophen-2-yl)-5,6-difluoro-benzo[1,2,5]thiadiazole (9.88 mg, 0.02 mmol), 4,8-bis-(2-hexyl-decyl)-2,6-bis-trim-ethylstannanyl-benzo[1,2-b:4,5-b']dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 131° C. for 18 hours. After cooling down to room temperature, the polymer was precipitated out from 150 ml of methanol and further purified by Soxhlet extraction with methanol, acetone, hexane, ethyl acetate, and dichloromethane. The product was extracted with chloroform and weighed 38.0 mg (64.0% yield) after removal of the solvent and being dried in vacuo.

Example 17

Preparation of poly[{4,8-bis[(2-hexyldecyl)oxy]benzo[1,2-b:4,5-b']dithiophene)-2,6-diyl-(3-dodecyl-2,5-thiophenediyl)-5,6-difluoro-benzo[1,2,5]thiadiazole-4,7-diyl(4-dodecyl-2,5-thiophenediyl)}-co-[{4,8-bis[(2-hexyldecyl)oxy]benzo[1,2-b:4,5-b']dithiophene)-2,6-diyl-(2,5-thiophenediyl)-5,6-difluoro-benzo[1,2,5]thiadiazole-4,7-diyl-(2,5-thiophenediyl)}](x=0.7; y=0.3)

4,7-Bis-(5-bromo-4-dodecyl-thiophen-2-yl)-5,6-difluoro-benzo[1,2,5]thiadiazole (29.08 mg, 0.035 mmol), 4,7-bis-(5-bromo-thiophen-2-yl)-5,6-difluoro-benzo[1,2,5]thiadiazole (7.413 mg, 0.015 mmol), 4,8-bis-(2-hexyl-decyloxy)-2,6-bis-trimethylstannanyl-benzo[1,2-b:4,5-b']dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 135° C. for 18 hours. After cooling down to room temperature, the polymer was precipitated out from methanol and further purified using Soxhlet extraction with methanol, ethyl acetate, dichloromethane. The product was extracted with chloroform and weighed 48.0 mg (77.5% yield) after removal of the solvent and being dried in vacuo.

Example 18

Preparation of poly[{4,8-bis[(2-hexyldecyl)oxy]benzo[1,2-b:4,5-b']dithiophene)-2,6-diyl-(3-dodecyl-2,5-thiophenediyl)-5,6-difluoro-benzo[1,2,5]thiadiazole-4,7-diyl-(4-dodecyl-2,5-thiophenediyl)}-co-[{4,8-bis[(2-hexyldecyl)oxy]benzo[1.2-b:4,5-b']dithiophene)-2,6-diyl-(2,5-thiophenediyl)-5,6-difluoro-benzo[1,2,5]thiadiazole-4,7-diyl-(2,5-thiophenediyl)}](x=0.8; y=0.2)

4,7-Bis-(5-bromo-4-dodecyl-thiophen-2-yl)-5,6-difluoro-benzo[1,2,5]thiadiazole (33.23 mg, 0.04 mmol), 4,7-bis-(5- bromo-thiophen-2-yl)-5,6-difluoro-benzo[1,2,5]thiadiazole (4.94 mg, 0.01 mmol), 4,8-bis-(2-hexyl-decyloxy)-2,6-bis-trimethylstannanyl-benzo[1,2-b:4,5-b']dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 135° C. for 18 hours. After cooling down to room temperature, the polymer was precipitated out from methanol and further purified using Soxhlet extraction with methanol, acetone, hexane, ethyl acetate, and dichloromethane. The product was extracted with chloroform and weighed 36.0 mg (60% yield) after removal of the solvent and being dried in vacuo.

Example 19

Preparation of poly[{4,8-bis[(2-butyloctyl)oxy]benzo[1,2-b:4,5-b']dithiophene)-2,6-diyl-(3-dodecyl-2,5-thiophenediyl)-5,6-difluoro-benzo[1,2,5]thiadiazole-4,7-diyl-(4-dodecyl-2,5-thiophenediyl)}-co-[{4,8-bis[(2-butyloctyl)oxy]benzo[1,2-b:4,5-b']dithiophene)-2,6-diyl-(3-dodecyl-2,5-thiophenediyl)-benzo[1,2,5]thiadiazole-4,7-diyl-(4-dodecyl-2,5-thiophenediyl)}](x=0.5; y=0.5)

The reagents 4,8-bis-(2-butyloctyloxy)-2,6-bis-trimethylstannanyl-benzo[1,2-b:4,5-b']dithiophene (70 mg, 0.08 mmol), 4,7-bis-(5-bromo-4-dodecyl-thiophen-2-yl)-5,6-difluoro-benzo[1,2,5]thiadiazole (33.87 mg, 0.04 mmol), 4,7-bis-(5-bromo-4-dodecyl-thiophen-2-yl)-benzo[1,2,5]thiadiazole (31.45 mg, 0.04 mmol), $Pd_2(dba)_3$ (2.9 mg, 0.0032 mmol), and P(o-tolyl)$_3$ (3.85 mg, 0.0127 mmol) in anhydrous chlorobenzene (10 mL) were heated at 135° C. for 16 h under nitrogen in a sealed flask. After cooling to room temperature, the dark purple viscous reaction mixture was poured into methanol (100 mL). The final precipitated polymer was collected by vacuum filtration and dried in a vacuum oven to afford the polymer as a black solid (83.3 mg, 87% yield).

Example 20

Preparation of poly[{4,8-bis[(2-hexyldecyl)oxy]benzo[1,2-b:4,5-b']dithiophene)-2,6-diyl-(3-dodecyl-2,5-thiophenediyl)-5-chloro-2,1,3- benzothiadiazole-4,7-diyl-(4-dodecyl-2,5-thiophenediyl)}-co-[{4,8-bis[(2-hexyldecyl)oxy]benzo[1,2-b:4,5-b']dithiophene)-2,6-diyl-(2,5- thiophenediyl)-5-chloro-2,1,3-benzothiadiazole-4,7-diyl-(2,5-thiophenediyl)}] (x=0.5; y=0.5)

4,8-Bis[(2-hexyldecyl)oxy]-2,6-bis(1,1,1-trimethyl-stannanyl)benzo[1,2-b:4,5-b']dithiophene (110 mg, 0.110 mmol), 4,7-bis(5-bromo-2-thienyl)-5-chloro-2,1,3-benzothiadiazole (27.18 mg, 0.0552 mmol), 4,7-bis(5-bromo-4-dodecyl-2-thienyl)-5-chloro-2,1,3-benzothiadiazole (43.93 mg, 0.053 mmol), $Pd_2dba_3$ (4.04 mg, 0.00441 mmol), and P(o-tol)$_3$ (10.75 mg, 0.0353 mmol) were placed in a Schlenk flask. The flask was degassed and backfilled with argon three times. Dry chlorobenzene (10 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chloroform. The chloroform solution was poured into methanol, and the precipitates were again collected by filtration, dried under vacuum to afford the polymer (94 mg, 72% yield).

Example 21

Preparation of poly[{4,8-bis[(2-hexyldecyl)oxy]benzo[1,2-b:4,5-b']dithiophene)-2,6-diyl-(3-dodecyl-2,5-thiophenediyl)-5-chloro-2,1,3- benzothiadiazole-4,7-diyl-(4-dodecyl-2,5-thiophenediyl)}-co-[{4,8-bis[(2-hexyldecyl)oxy]benzo[1,2-b:4,5-b']dithiophene)-2,6-diyl-(2,5- thiophenediyl)-5-chloro-2,1,3-benzothiadiazole-4,7-diyl-(2,5-thiophenediyl)}] (x=0.45; y=0.55)

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (27.10 mg, 0.055 mmol), 4,7-bis(5-bromo-4-dodecyl-2-thienyl)-5-chloro-2,1,3-benzothiadiazole (37.32 mg, 0.045 mmol), $Pd_2dba_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chloroform. The chloroform solution was poured into methanol, and the precipitates again were collected by filtration, then dried under vacuum to afford the polymer (102 mg, 86.4% yield).

Example 22

Preparation of poly[{4,8-bis[(2-hexyldecyl)oxy]benzo[1,2-b:4,5-b']dithiophene)-2,6-diyl-(3-dodecyl-2,5-thiophenediyl)-5-chloro-2,1,3- benzothiadiazole-4,7-diyl-(4-dodecyl-2,5-thiophenediyl)}-co-[{4,8-bis[(2-hexyldecyl)oxy]benzo[1,2-b:4,5-b']dithiophene)-2,6-diyl-(2,5- thiophenediyl)-5-chloro-2,1,3-benzothiadiazole-4,7-diyl-(2,5-thiophenediyl)}] (x=0.4; y=0.6)

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (29.56 mg, 0.06 mmol), 4,7-bis(5-bromo-4-dodecyl-2-thienyl)-5-chloro-2,1,3-benzothiadiazole (33.17 mg, 0.04 mmol), $Pd_2dba_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the content of the flask was poured into methanol (100 mL). The precipitates were collected by filtration and the solids were extracted with methanol for 3 hours, ethyl acetate for 3 hours, then dichloromethane for 18 hours. Finally the polymer was extracted into chlorobenzene. The chlorobenzene solution was poured into methanol, and the precipitates again were collected by filtration, then dried under vacuum to afford the polymer (81.7 mg, 76.3% yield).

Example 23

Preparation of poly[{4,8-bis[(2-butyloctyl)oxy]benzo[1,2-b:4,5-b']dithiophene)-2,6-diyl-(3-dodecyl-2,5-thiophenediyl)-5,6-dichloro-benzo[1,2,5]thiadiazole-4,7-diyl-(4-dodecyl-2,5-thiophenediyl)}-co-[{4,8-bis[(2-butyloctyl)oxy]benzo[1,2-b:4,5-b']dithiophene)-2,6-diyl-(3-dodecyl-2,5-thiophenediyl)-benzo[1,2,5]thiadiazole-4,7-diyl-(4-dodecyl-2,5-thiophenediyl)}](x=0.5; y=0.5)

The reagents 4,8-bis-(2-butyloctyloxy)-2,6-bis-trimethylstannanyl-benzo[1,2-b:4,5-b']dithiophene (60.0 mg, 0.068 mmol), 4,7-bis-(5-bromo-4-dodecyl-thiophen-2-yl)-5,6-dichloro-benzo[1,2,5]thiadiazole (29.3 mg, 0.034 mmol), 4,7-bis-(5-bromo-4-dodecyl-thiophen-2-yl)-benzo[1,2,5]thiadiazole (26.9 mg, 0.034 mmol), $Pd_2(dba)_3$ (2.5 mg, 0.0027 mmol), and P(o-tolyl)$_3$ (3.3 mg, 0.011 mmol) in anhydrous chlorobenzene (10 mL) were heated at 135° C. for 16 hr under nitrogen in a sealed flask. After cooling to room temperature, the dark purple viscous reaction mixture was poured into methanol (100 mL). The final precipitated polymer was collected by vacuum filtration and dried in a vacuum oven to afford the polymer as a black solid (78 mg, 93.8% yield).

Example 24

Preparation of poly[{4,8-bis[(2-butyloctyl)oxy]benzo[1,2-b:4,5-b']dithiophene)-2,6-diyl-(3-dodecyl-2,5-thiophenediyl)-5-fluoro-benzo[1,2,5]thiadiazole-4,7-diyl-(4-dodecyl-2,5-thiophenediyl)}-co-[{4,8-bis[(2-butyloctyl)oxy]benzo[1,2-b:4,5-b']dithiophene)-2,6-diyl-(3-dodecyl-2,5-thiophenediyl)-benzo[1,2,5]thiadiazole-4,7-diyl-(4-dodecyl-2,5-thiophenediyl)}](x=0.5; y=0.5)

4,7-Bis-(5-bromo-4-dodecyl-thiophen-2-yl)-5-fluoro-benzo[1,2,5]thiadiazole (20.32 mg, 0.025 mmol), 4,7-bis-(5-bromo-4-dodecyl-thiophen-2-yl)-benzo[1,2,5]thiadiazole (19.87 mg, 0.025 mmol), 4,8-bis-(2-butyl-octyl)-2,6-bis-trimethylstannanyl-benzo[1,2-b:4,5-b']dithiophene (44.23 mg, 0.050 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 132° C. for 22 hours. After cooling down to room temperature, the polymer was precipitated out from methanol and further purified by Soxhlet extraction with methanol, ethyl acetate, hexane, and dichloromethane. The product was extracted with dichloromethane and weighed 43 mg (71.6% yield) after removal of the solvent and drying in vacuo.

Example 25

Preparation of poly[{4,8-bis[5-(2-hexyldecyl)thiophen-2-yl]benzo[1,2-b:4,5-b']dithiophene)-2,6-diyl-(3-dodecyl-2,5-thiophenediyl)-5-chloro-2,1,3-benzothiadiazole-4,7-diyl-(4-dodecyl-2,5-thiophenediyl)}-co-[{4,8-bis[5-(2-hexyldecyl)thiophen-2-yl]benzo[1,2-b:4,5-b']dithiophene)-2,6-diyl-(2,5-thiophenediyl)-5-chloro-2,1,3-benzothiadiazole-4,7-diyl-(2,5-thiophenediyl)}] (x=0.45; y=0.55)

Preparation of 4,8-bis-[5-(2-hexyldecyl)-thiophen-2-yl]-1,5-dithia-s-indacene: 2-(Hexyldecyl)thiophene (7.12 g, 0.013 mol) was added into 500 mL flask. The system was vacuumed and backfilled with argon three times before 250 mL of anhydrous THF was added. Butyl lithium (2.5 M in hexane, 8.8 mL, 0.022 mol) was added dropwise after the system was cooled to 0° C. for 30 minutes. The resulting mixture was stirred at room temperature for 1.5 hours before 2.2 g of 1,5-dithia-s-indacene-4,8-dione (0.01 mol) was added in the flow of argon. The mixture was heated at 60° C. for 2 hours before being cooled to room temperature. The solution of 9.5 g of $SnCl_2$ in 150 mL of 30% HCl was added slowly into the reaction system. The mixture was heated at 60° C. for another 3 hours before being cooled to room temperature. Hexane (500 mL) was added and the mixture was washed with saturated $Na_2CO_3$ solution until no white solid was observed and then dried with $MgSO_4$. After the removal of solvent, 4,8-bis-[5-(2-hexyldecyl)-thiophen-2-yl]-1,5-dithia-s-indacene (5.0 g, yield 62.2%) was obtained by purification with chromatography with hexane as eluent. $^1$H NMR (CDCl$_3$, 500 MHz): δ 7.67 (d, 2H, J=5.5 Hz), δ 7.48(d, 2H, J=5.5 Hz), δ 7.32 (d, 2H, J=3.5 Hz), δ 6.91 (d, 2H, J=3.5 Hz), δ 2.88 (d, 4H, J=6.5 Hz), δ 1.76 (s, 2H), δ 1.38-1.32 (m, 48H), δ 0.91 (m, 12H).

Preparation of 4,8-bis-[5-(2-hexyldecyl)-thiophen-2-yl]-2,6-bis-trimethylstannanyl-1,5-dithia-s-indacene: 4,8-Bis-[5-(2-hexyldecyl)-thiophen-2-yl]-1,5-dithia-s-indacene (2.06 g, 2.56 mmol) was added into 200 mL flask. The system was vacuumed and backfilled with argon 3 times before 80 mL of anhydrous THF was injected. n-Butyl lithium (2.5 M in hexane, 2.3 mL, 5.6 mmol) was added after the mixture was cooled to −78° C. The mixture was stirred at −78° C. for 30 minutes and then at room temperature for one more hour. The system was cooled down to −78° C. again before trimethyltin chloride (0.5 g, 2.5 mmol) was added in portions. Stirring was continued overnight at room temperature. Hexane (200 mL) was added and the organic layer was washed with 150 mL of water. The aqueous layer was extracted with 100 mL of hexane twice. The combined organic layer was dried over anhydrous $Na_2SO_4$. Removal of the solvent under vacuum yielded a yellow liquid (2.2 g, 76.0% yield) as the final product after drying in vacuo overnight. $^1$H NMR (CDCl$_3$, 500 MHz): δ 7.57 (s, 2H), δ 7.21 (d, 2H, J=3.0 Hz), δ 6.78 (d, 2H, J=3.5 Hz), δ 2.76 (d, 4H, J=6.5 Hz), δ 1.62 (s, 2H), δ 1.26-1.19 (m, 48H), δ 0.76 (m, 12H), δ 0.29 (m, 18H).

4,8-Bis-[5-(2-hexyldecyl)-thiophen-2-yl]-2,6-bis-trimethylstannanyl-1,5-dithia-s-indacene (118.5 mg, 0.105 mmol), 4,7-bis(5-bromo-2-thienyl)-5-chloro-2,1,3-benzothiadiazole (27.10 mg, 0.055 mmol), 4,7-bis(5-bromo-4-dodecyl-2-thienyl)-5-chloro-2,1,3-benzothiadiazole (37.32 mg, 0.045 mmol), Pd$_2$dba$_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the content of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, then dried under vacuum to afford the polymer (59 mg, 43.3% yield).

Example 26

Preparation of poly[{4,8-bis[5-(2-hexyldecyl)thiophen-2-yl]benzo[1,2-b:4,5-b']dithiophene)-2,6-diyl-(3-dodecyl-2,5-thiophenediyl)-5-chloro-2,1,3-benzothiadiazole-4,7-diyl-(4-dodecyl-2,5-thiophenediyl)}-co-[{4,8-bis[5-(2-hexyldecyl)thiophen-2-yl]benzo[1,2-b:4,5-b']dithiophene)-2,6-diyl-(2,5-thiophenediyl)-5-chloro-2,1,3-benzothiadiazole-4,7-diyl-(2,5-thiophenediyl)}] (x=0.35; y=0.65)

4,8-Bis-[5-(2-hexyldecyl)-thiophen-2-yl]-2,6-bis-trimethylstannanyl-1,5-dithia-s-indacene (118.5 mg, 0.105 mmol), 4,7-bis(5-bromo-2-thienyl)-5-chloro-2,1,3-benzothiadiazole (32.02 mg, 0.065 mmol), 4,7-bis(5-bromo-4-dodecyl-2-thienyl)-5-chloro-2,1,3-benzothiadiazole (29.03 mg, 0.035 mmol), $Pd_2dba_3$ (3.66 mg, 0.0042 mmol), and $P(o\text{-tol})_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, then dried under vacuum to afford the polymer (110 mg, 84.9% yield).

Example 27

Preparation of poly[{4,8-bis[5-(2-hexyldecyl)thiophen-2-yl]benzo[1,2-b:4,5-b']dithiophene)-2,6-diyl-(3-dodecyl-2,5-thiophenediyl)-5-chloro-2,1,3-benzothiadiazole-4,7-diyl-(4-dodecyl-2,5-thiophenediyl)}-co-[{4,8-bis[5-(2-hexyldecyl)thiophen-2-yl]benzo[1,2-b:4,5-b']dithiophene)-2,6-diyl-(2,5-thiophenediyl)-5-chloro-2,1,3-benzothiadiazole-4,7-diyl-(2,5-thiophenediyl)}] (x=0.3; y=0.7)

4,8-Bis-[5-(2-hexyldecyl)-thiophen-2-yl]-2,6-bis-trimethylstannanyl-1,5-dithia-s-indacene (118.5 mg, 0.105 mmol), 4,7-bis(5-bromo-2-thienyl)-5-chloro-2,1,3-benzothiadiazole (34.49 mg, 0.07 mmol), 4,7-bis(5-bromo-4-dodecyl-2-thienyl)-5-chloro-2,1,3-benzothiadiazole (24.88 mg, 0.03 mmol), $Pa_2dba_3$ (3.66 mg, 0.0042 mmol), $P(o\text{-tol})_3$ (4.86 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to rt and the contents of the flask was poured into methanol (100 mL). The precipitates were collected by filtration and the solids were extracted with methanol for 3 hr, ethyl acetate for 3 hr, dichloromethane for 18 hr. Finally the polymer was extracted into chloroform. The chloroform solution was poured into methanol, and the precipitates were again collected by filtration, dried under vacuum to afford the polymer (70.0 mg, 61.3%).

Example 28

Preparation of poly[{4,8-bis[5-(2-hexyldecyl)thiophen-2-yl]benzo[1,2-b:4,5-b']dithiophene)-2,6-diyl-(3-dodecyl-2,5-thiophenediyl)-5,6-difluoro-benzo[1,2,5]thiadiazole-4,7-diyl-(4-dodecyl-2,5-thiophenediyl)}-co-[{4,8-bis[5-(2-hexyldecyl)thiophen-2-yl]benzo[1,2-b:4,5-b']dithiophene)-2,6-diyl-(2,5-thiophenediyl)-5,6-difluoro-benzo[1,2,5]thiadiazole-4,7-diyl-(2,5-thiophenediyl)}](x=0.5; y=0.5)

4,8-Bis-[5-(2-hexyldecyl)-thiophen-2-yl]-2,6-bis-trimethylstannanyl-1,5-dithia-s-indacene (118.5 mg, 0.105 mmol), 4,7-bis-(5-bromo-thiophen-2-yl)-5,6-difluoro-benzo[1,2,5]thiadiazole (24.71 mg, 0.050 mmol), 4,7-bis-(5-bromo-4-dodecyl-thiophen-2-yl)-5,6-difluoro-benzo[1,2,5]thiadiazole (41.54 mg, 0.050 mmol), $Pa_2dba_3$ (3.66 mg, 0.0042 mmol), $P(o\text{-tol})_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to rt and the contents of the flask was poured into methanol (100 mL). The precipitates were collected by filtration and the solids were extracted with methanol for 3 hr, ethyl acetate for 3 hr, dichloromethane for 18 hr. Finally the polymer was extracted into chloroform. The chloroform solution was poured into methanol, and the precipitates were again collected by filtration, dried under vacuum to afford the polymer (52.0 mg, 39.5%).

Example 29

Preparation of poly[{2,6-(4,8-didodecylbenzo[1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}]

To a 10 mL microwave tube, 2,6-bis(trimethylstannyl)-4,8-didodecylbenzo[1,2-b:4,5-b']dithiophene (51.2 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), $Pd_2(dba)_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid (68.4 mg). Using a Soxhlet setup, the crude product was extracted successively, with MeOH, hexane, ethyl acetate, THF and chloroform. The chloroform extract was poured into MeOH (100 mL) and the solid was collected. Finally, a dark brown solid (62.1 mg, yield 89%, Mn=792 kDa, d=2.7) was obtained. Elemental Analysis: Calcd. C 74.56, H 9.21, N 2.42; Found: C 74.42, H, 9.18, N 2.55.

Example 30

Preparation of poly[{2,6-(4,8-bis(2-ethylhexyl)benzo[1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}]

To a 10 mL microwave tube, 2,6-bis(trimethylstannyl)-4,8-bis(2-ethylhexyl)[1,2-b:4,5-b']dithiophene (44.4 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid (61.0 mg). Using a Soxhlet setup, the crude product was extracted successively with MeOH, hexane, ethyl acetate, THF and chloroform. The chloroform extract was poured into MeOH (100 mL) and the solid was collected. Finally, a dark brown solid (54.0 mg, yield 86%, Mn=26 kDa, d=27) was obtained. Elemental Analysis: Calcd. C 73.37, H 8.66, N 2.67; Found: C 73.06, H, 8.50, N 2.80.

Example 31

Preparation of poly[{2,6-(4,8-bis(2-ethylhexyl)benzo [1,2-b:4,5-b']dithiophene)}-alt-{5,5-(1,4-bis(2-butyloctyl)-3,6-dithiophen-2-yl-1,4-dihydropyrrolo[3,2-b]pyrrole-2,5-dione)}]

To a 10 mL microwave tube, 2,6-bis(trimethylstannyl)-4, 8-didodecyloxybenzo[1,2-b:4,5-b']dithiophene (53.1 mg, 60 μmol), 3,6-bis-(5-bromo-thiophen-2-yl)-1,4-bis-(2-butyloctyl)-1,4-dihydropyrrolo[3,2-b]pyrrole-2,5-dione (47.7 mg, 60 μmol), Pd$_2$(dba)$_3$ (2.7 mg, 5 mol %) and tri(o-tolyl)phosphine (3.7 mg, 20 mol %) were mixed in anhydrous toluene (5 mL) under argon. Then the tube was heated to 180° C. in 30 minutes and kept at this temperature for 270 minutes by a CEM Discover Microwave reactor. After cooling, it was poured into MeOH (50 mL), filtered and dried in a vacuum oven to give a dark brown solid. Using a Soxhlet setup, the crude product was extracted successively with MeOH, hexane, ethyl acetate, ether and dichloromethane. The dichloromethane extract was poured into MeOH (100 mL) and the solid was collected. Finally, a dark brown solid (45.0 mg, yield 63%, Mn=49 kDa, d=30) was obtained. Elemental Analysis: Calcd. C 72.55, H 8.96, N 2.35; Found: C 72.28, H, 8.85, N 2.48.

Example 32

Preparation of poly[{4,8-bis[5-(2-hexyldecyl) thiophen-2-yl]benzo[1,2-b:4,5-b']dithiophene)-2,6-diyl-(3-dodecyl-2,5-thiophenediyl)-benzo[1,2,5] thiadiazole-4,7-diyl-(4-dodecyl-2,5-thiophenediyl)}-co-[{4,8-bis[5-(2-hexyldecyl)thiophen-2-yl]benzo[1, 2-b:4,5-b']dithiophene)-2,6- diyl-(2,5-thiophenediyl)-benzo[1,2,5]thiadiazole-4,7-diyl-(2,5-thiophenediyl)}](x=0.5; y=0.5)

4,8-Bis-[5-(2-hexyl-decyl)-thiophen-2-yl]-2,6-bis-trimethylstannanyl-1,5-dithia-s-indacene (118.5 mg, 0.105 mmol), 4,7-bis(5-bromo-2-thienyl)-2,1,3-benzothiadiazole (22.91 mg, 0.05 mmol), 4,7-bis(5-bromo-4-dodecyl-2-thienyl)-2,1,3-benzothiadiazole (39.74 mg, 0.05 mmol), Pa$_2$dba$_3$ (3.66 mg, 0.004 mmol), P(o-tol)$_3$ (4.86 mg, 0.016 mmol) were placed in a Schlenk flask. The flask was degassed and backfilled with argon three times. Dry chlorobenzene (20 mL) was injected and the reaction was heated to 130° C. for 18 hours. The reaction was cooled to room temperature and the contents of the flask were poured into methanol (100 mL). The precipitates were collected by filtration and the solids were extracted with methanol for 6 hours, ethyl acetate for 16 hours, and dichloromethane for 24 hours. Finally the polymer was extracted into chloroform. The chloroform solution was poured into methanol, and the precipitates were again collected by filtration, dried under vacuum to afford the polymer (60.0 mg, 46.8%). Elemental Analysis: Found (%): C 72.16; H 8.18; N 2.27.

Example 33

Preparation of poly[{2,6-(4,8-bis[5-(2-hexyldecyl)-2-thienyl]benzo[1,2-b:4,5-b']dithiophene)}-alt-{5,5-(1,4-bisdecyl-3,6-dithiophen-2-yl-1,4-dihydropyrrolo [3,2-b]pyrrole-2,5-dione)}]

To a 100 mL storage vessel, 2,6-bis(trimethylstannyl)-4,8-bis[5-(2-hexyldecyl)-2-thienyl]benzo[1,2-b:4,5-b'] dithiophene (105.8 mg, 93.7 μmol), 3,6-bis-(5-bromo-thiophen-2-yl)-1,4-bisdecyl-1,4-dihydropyrrolo[3,2-b] pyrrole-2,5-dione (69.2 mg, 93.7 μmol), Pd$_2$(dba)$_3$ (4.3 mg, 5 mol %) and tri(o-tolyl)phosphine (5.7 mg, 20 mol %) were mixed in anhydrous chlorobenzene (8 mL) under argon. Then the tube was heated at 135° C. for 16 hours. After cooling, it was poured into MeOH (50 mL), filtered and dried in a vacuum oven. Using a Soxhlet setup, the crude product was extracted successively with MeOH, ethyl acetate, dichloromethane, and chloroform. The chloroform extract was poured into MeOH (100 mL) and the solid was collected. Finally, a dark blue solid (76 mg, yield 59%, high temperature GPC in trichlorobenzene: Mn=21.6 kDa, d=1.97) was obtained. Elemental Analysis: Calcd. C 73.10, H 8.62, N 2.03; Found: C 72.83, H, 8.51, N 2.12.

Example 34

Preparation of Naphthodithiophene-based Donor Polymer

Naphthalene-2,6-diol (16.0 g, 0.1 mol) and NaH (6.0 g, 0.25 mol) was combined together in a 500 mL flask under argon. The mixture was cooled to −78° C. before the addition of anhydrous DMF (200 mL) by injection. The mixture emitted a significant amount o gas. Stirring was continued at room temperature for 2 hours. Dimethyl sulfate (31.5 g, 0.25 mol) was added dropwise after the mixture was cooled to −78° C. again. The reaction was continued overnight at room temperature before 200 mL of anhydrous DMF was added. 2,6-Dimethoxy-naphthalene (16.0 g, ~85.1% yield) was collected as a white powder by filtration and washed with water and methanol before drying under vacuum. $^1$H NMR (CDCl$_3$, 500 MHz): δ 7.67 (d, 2H, J=8.5 Hz), δ 7.17 (d×d, 2H, J=8.5 Hz×2.5 Hz), δ 7.13 (d, 2H, J=2.5 Hz), δ 7.13 (d, 2H, J=2.5 Hz), δ 3.93 (s, 6H).

To a 200 mL Schlenk flask, 2,6-dimethoxy-naphthalene (3.76 g, 20.0 mmol) was added. The system was vacuumed and backfilled with argon 3 times before 100 mL of anhydrous THF was added. After the mixture was cooled to 0° C. for 30 minutes, n-butyllithium (34 mL, 2.5 M, 85.0 mmol) was injected dropwise. The resulting mixture was stirred at room temperature for 4 hours before being cooled to −78° C. 2-(2,2-Diethoxy-ethyldisulfanyl)-1,1-diethoxyethane (26.6 g, 103 mmol) was injected in one portion. The dry ice bath was removed 5 minutes later and the mixture was stirred overnight. Water (100 mL) was added to quench the reaction and the mixture was stirred at room temperature for 10 minutes. Hexane (150 mL×3) was used to extract the product and the combined organic layer was dried with anhydrous Na$_2$SO$_4$. Methanol (150 mL) was added and 2,6-bis-(2,2-diethoxy-ethylsulfanyl)-3,7-dimethoxy-naphthalene (5.0 g, ~52.0% yield) as a yellow solid was collected by filtration and washed with methanol and dried under vacuum. $^1$H NMR (CDCl$_3$, 500 MHz): δ 7.62 (s, 2H), δ 7.00 (s, 2H), δ (t, 2H, J=2.5 Hz), δ 3.99 (s, 6H), δ 3.73 (m, 4H), δ 3.60 (m, 4H), δ 3.23 (d, 4H, J=2.5 Hz), δ 1.23 (t, 12H, J=9.0 Hz).

2,6-Bis-(2,2-diethoxy-ethylsulfanyl)-3,7-dimethoxy-naphthalene (5.0 g, 10.3 mmol) and 6.8 g of 84% polyphorphoric acid were added into a 250 mL 3-neck flask equipped with a condenser. The system was flashed with argon for 15 minutes before 50 mL of anhydrous chlorobenzene was added. The mixture was heated at 140° C. for 40 hours before it was cooled down to room temperature. Dichloromethane (100 mL) was added. The organic mixture was washed with saturated NaHCO$_3$ before the solvent was removed under vacuum. Methanol (100 mL) was added before 5,10-dimethoxy-1,6-dithia-dicyclopenta[a,f]naphthalene (2.0 g, ~66% yield) was collected as a white solid by filtration, washed with methanol and dried in vacuo. $^1$H NMR (CDCl$_3$, 500 MHz): δ 7.97 (d, 2H, J=5.5 Hz), δ 7.62 (d, 2H, J=5.5 Hz), δ 7.51 (s, 2H), δ 4.18 (s, 6H).

5,10-Dimethoxy-1,6-dithia-dicyclopenta[a,f]naphthalene (1.80 g, 6.0 mmol), 1.14 g (6.0 mmol) of toluene-4-sulfonic acid (CH$_3$C$_6$H$_4$SO$_3$H.H$_2$O), and 35 mL of 2-butyloctanol were added into a 250 mL 3-neck flask equipped with a ondenser. The system was heated at 180° C. overnight under argon before the mixture was cooled down to room temperature. Hexane (200 mL) was added and the organic layer was washed with saturated NaHCO$_3$ before the solvent was removed under vacuum. Excess 2-butyloctanol was distilled out under vacuum. Column chromatography (silica gel) with an eluent of hexane/dichloromethane (v/v, 100/4) yielded product 5,10-bis-(2-butyl-octyloxy)-1,6-dithia-dicyclopenta[a,f]naphthalene as a colorless liquid (2.5 g, ~68.5% yield). $^1$H NMR (CDCl$_3$, 500 MHz): δ 7.96 (d, 2H, J=5.5 Hz), δ 7.60 (d, 2H, J=5.5 Hz), δ 7.50 (s, 2H), δ 4.23 (d, 4H, J=5.5 Hz), δ 1.99 (m, 2H), δ 1.33 (m, 32H), δ 0.96 (t, 6H, J=7.0 Hz), δ 0.90 (t, 6H, J=7.0 Hz).

5,10-Bis-(2-butyl-octyloxy)-1,6-dithia-dicyclopenta[a,f]naphthalene (1.41 g, 2.3 mmol) was added into a 200 mL flask. The system was vacuumed and backfilled with argon 3 times before 60 mL of anhydrous THF was injected. N-Butyllithium (2.2 mL, 2.5 M in hexane, 5.09 mmol) was added after the mixture was cooled to −78° C. A white precipitate was observed after the mixture was stirred at −78° C. for 30 minutes. Stirring was continued at room temperature for one more hour before the mixture was cooled down to −78° C. again. Trimethyltin chloride (1.20 g, 5.75 mmol) was added in portions and stirring was continued overnight at room temperature. Hexane (100 mL) was added and the organic layer was washed with 150 mL of water. The aqueous layer was extracted with 100 mL of hexane twice. The combined organic layer was dried over anhydrous Na$_2$SO$_4$. Removal of solvent under vacuum yielded a white solid. The colorless crystalline product, 5,10-bis-(2-butyl-octyloxy)-2,7-bis-trimethylstannanyl-1,6-dithia-dicyclopenta[a,f]naphthalene, (1.70 g, ~79% yield) was obtained after recrystallization from a hexane/iso-propanol mixture. $^1$H NMR (CDCl$_3$, 500 MHz): δ 7.80 (s, 2H), δ 7.69 (s, 2H), δ 4.25 (d, 4H, J=5.5 Hz), δ 1.99 (m, 2H), δ 1.33 (m, 32H), δ 0.96 (t, 6H, J=7.0 Hz), δ 0.90 (t, 6H, J=7.0 Hz), δ 0.51 (m, 18H).

4,7-Bis-(5-bromo-4-dodecyl-thiophen-2-yl)benzo[1,2,5]thiadiazole (47.69 mg, 0.06 mmol), 4,7-bis-(5-bromo-thiophen-2-yl)benzo[1,2,5]thiadiazole (9.16 mg, 0.02 mmol), and 5,10-bis-(2-butyl-octyloxy)-2,7-bis-trimethyl-stannanyl-1,6-dithia-dicyclopenta[a,f]naphthalene (74.77 mg, 0.08 mmol), Pd$_2$(dba)$_3$ (2.93 mg, 3.2 μmol), P(o-Tol)$_3$ (3.90 mg, 12.8 μmol) were combined in a 50 mL flask. The system was purged with argon before 16 mL of anhydrous chlorobenzene was added. The reaction mixture was heated at 135° C. for 18 hours. After cooling down to room temperature, the polymer was precipitated out from 80 ml of methanol and further purified by a Soxlet apparatus with methanol, ethyl acetate, dichloromethane. The residue weighed 49.0 mg (~81.6% yield) after removing the solvent and drying in vacuo.

Example 35

Preparation of Naphthodithiophene-based Donor Polymer 4,7-Bis-(5-bromo-4-dodecyl-thiophen-2-yl)-5-chloro-benzo[1,2,5]thiadiazole (49.76 mg, 0.06 mmol), 4,7-bis-(5-bromo-thiophen-2-yl)-5-chloro-benzo[1,2,5]thiadiazole (9.85 mg, 0.02 mmol), 5,10-bis-(2-butyl-octyloxy)-2,7-bis-trimethylstannanyl-1,6-dithia-dicyclopenta[a,f]naphthalene (74.77 mg, 0.08 mmol), Pd$_2$(dba)$_3$ (2.93 mg, 3.2 μmol), and P(o-Tol)$_3$ (3.90 mg, 12.8 μmol) were combined in a 50 mL flask. The system was purged with argon before 16 mL of anhydrous chlorobenzene was added. The reaction mixture was heated at 135° C. for 18 hours. After cooling down to room temperature, the polymer was precipitated out from 80 ml of methanol and further purified by a Soxlet apparatus with methanol, ethyl acetate, and dichloromethane. The residue weighed 83.0 mg (~86.9% yield) after removing the solvent and drying in vacuo.

Example 36

Preparation of 2,6-bis(trimethylstannyl)-benzo[1,2-b:4,5-b']dithiophene-4,8-(5-(2-hexyldecyl)-2-thiophenecarboxylic acid) ester

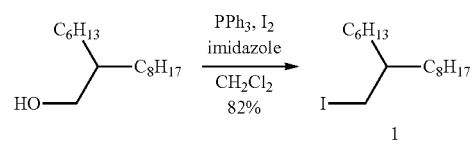

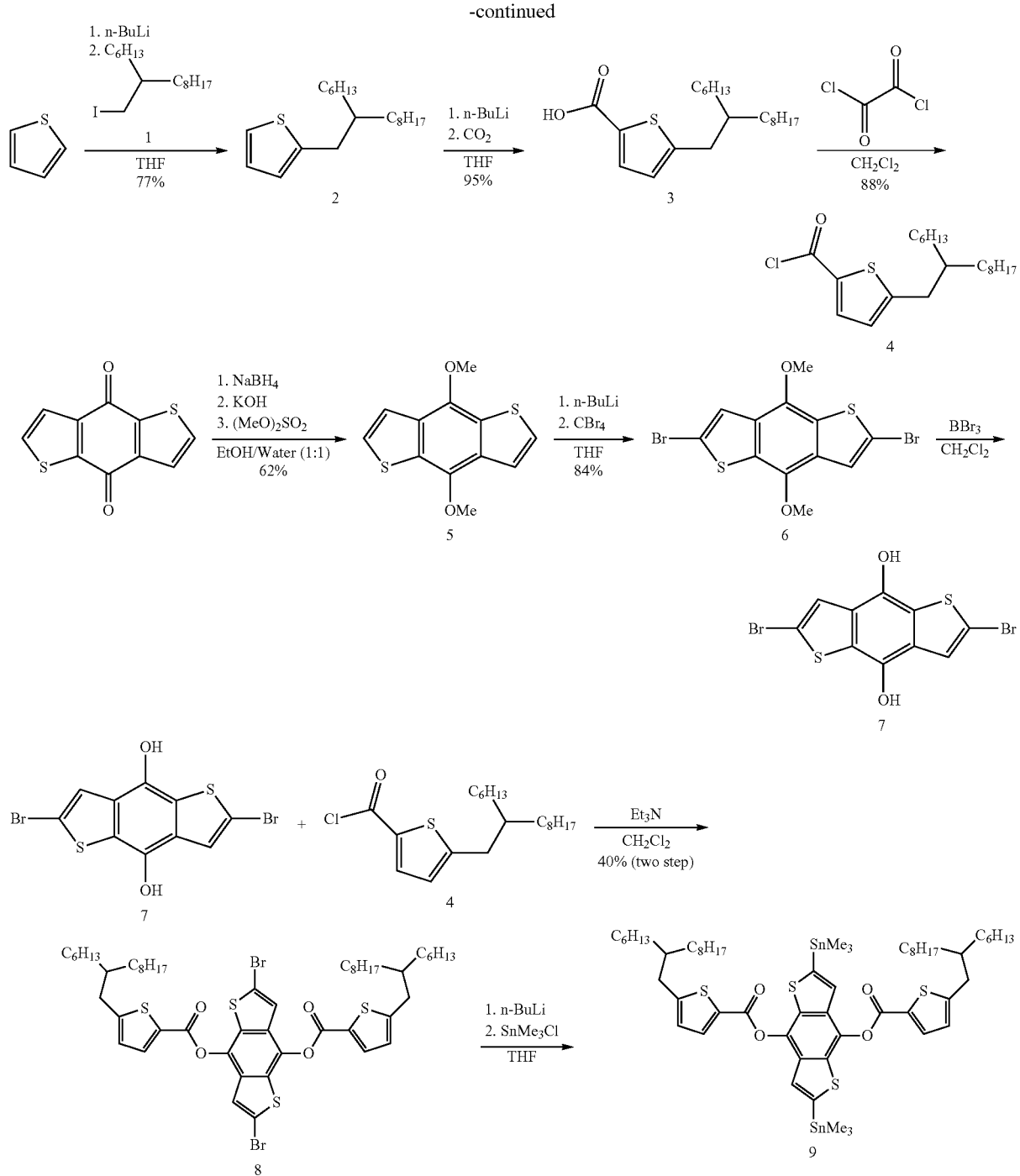

1-Iodo-2-hexyldecane (1): Under air, triphenylphosphine (107.44 g, 410 mmol, 1.19 equiv.) and imidazole (28.9 g, 424 mmol, 1.23 equiv.) were dissolved in dichloromethane (800 mL). 2-Hexyl-1-decanol (100 mL, 345 mmol., 1.00 equiv.) was added to the solution, and the reaction mixture was cooled to 0° C. Iodine (103.6 g, 408 mmol., 1.18 equiv.) was added portion-wise over 1 hour, after which the suspension was stirred at 0° C. for an additional hour, and then at ambient temperature for 18 hours. The mixture was quenched with saturated aqueous $Na_2SO_3$ (150 mL), and DCM was removed in vacuo. Hexane (200 mL) was added to the residue, and the mixture was filtered to remove salts that had precipitated. The organic material was extracted with hexanes (3×300 mL), dried over $Na_2SO_4$, filtered through a pad of silica gel, and then concentrated in vacuo to give a clear, colorless oil (97.8 g, 82% yield). $^1$H NMR (500 MHz, $CDCl_3$) δ 3.28 (d, J=4.6 Hz, 2H), 1.34-1.19 (m, 24H), 1.12 (b, 1H), 0.91-0.87 (m, 6H).

2-(2-Hexyldecyl) thiophene (2): A solution of thiophene (46.4 g, 551 mmol., 2.50 equiv.) and THF (300 mL) was cooled to −78° C. n-Butyllithium (2.5 M in hexanes, 212 mL, 528 mmol., 2.40 equiv.) was added over 1 hour. The mixture was stirred for an additional 30 minutes at −78° C. before a solution of 1-iodo-2-hexyldecane (90.0 g, 220 mmol., 1.00 equiv) in THF (200 mL) was added slowly over 1 hour. After stirring for 1 hour at −78° C., the reaction mixture was warmed to ambient temperature and stirred for 18 hours. Water (200 mL) was added and the organic material was extracted with $Et_2O$ (3×250 mL), washed with additional water, dried over $Na_2SO_4$, filtered, and concentrated in vacuo. The resulting brown residue was purified by silica gel column chromatography (hexanes) to give a pale yellow oil (52.03 g, 77% yield). $^1$H NMR (500 MHz, $CDCl_3$) δ 7.12 (dd, J=5.2, 1.2 Hz, 1H), 6.92 (m, 1H), 6.76 (dd, J=3.4, 0.9 Hz, 1H), 2.76 (d, J=6.7, 2H), 1.62 (b, 1H), 1.33-1.21 (m, 24H), 0.91-0.87 (m, 6H).

5-(2-Hexyldecyl)-2-thiophenecarboxylic acid (3): 2-(2-Hexyldecyl)thiophene (1.00 g, 3.24 mmol., 1.00 equiv.) and THF (24 mL) were added to a 50 mL schlenk flask. The solution was cooled to 0° C. n-Butyllithium (2.5 M in hexanes, 1.36 mL, 1.05 equiv.) was then added over 2 minutes. The solution was stirred for 1 hour at 0° C., then the ice/water bath was removed and the solution was stirred for 20 minutes at ambient. The solution was cooled back to 0° C. and carbon dioxide (obtained by subliming dry ice submerged in THF in a separate flask placed in a 25° C. heat bath) was bubbled through the solution for 30 minutes. The solution was diluted with 1 N hydrochloric acid (50 mL) and EtOAc (50 mL). The organic layer was washed with brine, dried with $MgSO_4$, and concentrated. Purification by silica gel column chromatography (4:1 hexanes-EtOAc, 2% AcOH) gave a colorless liquid (1.086 g, 95% yield). $^1$H NMR (500 MHz, $CDCl_3$) δ 7.74 (d, J=3.8 Hz, 1H), 6.80 (d, J=3.8 Hz, 1H), 2.79 (d, J=6.8, 2H), 1.67 (b, 1H), 1.34-1.21 (m, 24H), 0.91-0.87 (m, 6H).

5-(2-Hexyldecyl)-2-thiophenecarbonyl chloride (4): 5-(2-Hexyldecyl)-2-thiophenecarboxylic acid (1.00 g, 2.84 mmol., 1.00 equiv.) and $CH_2Cl_2$ (5 mL) were added to a 10 mL schlenk flask. The solution was cooled to 0° C. Oxalyl chloride (0.60 mL, 6.5 mmol, 2.3 equiv.) was then added. The ice/water bath was left in place and the solution was stirred for 64 hours while warming to room temperature. The reaction mixture was concentrated to a clear brown liquid (931 mg, 88% yield). $^1$H NMR (400 MHz, $CDCl_3$) δ 7.84 (d, J=3.9 Hz, 1H), 6.87 (d, J=3.8 Hz, 1H), 2.81 (d, J=6.7, 2H), 1.68 (b, 1H), 1.34-1.19 (m, 24H), 0.93-0.85 (m, 6H).

4,8-Dimethoxy-benzo[1,2-b:4,5-b']dithiophene (5): Benzo[1,2-b:4,5-b']dithiophene-4,8-dione (7.50 g, 34.0 mmol., 1.00 equiv.), ethanol (45 mL) and water (45 mL) were added to a 250 mL 2-neck round-bottom flask fitted with a reflux condenser. $NaBH_4$ (3.89 g, 102 mmol., 3.00 equiv.) was then added portion-wise cautiously. The reaction mixture was heated to reflux for 1 hour. The flask was removed from the heat bath and potassium hydroxide (4.39 g, 78.2 mmol., 2.30 equiv.) was added slowly to the reaction mixture with vigorous stirring. The suspension was stirred at reflux for 30 minutes before adding dimethyl sulfate (16 mL, 170 mmol., 5.0 equiv.), and the suspension was refluxed for 64 hours. The reaction mixture was cooled to room temperature and diluted with water (75 mL) and diethyl ether (500 mL) and more water (300 mL). The organic layer was washed with brine (200 mL), dried with $MgSO_4$ and concentrated. The crude material was purified by silica gel column chromatography (solid loading, gradient of 1:1 to 1:2 hexanes-dichloromethane) to give a white solid (5.314 g, 62% yield). $^1$H NMR (400 MHz, $CDCl_3$) δ 7.52 (d, J=5.5 Hz, 2H), 7.41 (d, J=5.5 Hz, 2H), 2.81 (d, J=6.7, 2H), 4.15 (s, 6H).

2,6-Dibromo-4,8-dimethoxy-benzo[1,2-b:4,5-b'] dithiophene (6): 4,8-Dimethoxy-benzo[1,2-b:4,5-b'] dithiophene (1.00 g, 3.99 mmol., 1.00 equiv) and THF (44 mL) were added to a 100 mL schlenk flask and the mixture was cooled to −78° C. n-Butyllithium (2.5 M in hexanes, 3.5 mL, 8.8 mmol, 2.2 equiv.) was then added and the mixture was stirred at −78° C. for 15 minutes before removing the dry ice/acetone bath and stirring at ambient for 30 minutes. The suspension was cooled to −78 ° C. and carbon tetrabromide (3.18 g, 9.59 mmol., 2.40 equiv.) was added. The dry ice/acetone bath was removed and the mixture was stirred at ambient for 1 hour. Water and dichloromethane were added (brine was also added to break emulsion) and the aqueous layer was extracted with dichloromethane. The organic layer was washed with brine, dried with $MgSO_4$ and concentrated. The crude material was purified by silica gel column chromatography (solid loading, 1:1 dichloromethane-hexane) and trituration in hexanes to give a beige crystalline solid (1.368 g, 84% yield). $^1$H NMR (400 MHz, $CDCl_3$) δ 7.48 (s, 2H), 4.07 (s, 6H).

2,6-Dibromo-benzo[1,2-b:4,5-b']dithiophene-4,8-diol (7): 2,6-Dibromo-4,8-dimethoxy-benzo[1,2-b:4,5-b'] dithiophene (500 mg, 1.22 mmol., 1.00 equiv.) and dichloromethane (12 mL) were added to a 50 mL schlenk flask. The mixture was cooled to −78 ° C. and boron tribromide was added (1.0 M solution in dichloromethane, 2.5 mL, 2.5 mmol., 2.1 equiv.) slowly. The mixture was stirred for 15 minutes at −78° C. before replacing the dry/ice acetone bath with an ice/water bath. The reaction mixture was left to warm to room temperature while stirring for 16 hours before cooling to 0° C. Water (dropwise at first, 150 mL total) and additional dichloromethane (50 mL) were added. The dichloromethane was removed on the rotary evaporator and the solid was collected by filtration. The solid was washed with water (25 mL) and dichloromethane (25 ml) to give a pale blue/green crude solid to be dried under vacuum and used in the next step without additional purification (287 mg). $^1$H NMR (400 MHz, $CDCl_3$) δ 10.13 (s, 2H), 7.71 (s, 2H).

2,6-Dibromo-benzo[1,2-b:4,5-b']dithiophene-4,8-(5-(2-hexyldecyl)-2-thiophenecarboxylic acid) ester (8): 2,6-Dibromo-benzo[1,2-b:4,5-b']dithiophene-4,8-diol (150 mg, 0.395 mmol., 1.00 equiv.), dichloromethane (6 mL) and triethylamine (0.22 mL, 1.6 mmol, 4.0 equiv.) were added to a 25 mL 2-neck round-bottom flask fitted with a reflux condenser. A solution of 5-(2-hexyldecyl)-2-thiophenecarbonyl chloride in dichloromethane (2 mL) was then added. The flask was placed in a 45° C. heat bath and the reaction mixture was stirred at reflux for 16 hours before cooling to room temperature, diluting with dichloromethane (60 mL) and washing with water (60 mL). The organic layer was dried with $MgSO_4$ and concentrated. The crude material was purified by silica gel column chromatography (solid loading, 1:1 dichloromethane-hexanes) to give a white solid (266 mg, 40% yield over two steps). m.p. 76° C. $^1$H NMR (400 MHz, $CDCl_3$) δ 7.95 (d, J=3.7 Hz, 2H), 7.32 (s, 2H), 6.93 (d, J=3.6 Hz, 2H), 2.87 (d, J=6.6, 4H), 1.74 (b, 2H), 1.40-1.21 (m, 48H), 0.94-0.85 (m, 12H). Anal. calcd. for ($C_{52}H_{72}O_4S_4$): C, 59.53; H, 6.92. Found: C, 59.46; H, 6.80.

2,6-Bis(trimethylstannyl)-benzo[1,2-b:4,5-b'] dithiophene-4,8-(5-(2-hexyldecyl)-2 thiophenecarboxylic acid) ester (9): 2,6-Dibromo-benzo[1,2-b:4,5-b'] dithiophene-4,8-(5-(2-hexyldecyl)-2-thiophenecarboxylic acid) ester (150 mg, 0.143 mmol., 1.00 equiv.) and THF (7 mL) were added to a 50 mL schlenk tube. The solution was cooled to −78° C. and n-butyllithium (2.5 M in hexanes, 126 μL, 0.315 mmol., 2.2 equiv.) was added over 2 minutes. The mixture was stirred at −78° C. for 1 hour before adding trimethyltin chloride (68 mg, 0.343 mmol., 2.40 equiv.). The dry ice/acetone bath was removed and the reaction was stirred at ambient for 2 hours before diluting with water (30 mL) and diethyl ether (50 mL). The organic layer was washed with water (30 mL) and brine (30 mL), dried with MgSO₄ and concentrated to a yellow crude oil (101 mg), which was used in the polymerization step without further purification. ¹H NMR (400 MHz, CDCl₃) δ 7.99 (d, J=3.7 Hz, 2H), 7.34 (s, 2H), 6.93 (d, J=3.6 Hz, 2H), 2.88 (d, J=6.4, 4H), 1.75 (b, 2H), 1.40-1.20 (m, 48H), 0.93-0.85 (m, 12H), 0.48-0.32 (m, 18H).

Example 37

Preparation of Chlorinated Repeating Units

Chlorinated repeating units can be prepared according to the schemes below.

a) Repeating units comprising 3- or 4-chlorinated thienyl groups:

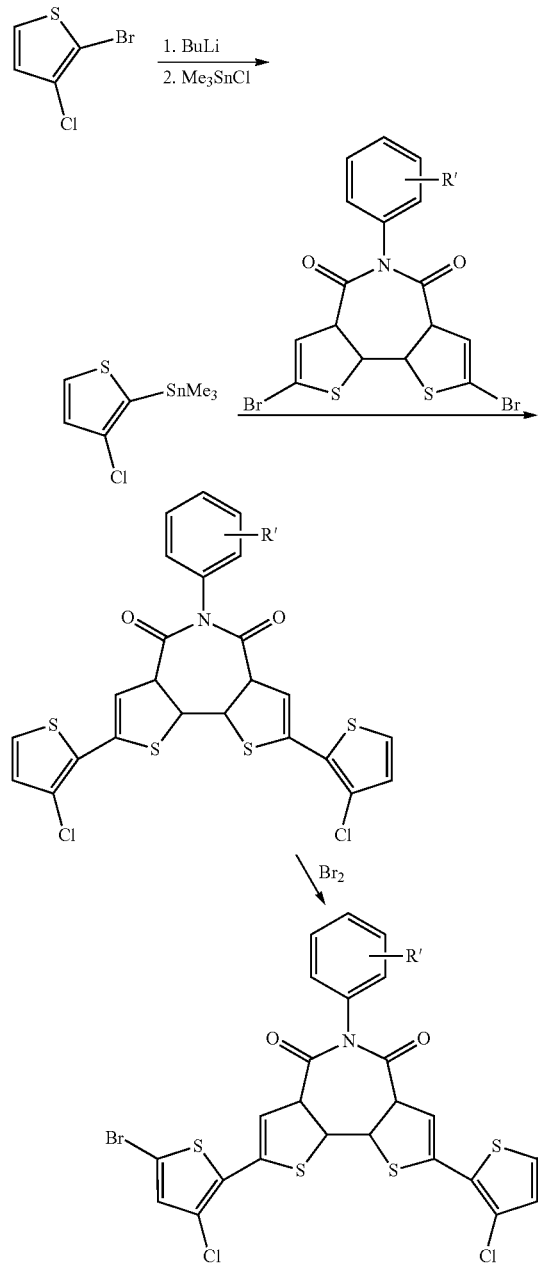

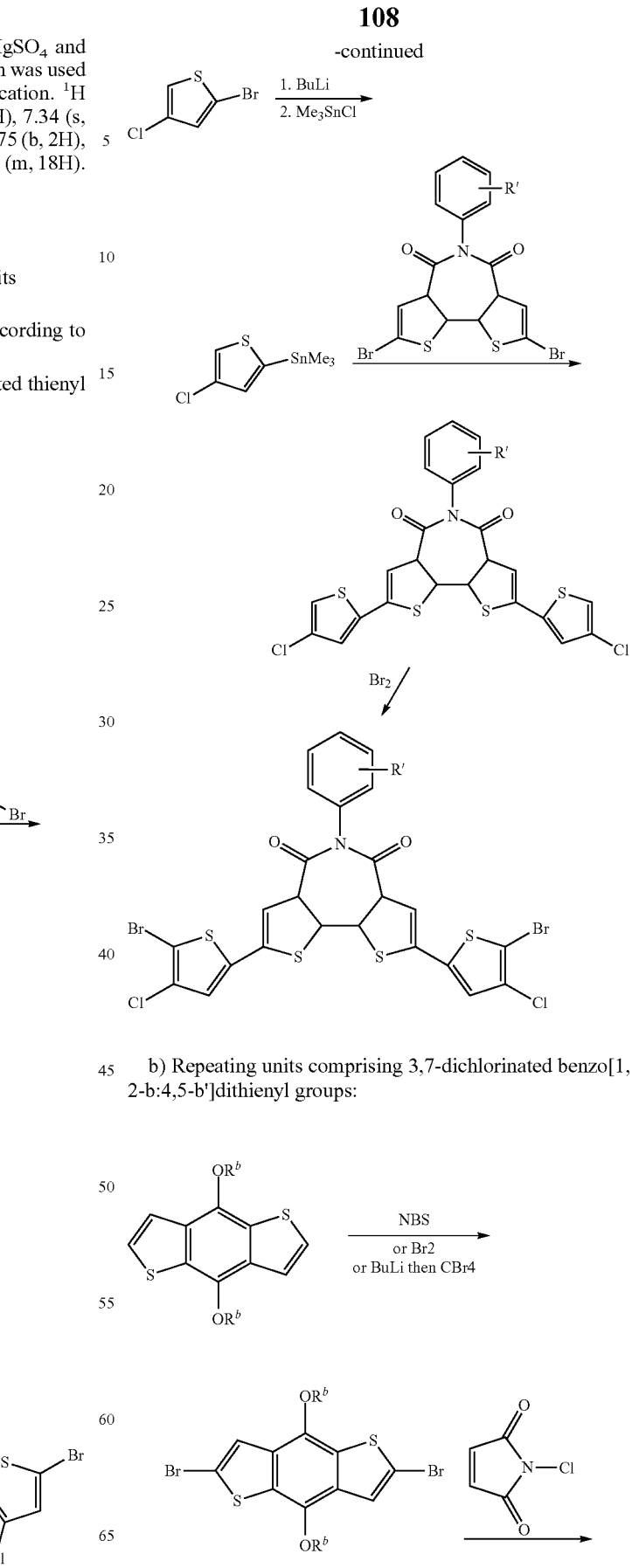

b) Repeating units comprising 3,7-dichlorinated benzo[1,2-b:4,5-b']dithienyl groups:

109
-continued
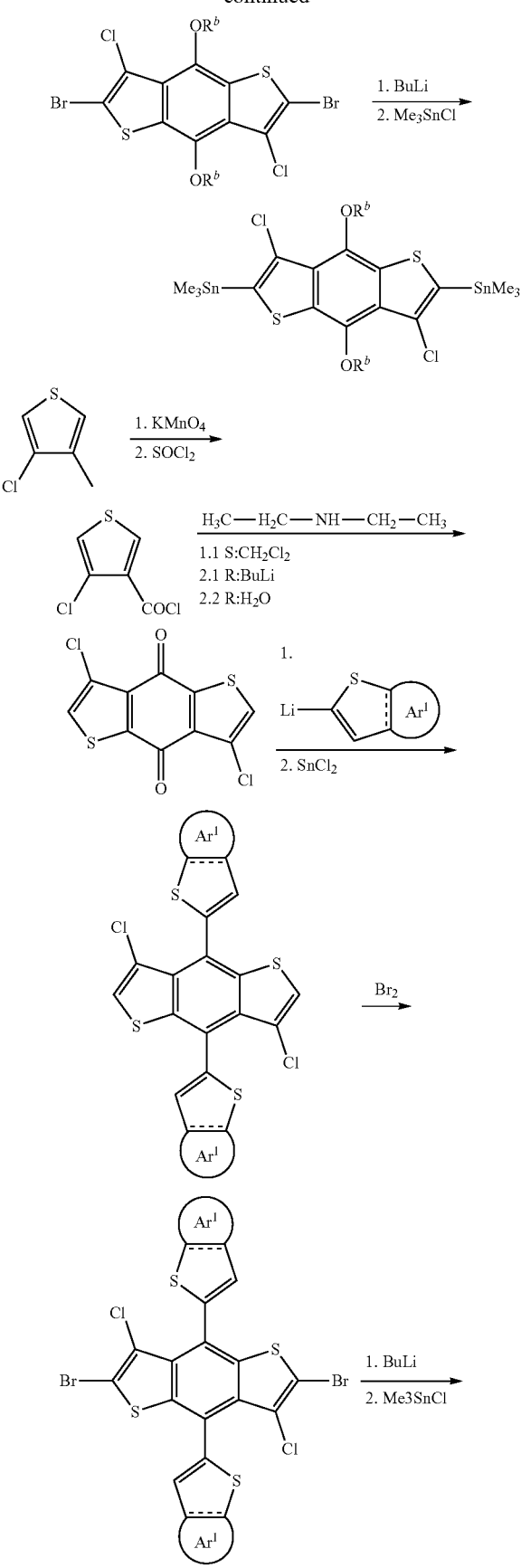
110
-continued
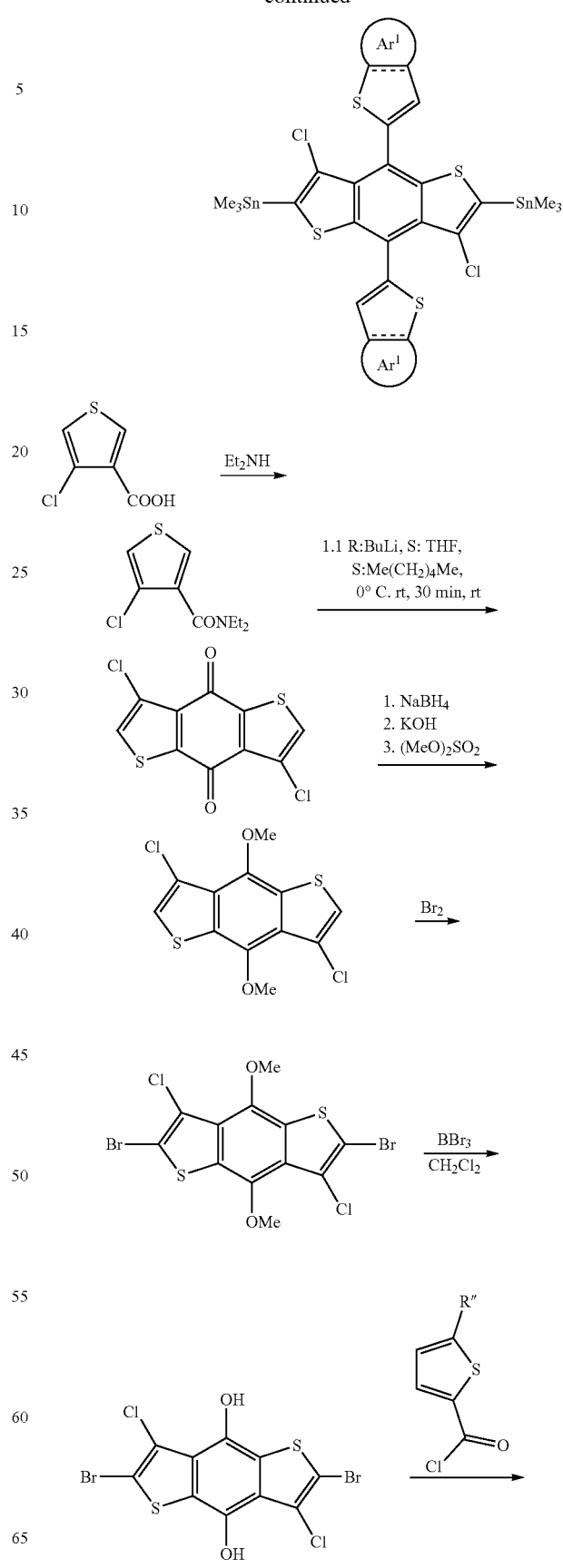

111
-continued
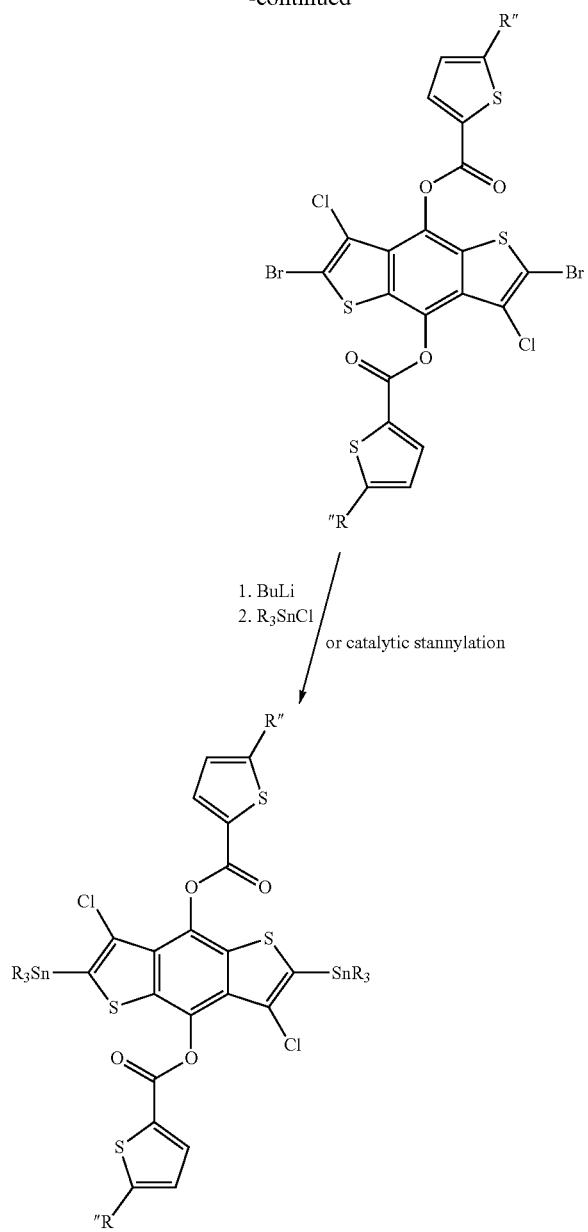
112
-continued
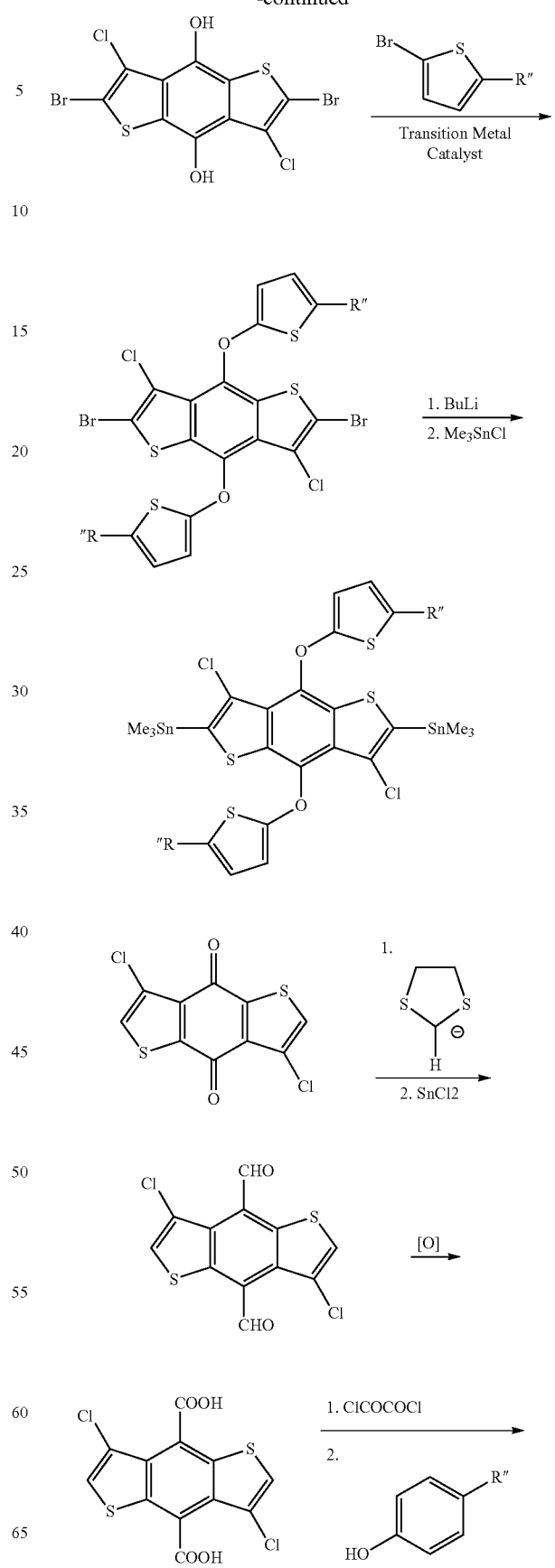

113

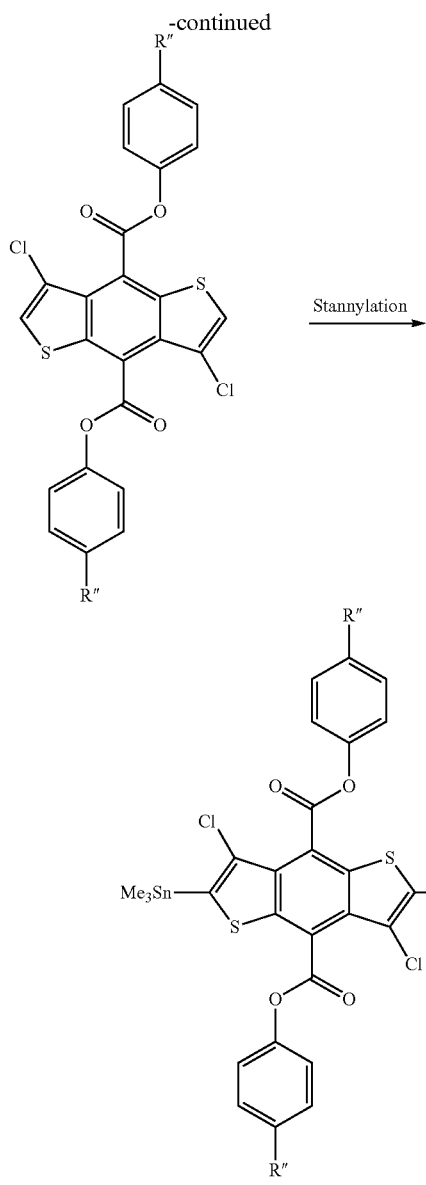

See, e.g., Maguire et al., *J. Med. Chem.*, 37: 2129-2137 (1994) for stannylation of chloro-containing thiophenes,; and Lei et al., *Chem. Sci.* DOI: 10.1039/c3sc50245g (2013) for chlorination of bromo-containing aromatics.

Example 38

Preparation of Additional 4,8-bis-substituted-2,6-bis-trimethylstannanyl-1,5-dithia-s-indacenes

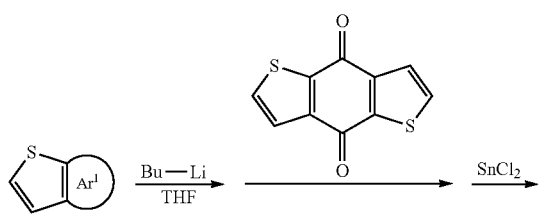

Various embodiments of repeating units ($M^{1a}$) can be prepared as follows. Briefly, an appropriate thieno-fused starting compound can be reacted with n-butyl lithium in THF at room temperature for about 1-1.5 hours before 1,5-dithia-s-indacene-4,8-dione is added. The mixture then can be heated at about 50-60° C. for 1-2 hours before cooling to room temperature. This is followed by the addition of a solution of $SnCl_2$ in $HCl/H_2O$, which is heated at about 50-60° C. for about 1-3 hours before cooling to room temperature. To functionalize the repeating unit ($M^{1a}$) with trimethylstannanyl groups, n-butyl lithium again is added (room temperature, about 2 hours), before trimethyltin chloride is added in portions (room temperature).

Example 39

Synthesis of Various Thieno-Fused Starting Compounds

Example 39A

Preparation of Naphthothiophene

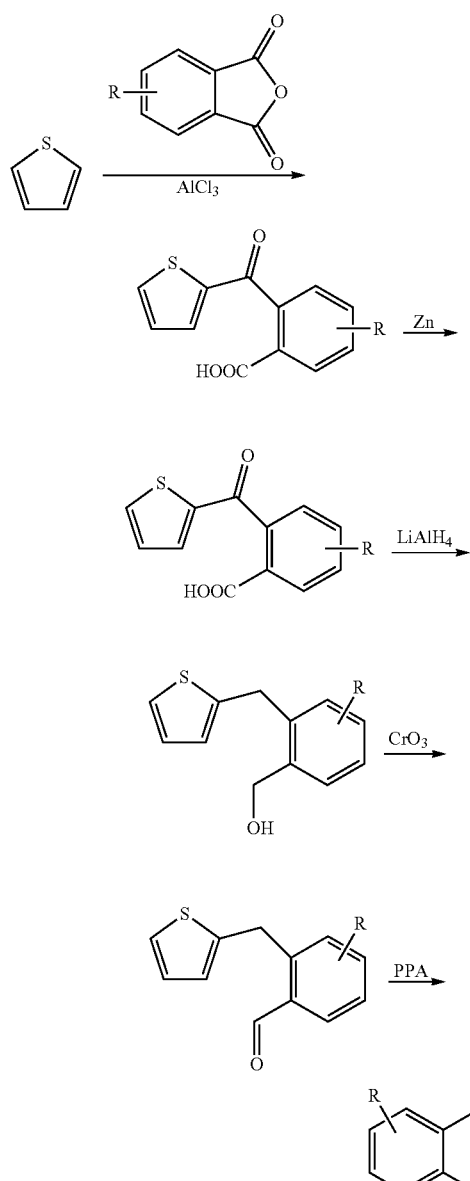

Both substituted and unsubstituted naphthothiophenes can be prepared from an appropriate phthalic anhydride using the synthetic route described in JP2010053094 (reproduced above), the entire disclosure of which is incorporated by reference herein.

Example 39B

Preparation of Benzodithiophene

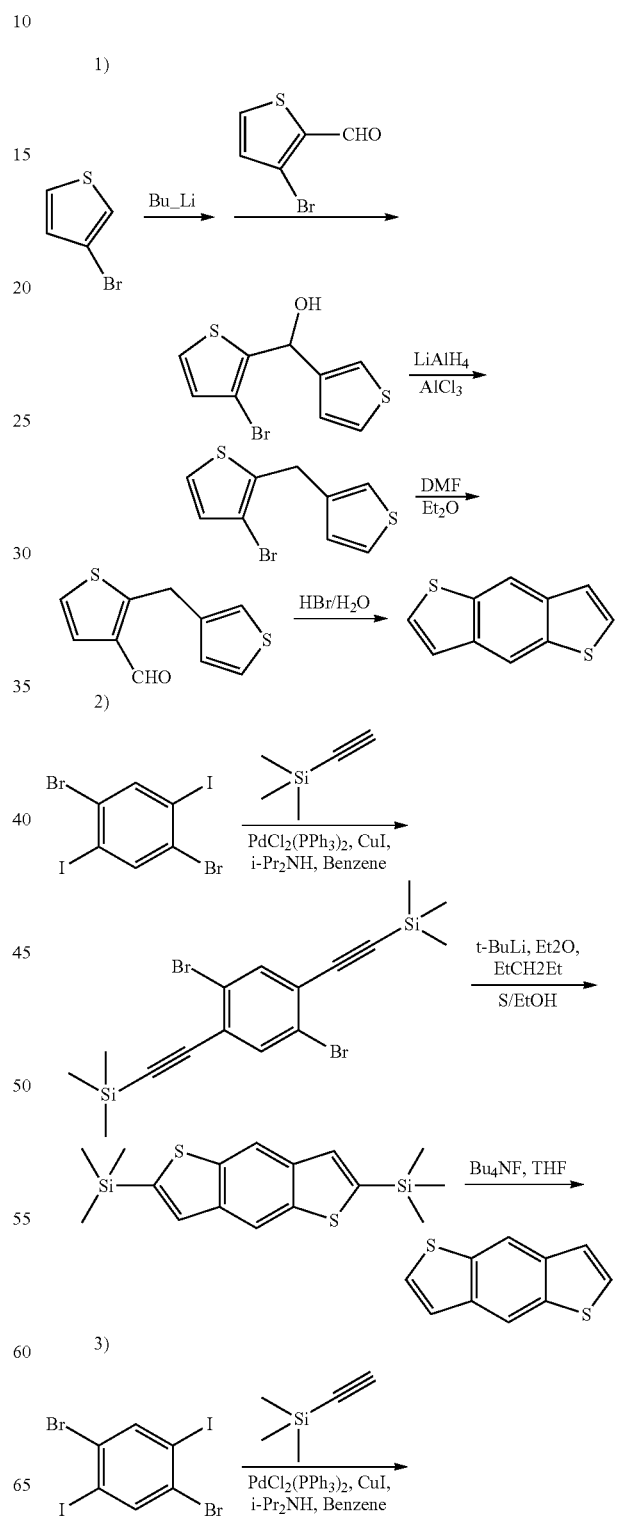

-continued

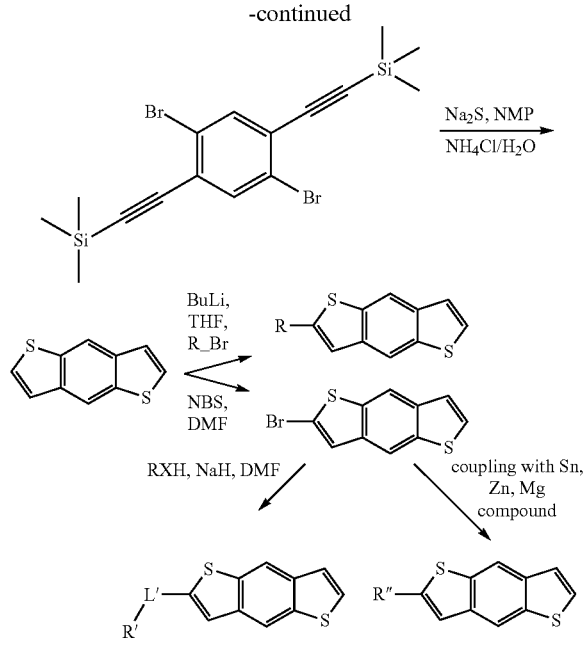

Substituted and unsubstituted benzodithiophenes can be prepared via the synthetic routes provided above.

Example 39C

Preparation of Benzothienothiophene

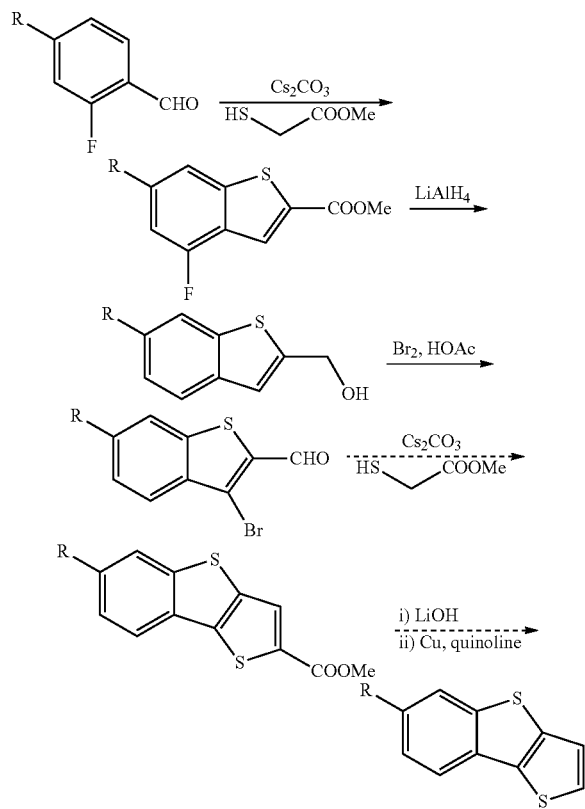

Various benzothienothiophenes can be prepared using the synthetic route described above.

Example 39D

Preparation of Dithienothiophene

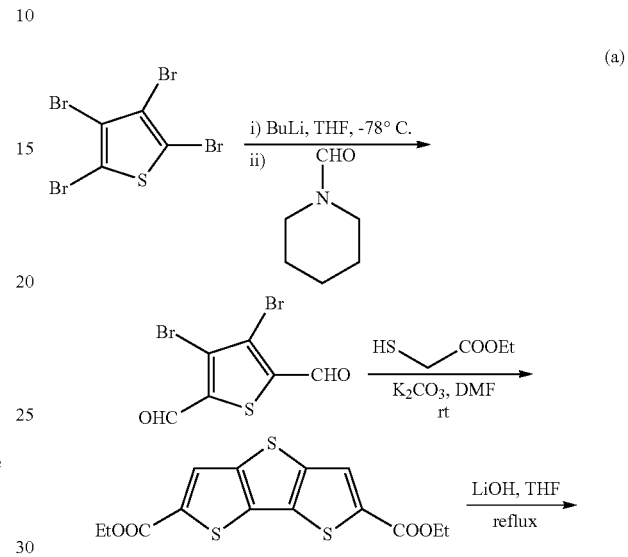

(a)

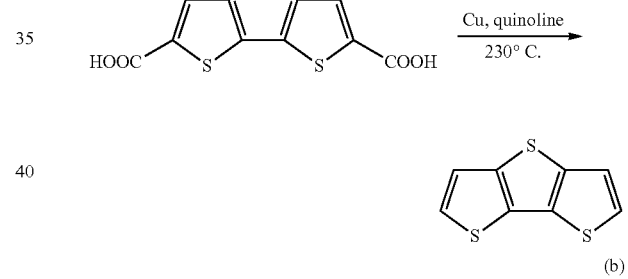

(b)

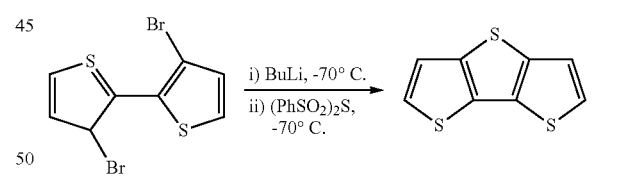

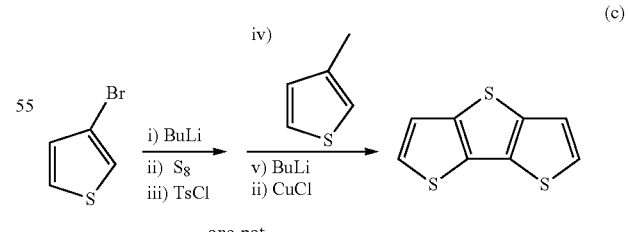

(c)

Unsubstituted dithienothiophenes can be prepared via synthetic route (a), (b) or (c) as described, respectively, in *Chem. Commun.* 2002, 2424; *J. Mater. Chem.* 2003, 13, 1324; and *Chem. Commun.* 2009, 1846, the entire disclosure of each of which is incorporated by reference herein.

(d)

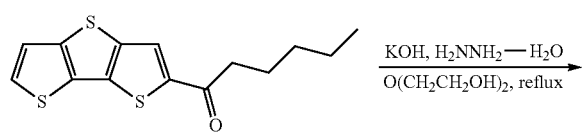

Substituted dithienothiophenes can be prepared via synthetic route (d), (e) or (f) as described, respectively, in *J. Mater. Chem.* 2007, 17, 4972; *Chem. Mater.* 2007, 19, 4925; and *Syn. Met.* 1999, 987, the entire disclosure of each of which is incorporated by reference herein.

Example 39E

Preparation of Thienothiophene

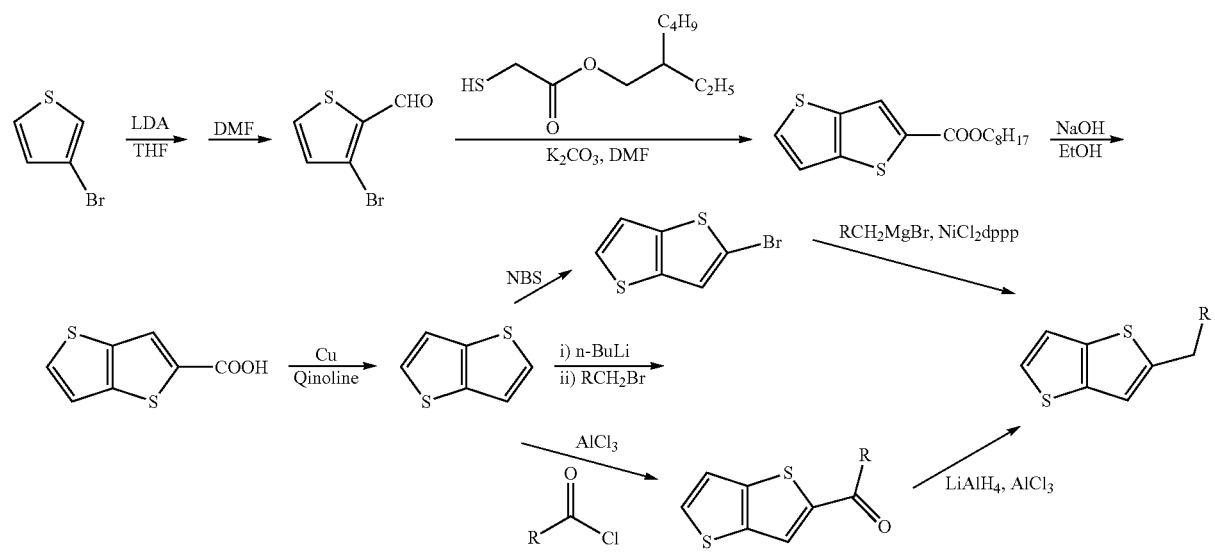

Substituted thienothiophenes can be prepared using the synthetic route described above.

Example 39F

Preparation of Benzothiophene

Substituted benzothiophenes can be prepared using the synthetic routes described below.

(e)

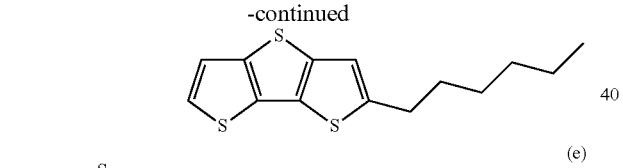

(f)

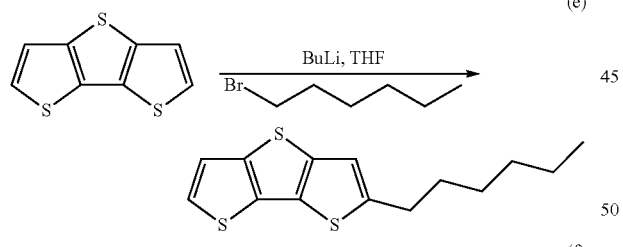

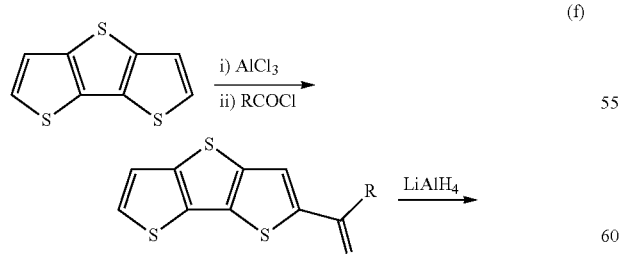

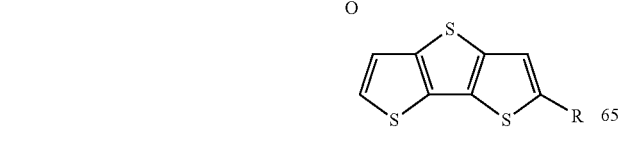

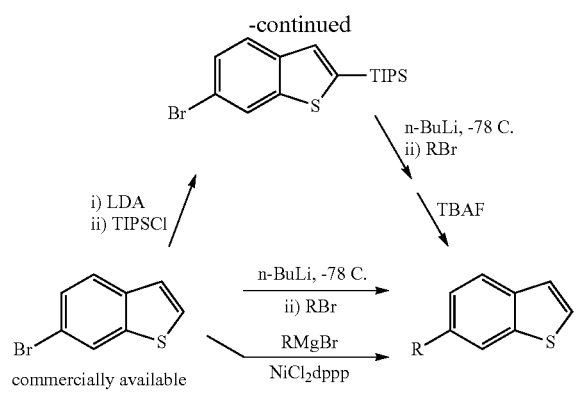

Device Fabrication

Example 40

Fabrication and Characterization of OPV cells

Inverted OPVs were fabricated on ITO-covered glass that was cleaned by sonication in soap water, water, acetone and isopropanol followed by storage in a glass oven. Immediately before deposition of the electron-injection layer, the substrates were UV ozone treated for 20 minutes in a Jelight UVO Cleaner® 42. ZnO films were prepared according to a previously published method. See Lloyd et al., "Influence of the hole-transport layer on the initial behavior and lifetime of inverted organic photovoltaics," *Solar Energy Materials and Solar Cells*, 95,5, 1382-1388 (2011). Donor:Acceptor (1:1 by weight) blend active layers were spin cast from chloroform solutions. Some of the active layers were annealed at temperatures ranging from about 80° C. to about 180° C. for about 3-10 minutes before deposition of the top electrode. To complete the device fabrication, 8 nm of vanadium oxide ($V_2O_5$) and 100 nm of aluminum were successively deposited thermally under vacuum of ~$10^{-6}$ Torr. The active area of the device was ~0.09 cm². The devices were then encapsulated with a cover glass using EPO-TEK OG112-6 UV curable epoxy (Epoxy Technology) in the glove box.

The photovoltaic characteristics of the encapsulated devices were tested in air. The current density-voltage (J-V) curves were obtained using a Keithley 2400 source-measure unit. The photocurrent was measured under simulated AM1.5G irradiation (100 mW cm$^{-2}$) using a xenon-lamp-based solar simulator (Newport 91160A 300W Class-A Solar Simulator, 2 inch by 2 inch uniform beam) with air mass 1.5 global filter. The light intensity was set using an NREL calibrated silicon photodiode with a color filter.

TABLE 1

JV characteristics of representative donor:acceptor blend systems in inverted devices. All active layers were processed from chloroform.

| Electron-Acceptor Polymer | Electron-Donor Polymer | PCE (%) |
| --- | --- | --- |
| Ex. 3 | Ex. 14 | 1.8 |
| Ex. 3 | Ex. 22 | 1.6 |
| Ex. 3 | Ex. 25 | 5.2 |
| Ex. 9 | Ex. 14 | 1.0 |
| Ex. 9 | Ex. 22 | 0.7 |
| Ex. 9 | Ex. 25 | 3.2 |
| Ex. 3 | Ex. 32 | 5.3 |
| Ex. 9 | Ex. 32 | 3.8 |
| Ex. 3 | Ex. 33 | 2.7 |
| Ex. 8 | Ex. 33 | 3.1 |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An optoelectronic device comprising a first electrode, a second electrode, and a photoactive layer disposed between the first and second electrodes, the photoactive layer comprising a polymer-polymer blend semiconductor material, the polymer-polymer blend semiconductor material comprising an electron-donor polymer and an electron-acceptor polymer, wherein:

the electron-acceptor polymer is represented by Formula 1 or 2:

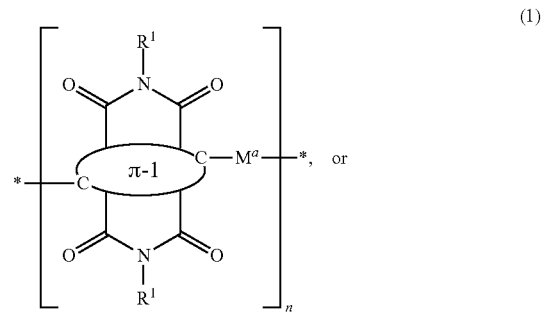

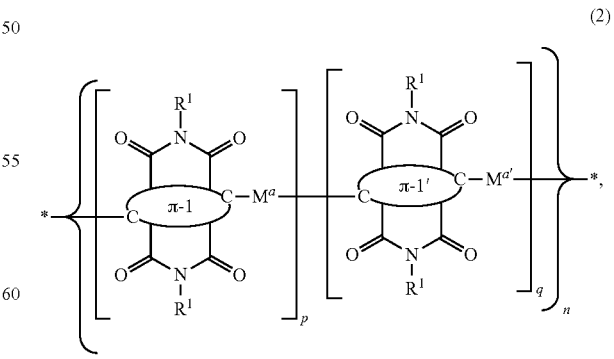

wherein:

π-1 and π-1' are identical or different and independently are selected from the group consisting of:

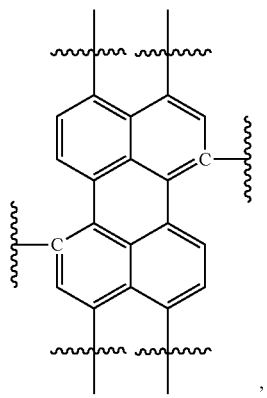

,

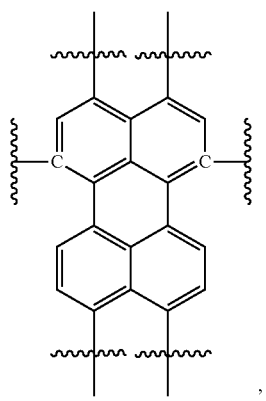

, and

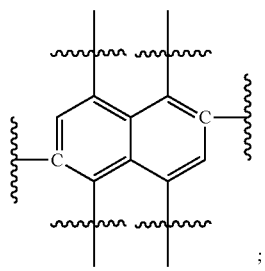

;

R¹ and R¹' are identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

$M^a$ and $M^{a'}$ are identical or different and independently are a repeat unit comprising one or more conjugated moieties that does not include a rylene diimide;

p and q independently are a real number, wherein $0.1 \le p \le 0.9$, $0.1 \le q \le 0.9$, and the sum of p and q is about 1; and n is an integer in the range of 2 to 5,000;

provided that at least one of the following is true: (a) π-1' is different from π-1, (b) $R^{1'}$ is different from $R^1$, or (c) $M^{a'}$ is different from $M^a$; and the electron-donor polymer is an alternating copolymer selected from the group consisting of:

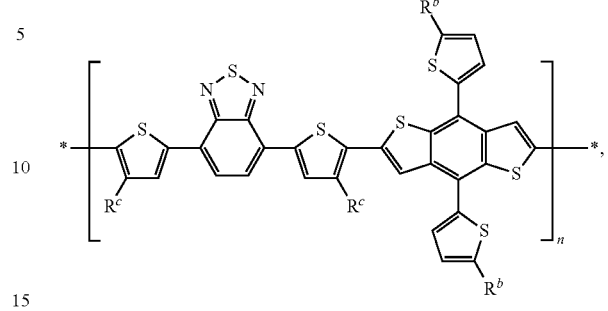

(20)

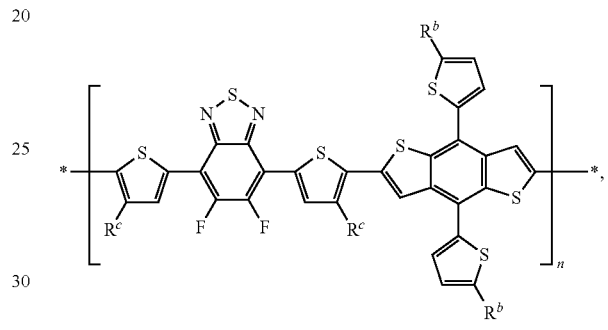

(21)

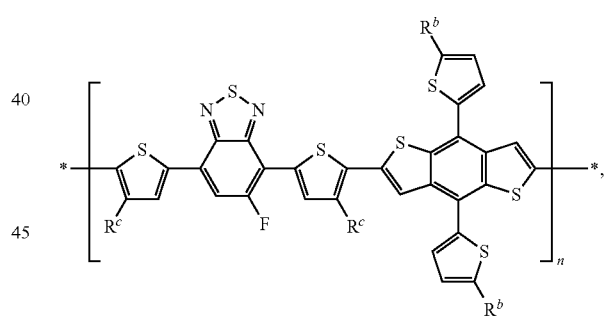

(22)

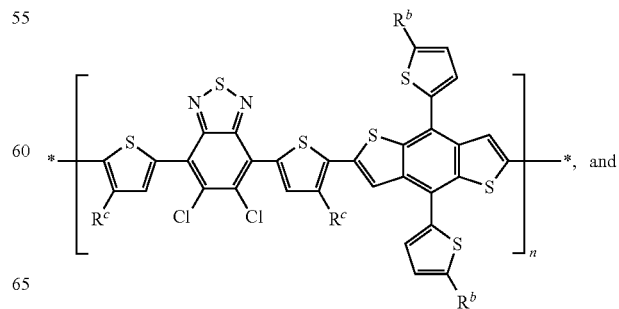

(23)

-continued (24)

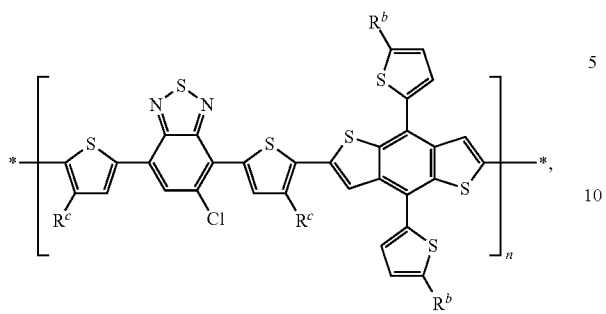

wherein $R^b$, at each occurrence, is a linear or branched $C_{3-40}$ alkyl group; $R^c$, at each occurrence, is H or a $C_{6-20}$ alkyl group; and n is an integer in the range of 5 to 5,000.

2. The device of claim 1, wherein the electron-acceptor polymer is represented by Formula 3 or 4:

(3)

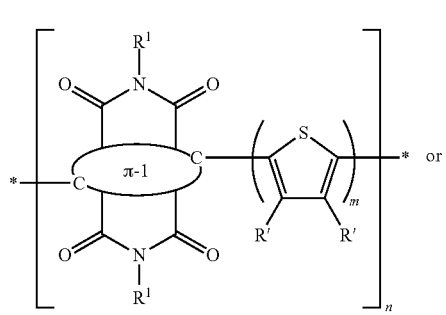

or (4)

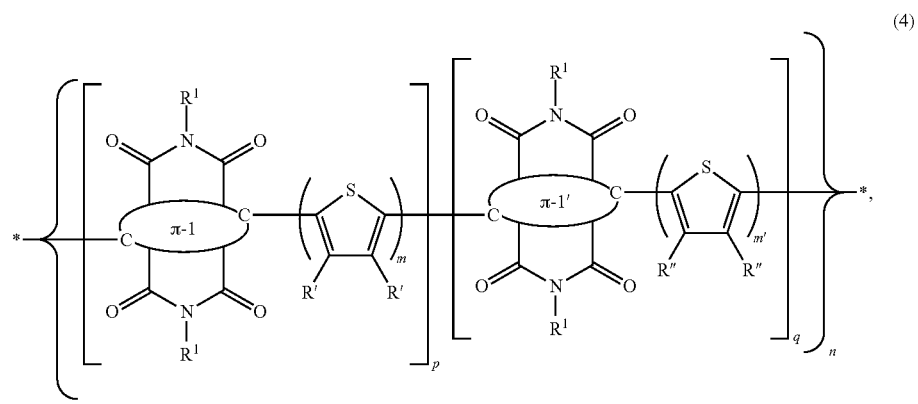

wherein:

R' and R" are identical or different and independently are selected from the group consisting of H, F, Cl, —CN, and —L—R, wherein L, at each occurrence, independently is selected from the group consisting of —O—, —S—, —C(O), —C(O)O—, and a covalent bond;

and R, at each occurrence, independently is selected from the group consisting of a $C_{6-20}$ alkyl group, a $C_{6-20}$ alkenyl group, and a $C_{6-20}$ haloalkyl group;

m and m' independently are 1, 2, 3, 4, 5 or 6.

3. The device of claim 1, wherein the electron-acceptor polymer is represented by Formula 5, 6, or 7:

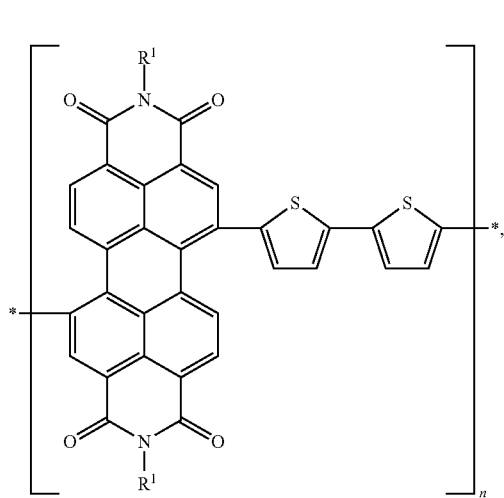 (5)
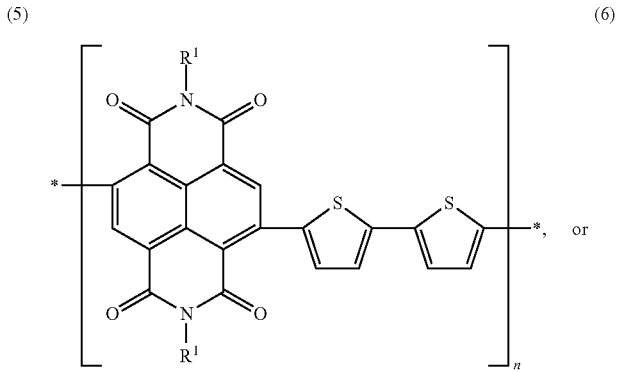 (6), or
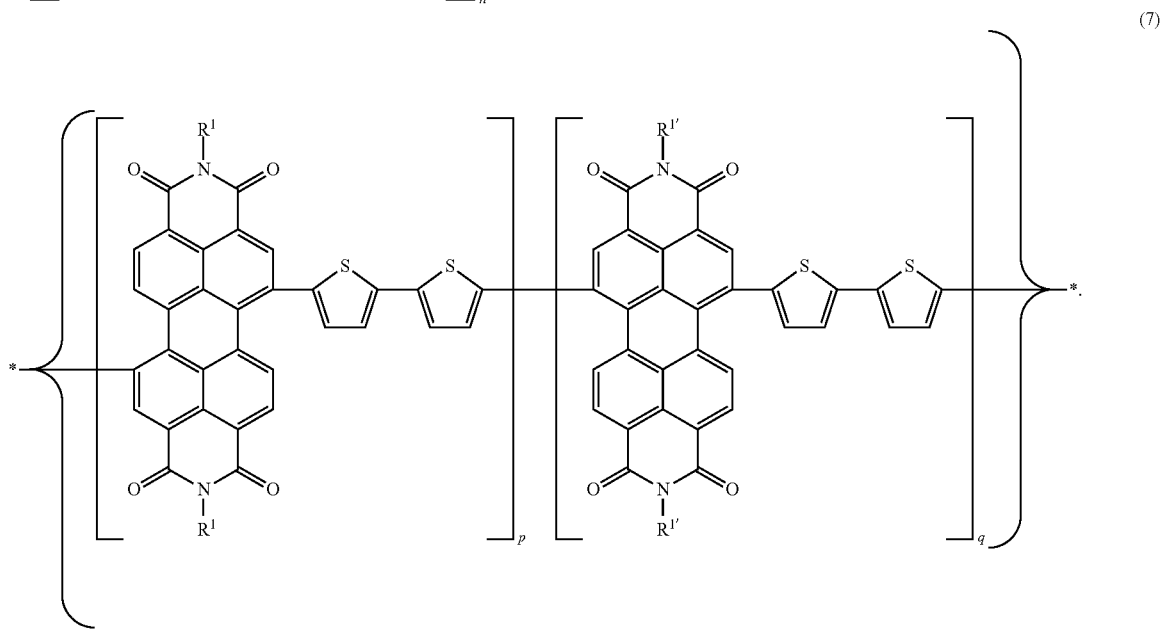 (7)
4. The device of claim 1, wherein $R^1$ and $R^{1'}$ are selected from the group consisting of a branched $C_{3-20}$ alkyl group, a branched $C_{4-20}$ alkenyl group, and a branched $C_{3-20}$ haloalkyl group.
5. The device of claim 4, wherein $R^1$ and $R^{1'}$ are selected from the group consisting of:
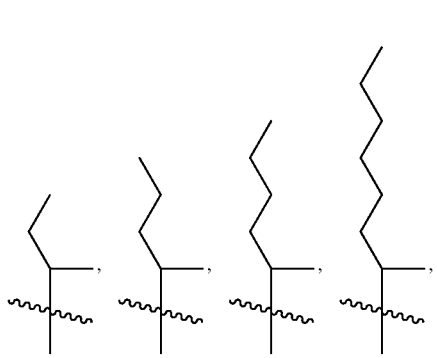
-continued
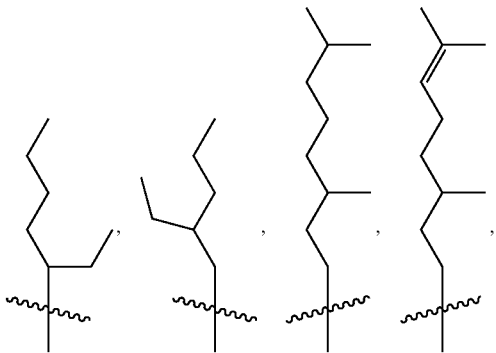

-continued

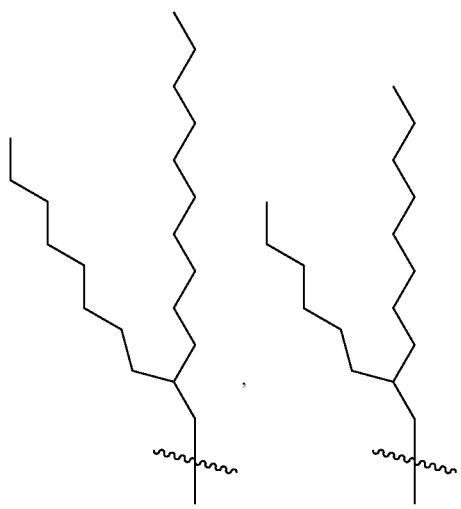, and

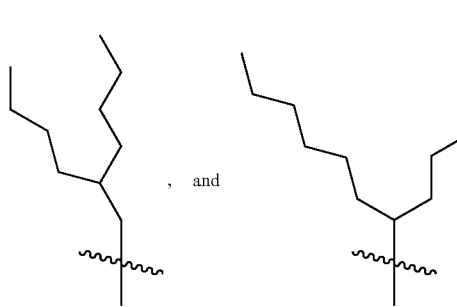

6. The device of claim 1, wherein the acceptor subunit (A) is represented by the formula:

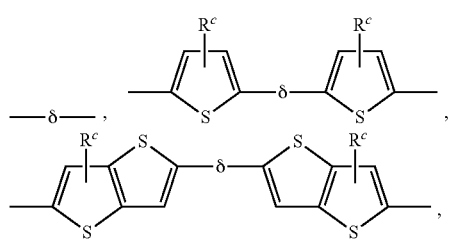

wherein δ represents the electron-poor conjugated moiety, and $R^c$, at each occurrence, is H or R, wherein R, at each occurrence, independently is selected from the group consisting of a $C_{6-20}$ alkyl group, a $C_{6-20}$ alkenyl group, and a $C_{6-20}$ haloalkyl group.

7. The device of claim 6, wherein the electron-poor conjugated moiety (δ) is an 8-14 membered polycyclic heteroaryl moiety comprising either at least one ring that has two or more heteroatoms selected from N and S, and/or at least one ring that is substituted with one or more electron-withdrawing groups selected from the group consisting of F, Cl, an oxo group, a carbonyl group, a carboxylic ester group, and a sulfonyl group.

8. The device of claim 6, wherein the electron-poor conjugated moiety (δ) is selected from the group consisting of:

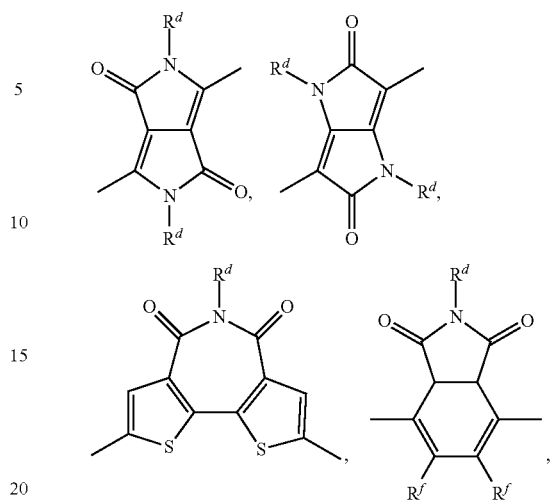

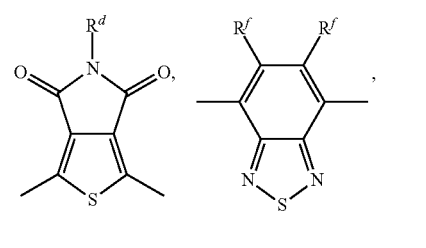

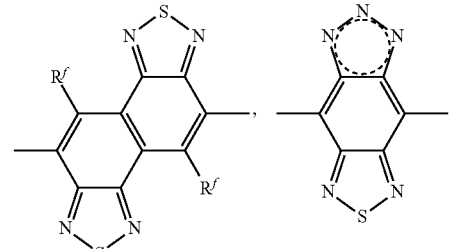

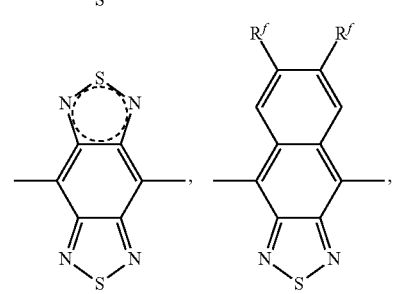

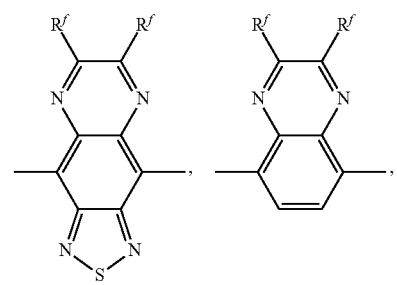

-continued

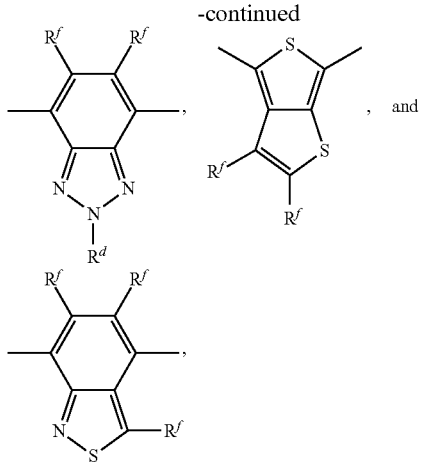

wherein $R^d$, at each occurrence, independently is selected from a $C_{3-40}$ alkyl group, a $C_{3-40}$ alkenyl group, and a $C_{3-40}$ haloalkyl group; and $R^f$, at each occurrence, independently is selected from the group consisting of H, F, Cl, —CN, —S(O)$_2$—C$_{1-20}$ alkyl, —C(O)—OC$_{1-20}$ alkyl, —C(O)—C$_{1-20}$ alkyl, a C$_{1-20}$ alkyl group, a C$_{2-20}$ alkenyl group, a C$_{1-20}$ alkoxy group, a C$_{1-20}$ alkylthio group, and a C$_{1-20}$ haloalkyl group.

9. The device of claim 8, wherein $R^d$, at each occurrence, independently is a linear or branched C$_{6-20}$ alkyl group; and $R^f$, at each occurrence, independently is selected from H, F, Cl, C(O)R$^e$, C(O)OR$^e$, and S(O)$_2$R$^e$; where R$^e$, at each occurrence, independently is a linear or branched C$_{6-20}$ alkyl group.

10. The device of claim 1, wherein the electron donor polymer is a random copolymer selected from the group consisting of:

(34)

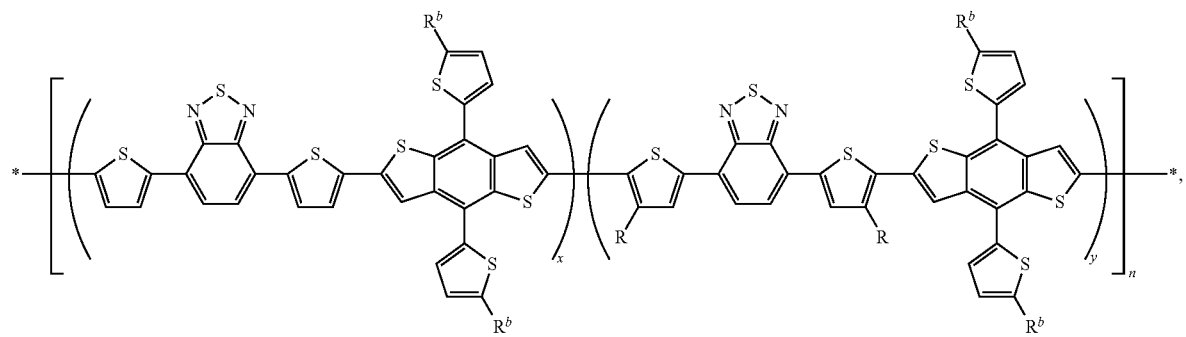

(35)

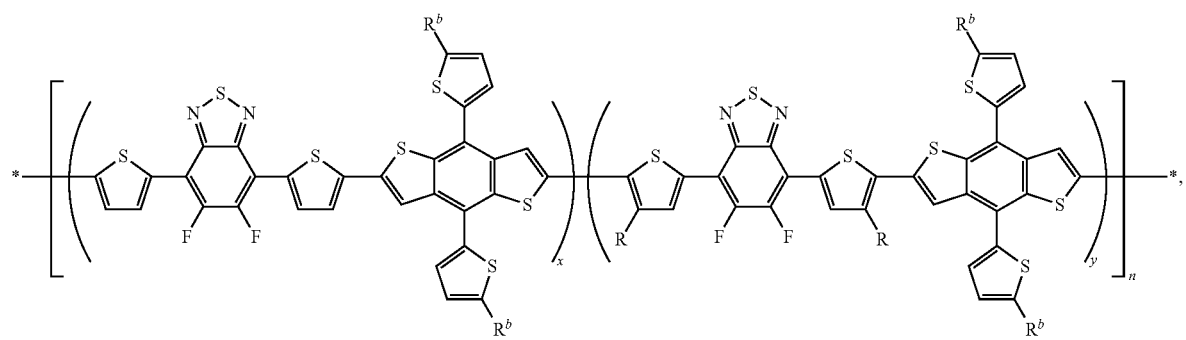

(36)

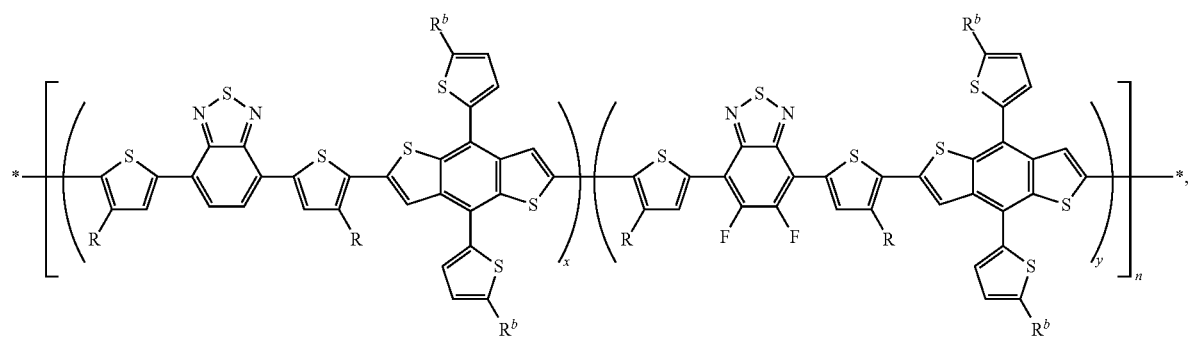

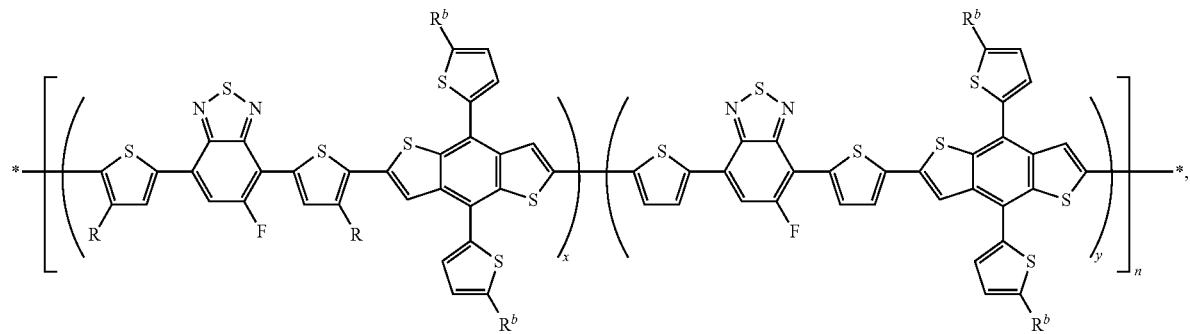
(37)
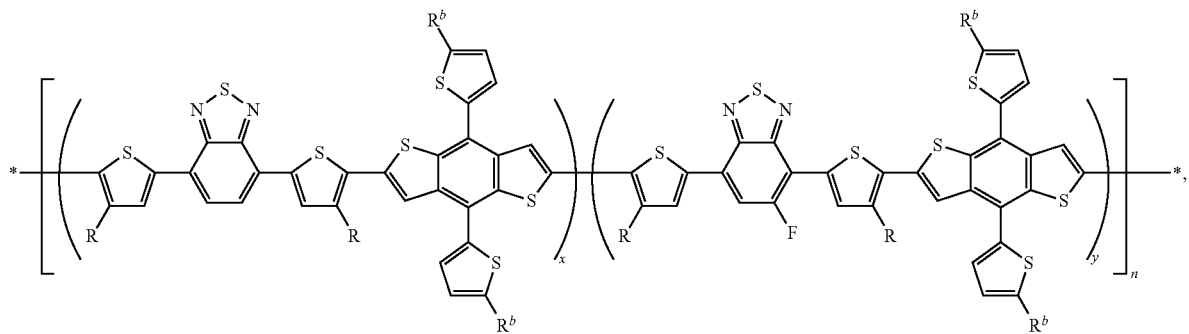
(38)
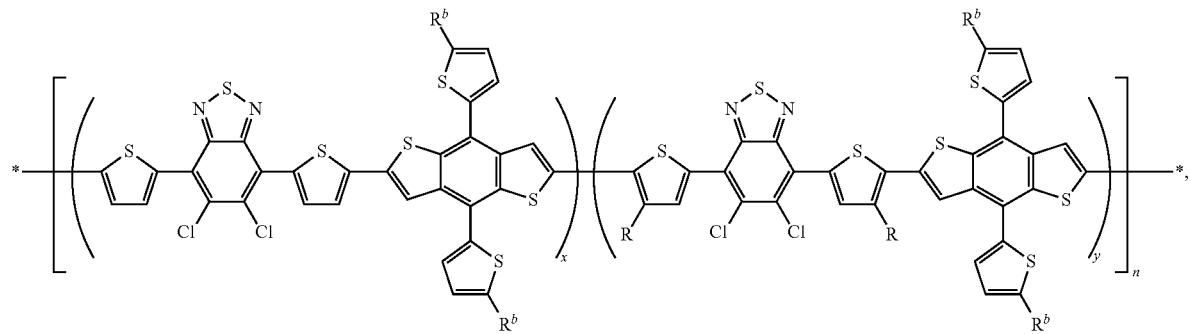
(39)
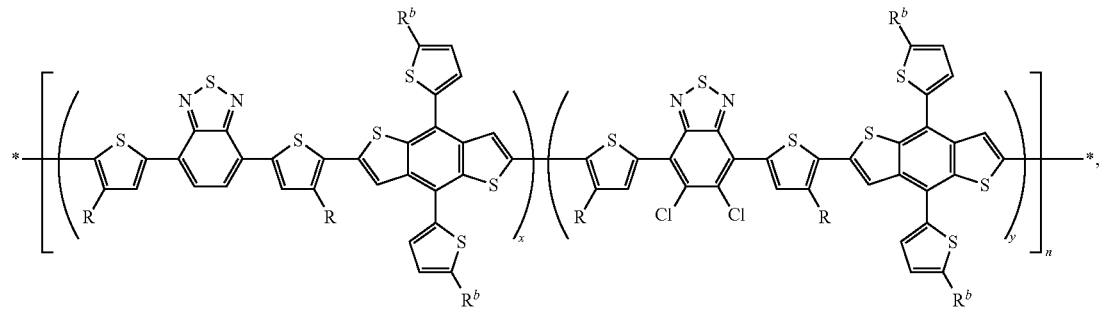
(40)

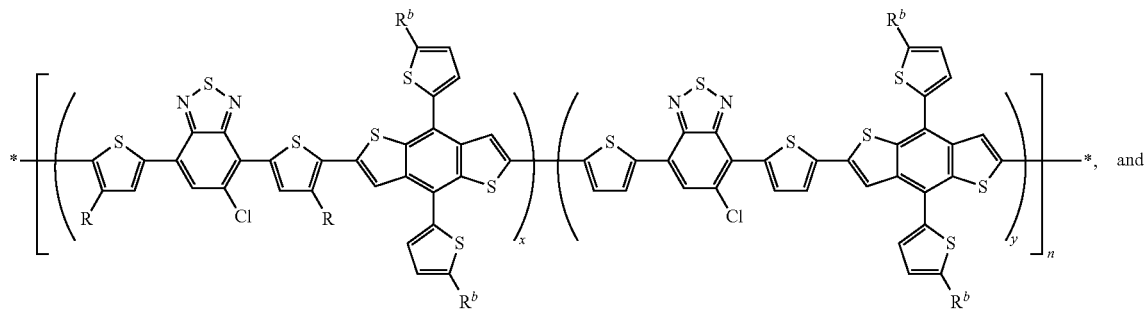

(41)

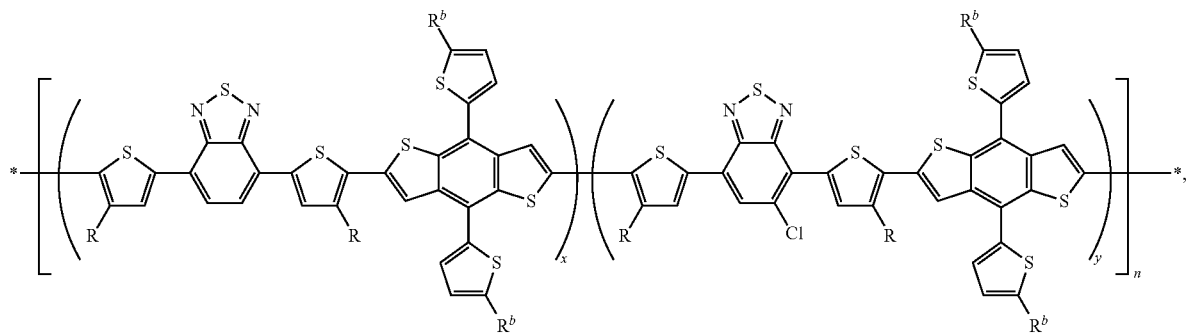

(42)

wherein $R^b$, at each occurrence, is a linear or branched $C_{3-40}$ alkyl group; R, at each occurrence, is a $C_{6-20}$ alkyl group; x and y independently are a real number, wherein $0.1 \leq x \leq 0.9$, $0.1 \leq y \leq 0.9$ ($0.2 \leq x \leq 0.8$, $0.2 \leq y \leq 0.8$), and the sum of x and y is about 1;
and n is an integer in the range of 5 to 5,000.

11. The device of claim 1, wherein the electron donor polymer is an alternating copolymer selected from the group consisting of:

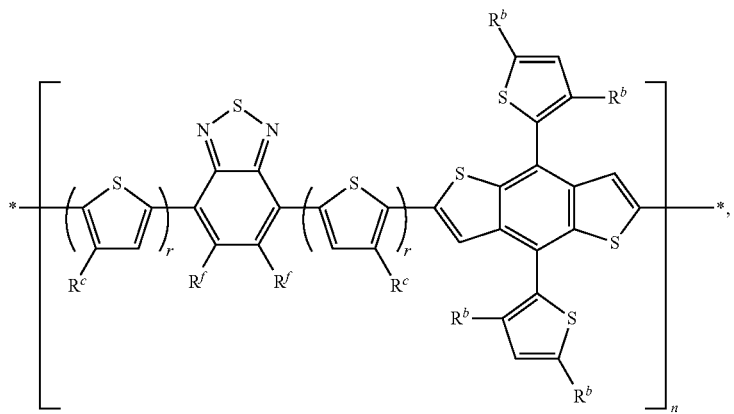

(43)

-continued
(44)
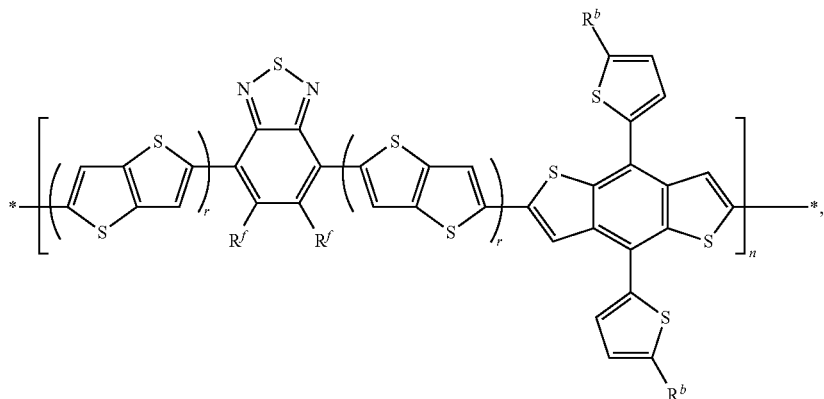
(45)
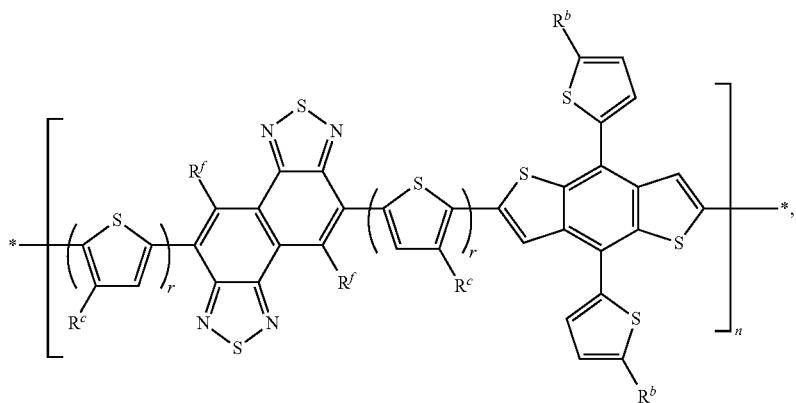
(46)
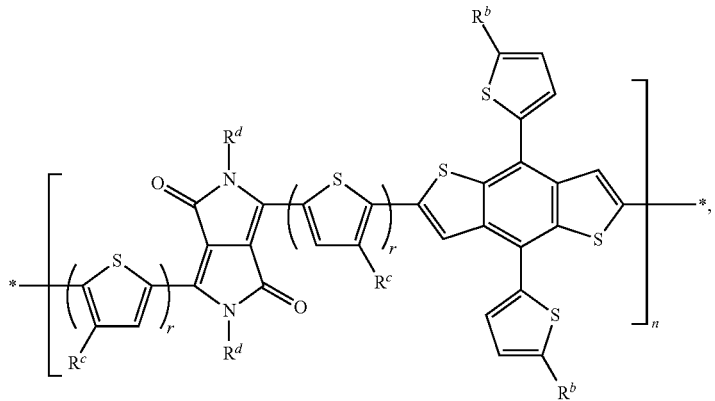
(47)
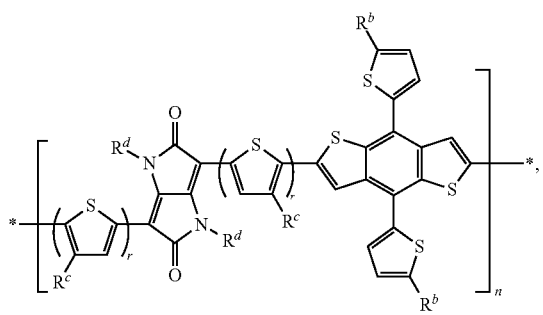
(48)
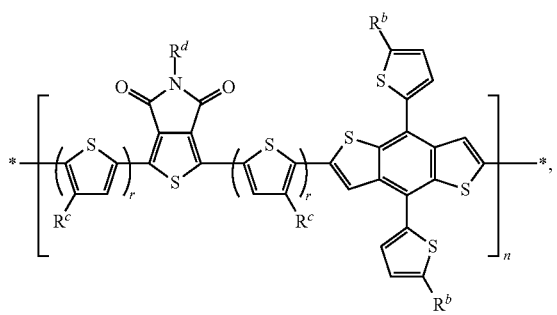

-continued

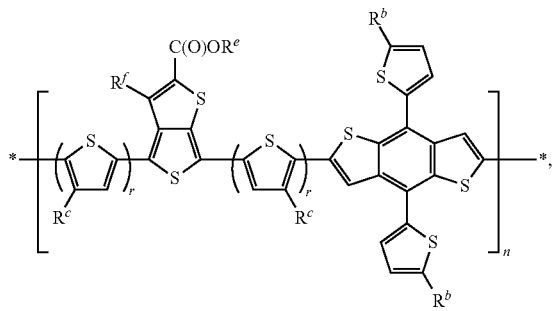
(49)

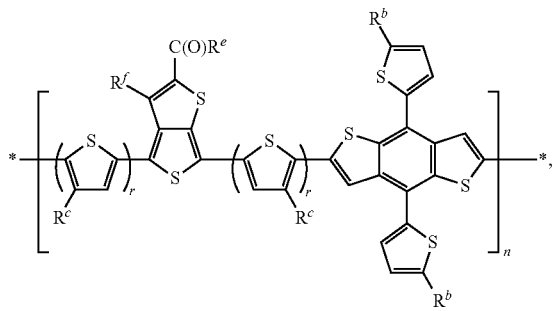
(50)

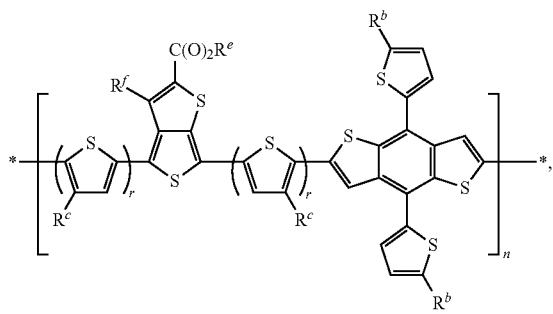
(51)

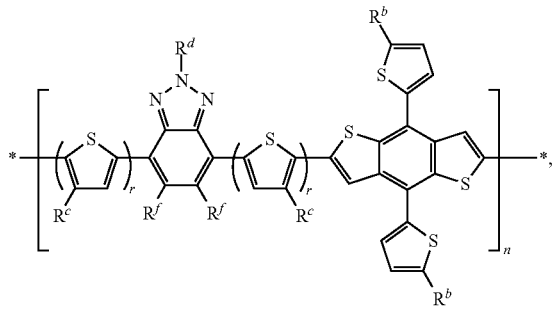
(52)

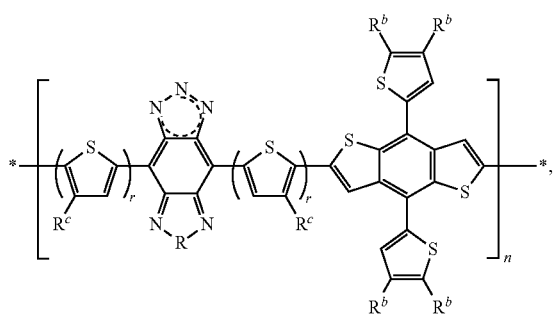
(53)

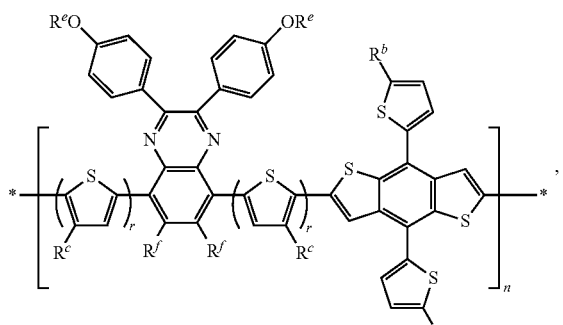
(54)

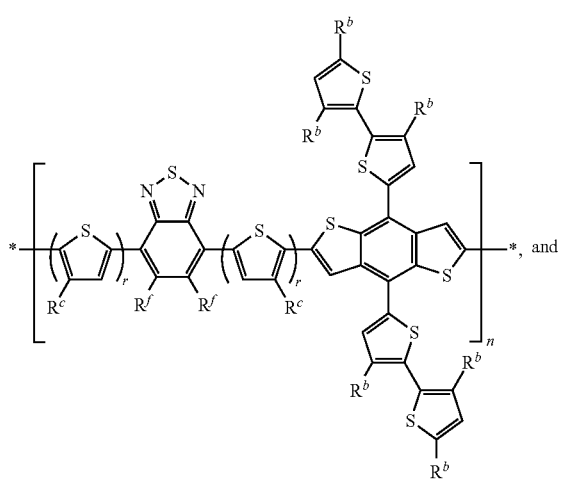
(55), and

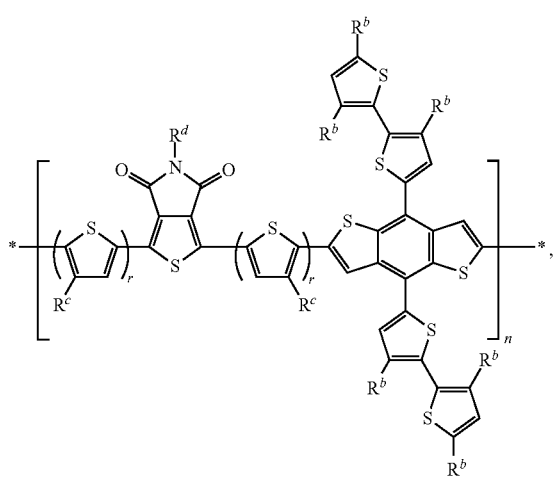
(56), wherein $R^b$, $R^d$, $R^e$, at each occurrence, independently is a linear or branched $C_{3-40}$ alkyl group; $R^c$, at each occurrence, is H or a $C_{6-20}$ alkyl group; $R^f$, at each occurrence, independently is selected from H, F, Cl, C(O)$R^e$, C(O)O$R^e$, and S(O)$_2R^e$; where $R^e$, at each occurrence, independently is a linear or branched $C_{6-20}$ alkyl group; r is 0 or 1; and n is an integer in the range of 5 to 5,000.

12. The device of claim 1 configured as an organic photovoltaic device comprising an anode, a cathode, optionally one or more anode interlayers, optionally one or more cathode interlayers, and in between the anode and the cathode the photoactive layer.

13. The device of claim 1, wherein the donor subunit (D) comprises a benzodithiophene moiety selected from the group consisting of:

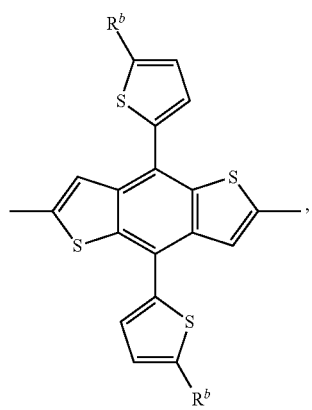

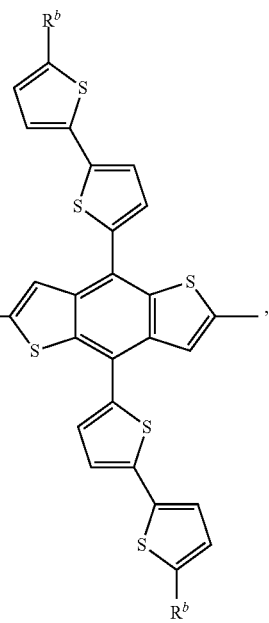

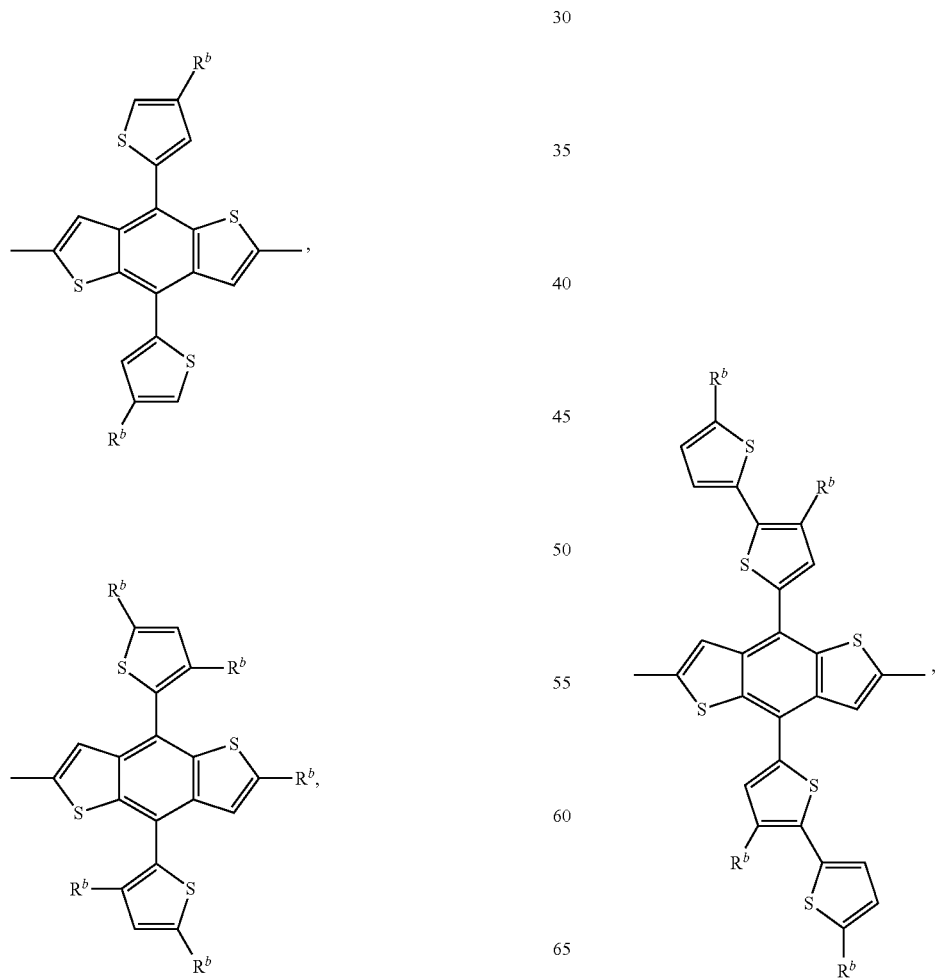

-continued
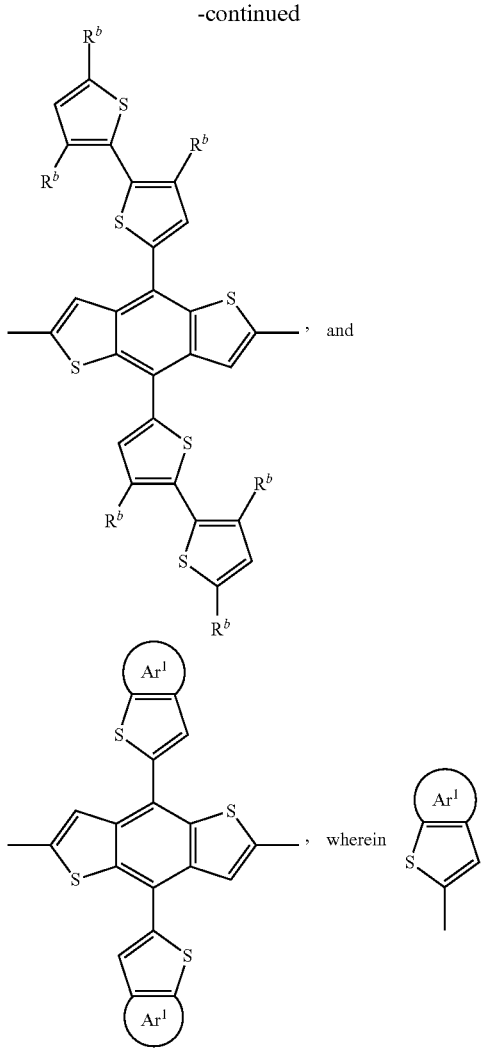
, and
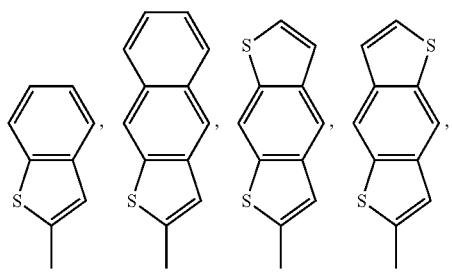
, wherein Ar[1]
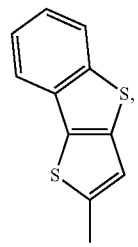
is selected from the group consisting of:
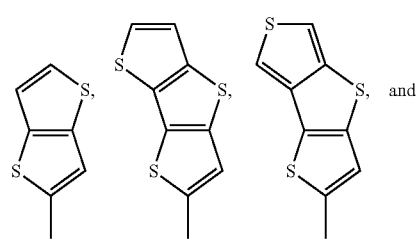
-continued
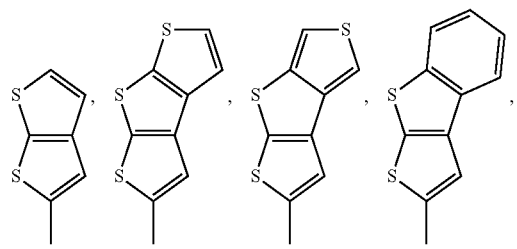
each of which optionally is substituted with 1-2 R[b] groups, and R[b], at each occurrence, independently is a $C_{3-40}$ alkyl group or branched alkyl group.
* * * * *